United States Patent
Huang et al.

(10) Patent No.: US 11,239,428 B2
(45) Date of Patent: Feb. 1, 2022

(54) BORON-CONTAINING ORGANIC COMPOUND AND APPLICATIONS THEREOF, ORGANIC MIXTURE, AND ORGANIC ELECTRONIC DEVICE

(71) Applicant: GUANGZHOU CHINARAY OPTOELECTRONIC MATERIALS LTD., Guangdong (CN)

(72) Inventors: Hong Huang, Guangdong (CN); Junyou Pan, Guangdong (CN)

(73) Assignee: Guangzhou Chinaray Optoelectronic Materials Ltd., Guangdong (CN)

( * ) Notice: Subject to any disclaimer, the term of this patent is extended or adjusted under 35 U.S.C. 154(b) by 484 days.

(21) Appl. No.: 16/463,130

(22) PCT Filed: Nov. 23, 2017

(86) PCT No.: PCT/CN2017/112724
§ 371 (c)(1),
(2) Date: May 22, 2019

(87) PCT Pub. No.: WO2018/095397
PCT Pub. Date: May 31, 2018

(65) Prior Publication Data
US 2020/0066997 A1 Feb. 27, 2020

(30) Foreign Application Priority Data
Nov. 23, 2016 (CN) .......................... 201611047549.1

(51) Int. Cl.
*H01L 51/00* (2006.01)
*C07F 5/02* (2006.01)
*C09K 11/06* (2006.01)
*H01L 51/50* (2006.01)

(52) U.S. Cl.
CPC ............ *H01L 51/0072* (2013.01); *C07F 5/02* (2013.01); *C09K 11/06* (2013.01); *C09K 2211/1018* (2013.01); *H01L 51/5016* (2013.01); *H01L 2251/552* (2013.01)

(58) Field of Classification Search
CPC ............... H01L 51/008; H01L 51/0072; H01L 51/0059; H01L 51/5012; H01L 51/5016; H01L 2251/552; C07F 5/02; C07F 5/027; C09K 11/06; C09K 2211/1018
See application file for complete search history.

(56) References Cited

U.S. PATENT DOCUMENTS

| | | | |
|---|---|---|---|
| 6,824,895 B1 | 11/2004 | Sowinski et al. |
| 6,830,828 B2 | 12/2004 | Thompson et al. |
| 6,835,469 B2 | 12/2004 | Kwong et al. |
| 7,029,766 B2 | 4/2006 | Huo et al. |
| 2001/0053462 A1 | 12/2001 | Mishima |
| 2004/0167364 A1 * | 8/2004 | Itahashi ................. C07C 41/30 568/717 |
| 2005/0258742 A1 | 11/2005 | Tsai et al. |
| 2007/0087219 A1 | 4/2007 | Ren et al. |
| 2007/0252517 A1 | 11/2007 | Owczarczyk et al. |
| 2008/0027220 A1 | 1/2008 | Stossel et al. |
| 2009/0061681 A1 | 3/2009 | McMunigal et al. |
| 2009/0134784 A1 | 5/2009 | Lin et al. |
| 2012/0004407 A1 | 1/2012 | Stoessel et al. |
| 2012/0217869 A1 | 8/2012 | Adachi et al. |
| 2016/0020397 A1 * | 1/2016 | Sannomiya ......... H01L 51/0072 252/301.16 |

FOREIGN PATENT DOCUMENTS

| | | |
|---|---|---|
| CN | 102282150 A | 12/2011 |
| CN | 103483332 A | 1/2014 |
| CN | 105431439 A | 3/2016 |
| EP | 1191613 B1 | 3/2006 |
| EP | 1191614 B1 | 5/2009 |
| EP | 1191612 B1 | 9/2009 |
| EP | 3109253 A1 | 12/2016 |
| TW | 201309696 A | 3/2013 |

(Continued)

OTHER PUBLICATIONS

International Search Report received in PCT/CN2017/112724, dated Feb. 6, 2018.
Tai et al., "Theoretical Design of π-Conjugated Heteropolycyclic Compounds Containing a Tricoordinated Boron Center", The Journal of Physical Chemistry C, (2013) pp. 14999-15008.
Goushi et.al., "Organic light-emitting diodes employing efficient reverse intersystem crossing for triplet-to-singlet state conversion", Nature Photonics, vol. 6 (2012) pp. 253-258.

(Continued)

*Primary Examiner* — Dung A. Le
(74) *Attorney, Agent, or Firm* — Cozen O'Connor

(57) ABSTRACT

An organic compound containing boron and uses thereof, an organic mixture, and an organic electronic device, the structure of said organic compound containing boron being as shown in formula (1). The substituents in formula (I) have the same definitions as in the description.

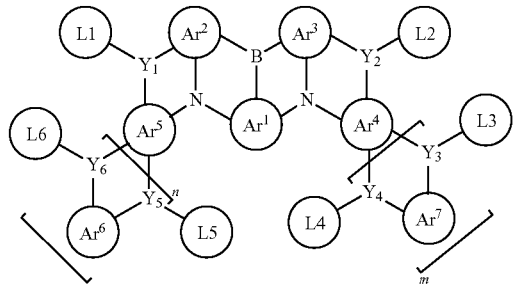

(1)

19 Claims, No Drawings

(56) References Cited

FOREIGN PATENT DOCUMENTS

| | | |
|---|---|---|
| TW | 201309778 A | 3/2013 |
| TW | 201343874 A | 11/2013 |
| TW | 201350558 A | 12/2013 |
| WO | 200070655 A2 | 11/2000 |
| WO | 200141512 A1 | 6/2001 |
| WO | 200202714 A2 | 1/2002 |
| WO | 200215645 A1 | 2/2002 |
| WO | 2005019373 A2 | 3/2005 |
| WO | 2005033244 A1 | 4/2005 |
| WO | 2007095118 A2 | 8/2007 |
| WO | 2009118087 A1 | 10/2009 |
| WO | 2009146770 A2 | 12/2009 |
| WO | 2010015307 A1 | 2/2010 |
| WO | 2010031485 A1 | 3/2010 |
| WO | 2010054728 A1 | 5/2010 |
| WO | 2010054731 A1 | 5/2010 |
| WO | 2010086089 A1 | 8/2010 |
| WO | 2010099852 A1 | 9/2010 |
| WO | 2010102709 A1 | 9/2010 |
| WO | 2010135519 A1 | 11/2010 |
| WO | 2011110277 A1 | 9/2011 |
| WO | 2011141110 A2 | 11/2011 |
| WO | 2011157339 A1 | 12/2011 |
| WO | 2012007086 A1 | 1/2012 |
| WO | 2012007087 A1 | 1/2012 |
| WO | 2012007088 A1 | 1/2012 |
| WO | 2013133359 A1 | 9/2013 |
| WO | 2013154064 A1 | 10/2013 |
| WO | 2016152544 A1 | 9/2016 |

OTHER PUBLICATIONS

Uoyama et al., "Highly efficient organic light-emitting diodes from delayed fluorescence", Nature, vol. 492 (2012) pp. 234-238.
Newkome et al. "Dendrimers and Dendrons", Wiley-VCH Verlag GmbH & Co. KGaA, ISBN 3-527-29997-1 (2002).
Baldo, et al., "High-efficiency fluorescent organic light-emitting devices using a phosphorescent sensitizer", Nature vol. 403, (2000), pp. 750-753.
Adachi et al., "High-efficiency red electrophosphorescence devices", Appl. Phys. Lett. vol. 78 (2001), pp. 1622-1624.
Kido et. al., "Bright red lightemitting organic electroluminescent devices having a europium complex as an emitter", Appl. Phys. Lett. vol. 65 (1994), p. 2124-2126.
Kido et al., "Electroluminescence in a Terbium Complex", Chem. Lett. (1990) pp. 657-660.
Johnson et. al., "Luminescent Iridium(I), Rhodium(I), and Platinum(II) Dithiolate Complexes", JACS (1983) vol. 105, pp. 1795-1802.
Wrighton et al., "The Nature of the Lowest Excited State in Tricarbonylchloro-1, 10-phenanthrolinerhenium(I) and Related Complexes", JACS vol. 96 (1974) pp. 998-1003.
Ma, et. al., "Electroluminescence from triplet metal-ligand charge-transfer excited state of transition metal complexes", Synth. Metals vol. 94 (1998) pp. 245-248.

Endo et. al., "Thermally Activated Delayed Fluorescence from Sn4ϕ-Porphyrin Complexes and Their Application to Organic Light-Emitting Diodes—A Novel Mechanism for Electroluminescence", Adv. Mater., vol. 21 (2009) pp. 4802-4806.
Endo et. al., "Efficient up-conversion of triplet excitons into a singlet state and its application for organic light emitting diodes", Appl. Phys. Lett., vol. 98 (2011) pp. 083302-01-083302-03.
Lee et al., "High-efficiency organic light-emitting diodes utilizing thermally activated delayed fluorescence from triazine-based donor-acceptor hybrid molecules", vol. 101 Appl. Phys. Lett., vol. 101 (2012) 093306-01-093306-04.
Tanaka, "Efficient green thermally activated delayed fluorescence (TADF) from a phenoxazine-triphenyltriazine (PXZ-TRZ) derivative", Chem. Commun. vol. 48 (2012) 11392-11394.
Zhang et.al., "Design of Efficient Thermally Activated Delayed Fluorescence Materials for Pure Blue Organic Light Emitting Diodes", J. Am. Chem. Soc, vol. 134 (2012) pp. 14706-14709.
Mehes et.al., "Enhanced Electroluminescence Efficiency in a Spiro-Acridine Derivative through Thermally Activated Delayed Fluorescence", Angew. Chem. Int. Ed, vol. 51 (2012) pp. 11311-11315.
Nakagawa et.al., "Electroluminescence based on thermally activated delayed fluorescence generated by a spirobifluorene donor-acceptor structure", Chem. Commun., vol. 48 (2012) 9580-9582.
Nasu et.al., "A highly luminescent spiro-anthracenone-based organic light-emitting diode exhibiting thermally activated delayed fluorescence", Chem. Commun., vol. 49 (2013), 10385-10387.
Li et.al., "Highly Efficient Organic Light-Emitting Diode Based on a Hidden Thermally Activated Delayed Fluorescence Channel in a Heptazine Derivative", Adv. Mater., vol. 25 (2013) pp. 1-5.
Dias et.al., "Triplet Harvesting with 100% Efficiency by Way of Thermally Activated Delayed Fluorescence in Charge Transfer OLED Emitters", Adv. Mater., vol. 25 (2013) pp. 3707-3714.
Komino et.al., "Suppression of Efficiency Roll-Off Characteristics in Thermally Activated Delayed Fluorescence Based Organic Light-Emitting Diodes Using Randomly Oriented Host Molecules", Chem. Mater., vol. 25 (2013) pp. 3038-3047.
Tanaka et.al., "Twisted Intramolecular Charge Transfer State for Long-Wavelength Thermally Activated Delayed Fluorescence", Chem. Mater., vol. 25, (2013) pp. 3766-3771.
Lee et.al., "Oxadiazole- and triazole-based highly-efficient thermally activated delayed fluorescence emitters for organic light-emitting diodes", J. Mater. Chem. C., vol. 1 (2013) pp. 4599-4605.
Ishimatsu et.al., "Solvent Effect on Thermally Activated Delayed Fluorescence by 1,2,3,5-Tetrakis(carbazol-9-yl)-4,6-dicyanobenzene", J. Phys. Chem. A., vol. 117 (2013) pp. 5607-5612.
Kipphan (Handbook of Print Media: Technologies and Production Methods), ISBN 3-540-67326-1,Chapter 1.3, pp. 40-67, Chapter 1.5, pp. 117-144, Chapter 5.5, pp. 711-730.
Bulovic et. al., "Transparent light-emitting devices", Nature, vol. 380 (1996) pp. 29.
Gu et. al., "Transparent organic light emitting device", Appl. Phys. Lett. vol. 68 (1996) pp. 2606-2608.

\* cited by examiner

BORON-CONTAINING ORGANIC COMPOUND AND APPLICATIONS THEREOF, ORGANIC MIXTURE, AND ORGANIC ELECTRONIC DEVICE

The present disclosure claims priority to Chinese Patent Application No. 201611047549.1 entitled "A boron-containing thermally activated delayed fluorescence material and application thereof", filed on Nov. 23, 2016, the entire contents of which are incorporated herein by reference.

TECHNICAL FIELD

The present disclosure relates to the technical field of organic opto-electronic materials, in particular to a boron-containing organic compound and an application thereof, an organic mixture, and an organic electronic device.

BACKGROUND

Organic semiconductor materials have diversity in synthesis, which has great advantages for organic light-emitting diodes (OLEDs) with relatively low manufacturing cost and excellent optical and electrical properties, so that they show great potential for applications in opto-electronic devices such as flat panel displays and lighting.

In order to improve the luminous efficiency of organic light-emitting diodes, various light-emitting material systems based on fluorescence and phosphorescence have been developed. The organic light-emitting diodes using the fluorescent materials have high reliability, however, their internal electroluminescence quantum efficiency is limited to 25% under electrical excitation, which is because the exciton has a branching ratio between the singlet excited state and the triplet excited state of 1:3. In contrast, the organic light-emitting diodes using phosphorescent materials have achieved almost 100% internal electroluminescence quantum efficiency. However, the phosphorescent OLEDs have a significant problem, that is, a Roll-off effect in the high luminance. In other words, the luminous efficiency decreases rapidly with an increase in current or luminance, which is particularly disadvantageous for high luminance applications.

At present, commercial phosphorescent materials are complexes including iridium or platinum, which are rare and expensive. The synthesis of the complexes is complicated which leads to a quite high cost. In order to overcome the rarity and high cost of the raw materials for complexes including iridium or platinum and the complexities of their synthesis, Adachi proposed the concept of reverse intersystem crossing, which allows the use of organic compounds, i.e., without using metal complexes, to achieve high efficiencies comparable to phosphorescent OLEDs. This concept has been achieved through various combinations of materials, such as: 1) using exciplex, see Adachi et al., Nature Photonics, Vol. 6, p 253 (2012); 2) using thermally activated delayed fluorescence (TADF) materials, see Adachi et al., Nature, Vol. 492, 234, (2012). However, the general organic compounds having TADF mainly employ the way that an electron-donating group (Donor) is linked to an electron-deficiency group or an electron-accepting group (Acceptor), resulting in a complete separation of electron cloud distributions of the highest occupied molecular orbital (HOMO) and the lowest unoccupied molecular orbital (LUMO), which further reduces the difference ($\Delta E_{ST}$) between singlet state (S1) and triplet state (T1) of organic compounds, i.e., ($S_1-T_1$). However, compared with phosphorescent light-emitting materials, the performance of the TADF materials still has a certain difference in terms of efficiency and lifetime.

SUMMARY

In accordance with various embodiments of the present disclosure, a boron-containing organic compound and an application thereof, an organic mixture, and an organic electronic device are provided that address one or more of the problems involved in the background.

A boron-containing organic compound has a general formula (1) as following:

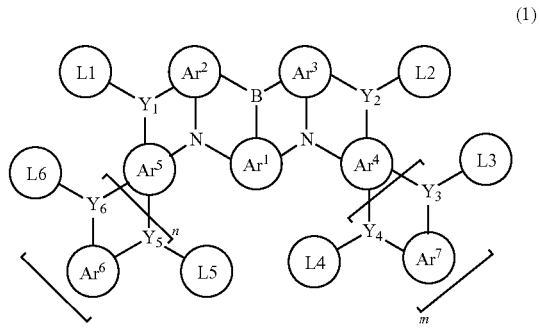

(1)

wherein, $Ar^1$ to $Ar^7$ are the same or different, and $Ar^1$ to $Ar^7$ are independently selected from the group consisting of aromatic ring system containing 2 to 20 carbon atoms, heteroaromatic ring system containing 2 to 20 carbon atoms, and non-aromatic ring system containing 2 to 20 carbon atoms; and $Ar^1$ to $Ar^7$ have a group $R^1$ on rings thereof, the group $R^1$ is the same or different at each occurrence;

L1 to L6 are the same or different, and L1 to L6 are independently selected from the group consisting of a hydrogen, a linear alkane containing 1 to 15 carbon atoms, a branched alkane containing 1 to 15 carbon atoms, a cycloalkane containing 1 to 15 carbon atoms, an aromatic ring system containing 2 to 20 carbon atoms, a heteroaromatic ring system containing 2 to 20 carbon atoms, and a non-aromatic ring system containing 2 to 20 carbon atoms; and when one or more of $Y_1$ to $Y_6$ are a single bond or a doubly-bridging group, the corresponding L is not present;

$Y_1$ to $Y_6$ are the same or different, $Y_1$ to $Y_6$ are independently selected from the group consisting of a single bond, a doubly-bridging group, and a triply-bridging group, and $Y_1$ to $Y_6$ are independently linked to three adjacent groups thereof by a single bond or a double bond;

$R^1$ is selected from the group consisting of —H, —F, —Cl, Br, I, -D, —CN, —NO$_2$, —CF$_3$, B(OR$^2$)$_2$, Si(R$^2$)$_3$, a linear alkane group, an alkane ether group, an alkane thioether group containing 1 to 10 carbon atoms, a branched alkane group, and a cycloalkane group;

$R^2$ is one or more selected from the group consisting of H, D, a linear alkyl group containing 1 to 20 carbon atoms, an alkoxy group containing 1 to 20 carbon atoms, a thioalkoxy group containing 1 to 20 carbon atoms, a branched alkyl group containing 3 to 20 carbon atoms, a cyclic alkyl group containing 3 to 20 carbon atoms, a silyl group containing 3 to 20 carbon atoms, a substituted keto group containing 1 to 20 carbon atoms, an alkoxy carbonyl group containing 2 to 20 carbon atoms, an aryloxy carbonyl group containing 7 to 20 carbon atoms, a cyano group, a carbamoyl group, a haloformyl group, a formyl group, an isocyano group, an isocyanate group, a thiocyanate group, an isothiocyanate group, a hydroxyl group, a nitro group, a $CF_3$ group, Cl, Br, F, a crosslinkable group, a substituted or unsubstituted aromatic ring system containing 5 to 40 ring atoms or a substituted or unsubstituted heteroaromatic ring system containing 5 to 40 ring atoms, and an aryloxy group containing 5 to 40 ring atoms or a heteroaryloxy group containing 5 to 40 ring atoms; wherein at least one of $R^2$ forms a monocyclic or polycyclic aliphatic or aromatic ring with a ring bonded to the group, or a plurality of $R^2$ form a monocyclic or polycyclic aliphatic or aromatic ring with each other;

n is selected from 0, 1, or 2; m is selected from 0, 1, or 2.

An application of the aforementioned boron-containing organic compound in an organic electronic device is provided.

A polymer in which at least one repeating unit includes the aforementioned boron-containing organic compound is provided.

An organic mixture for an organic electronic device includes at least one organic functional material and the aforementioned boron-containing organic compound or the aforementioned polymer. The organic functional material is selected from the group consisting of a hole injection material, a hole transport material, a hole blocking material, an electron injection material, an electron transport material, an electron blocking material, an organic host material, and a light-emitting material.

An ink for an organic electronic device includes an organic solvent, and the aforementioned boron-containing organic compound, or the aforementioned polymer, or the aforementioned organic mixture.

An organic electronic device includes a functional layer, which includes the aforementioned boron-containing organic compound, or the aforementioned polymer, or the aforementioned organic mixture, or is prepared from the aforementioned ink.

Details of one or more embodiments of the present disclosure are set forth in the accompanying drawings and description below. Other features, objects, and advantages of the present disclosure will be apparent from the description, accompanying drawings, and claims.

DETAILED DESCRIPTION OF EMBODIMENTS

In order to make the objects, technical solutions, and advantages of the present disclosure more clearly, the present disclosure will be further described in detail below with reference to the accompanying drawings and embodiments. It is understood that the specific examples described herein are merely illustrative of the disclosure and are not intended to limit the disclosure.

In the present disclosure, formulations, printing inks, and inks have the same meaning and are interchangeable. Host materials and matrix materials have the same meaning and are interchangeable. Metal organic clathrate, metal organic complexes, and organometallic complexes have the same meaning and are interchangeable.

A boron-containing organic compound according to one embodiment has a general formula (1) as following:

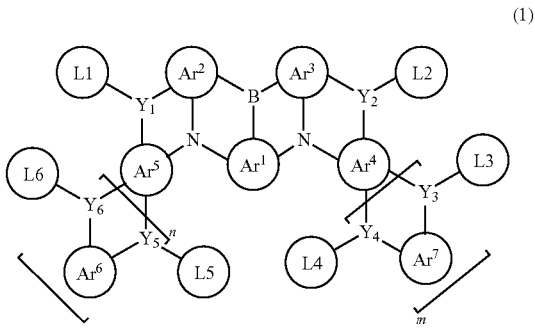

(1)

wherein, $Ar^1$ to $Ar^7$ are the same or different, and are independently selected from the group consisting of aromatic ring system containing 2 to 20 carbon atoms, heteroaromatic ring system containing 2 to 20 carbon atoms, and non-aromatic ring system containing 2 to 20 carbon atoms. $Ar^1$ to $Ar^7$ have a group $R^1$ on rings thereof, which is the same or different at each occurrence.

L1 to L6 are the same or different, and are independently selected from the group consisting of a hydrogen, a linear alkane containing 1 to 15 carbon atoms, a branched alkane containing 1 to 15 carbon atoms, a cycloalkane containing 1 to 15 carbon atoms, an aromatic ring system containing 2 to 20 carbon atoms, a heteroaromatic ring system containing 2 to 20 carbon atoms, and a non-aromatic ring system containing 2 to 20 carbon atoms. When one or more of $Y_1$ to $Y_6$ are a single bond or a doubly-bridging group, the corresponding L is not present.

$Y_1$ to $Y_6$ are the same or different, and are independently selected from the group consisting of a single bond, a doubly-bridging group, and a triply-bridging group. $Y_1$ to $Y_6$ are independently linked to three adjacent groups thereof by a single bond or a double bond.

$R^1$ is selected from the group consisting of —H, —F, —Cl, Br, I, -D, —CN, —NO$_2$, —CF$_3$, B(OR$^2$)$_2$, Si(R$^2$)$_3$, a linear alkane group, an alkane ether group, an alkane thio-ether group containing 1 to 10 carbon atoms, a branched alkane group, and a cycloalkane group.

$R^2$ is one or more selected from the group consisting of H, D, a linear alkyl group containing 1 to 20 carbon atoms, an alkoxy group containing 1 to 20 carbon atoms, a thioalkoxy group containing 1 to 20 carbon atoms, a branched alkyl group containing 3 to 20 carbon atoms, a cyclic alkyl group containing 3 to 20 carbon atoms, a silyl group containing 3 to 20 carbon atoms, a substituted keto group containing 1 to 20 carbon atoms, an alkoxy carbonyl group containing 2 to 20 carbon atoms, an aryloxy carbonyl group containing 7 to 20 carbon atoms, a cyano group, a carbamoyl group, a haloformyl group, a formyl group, an isocyano group, an isocyanate group, a thiocyanate group, an isothiocyanate group, a hydroxyl group, a nitro group, a $CF_3$ group, Cl, Br, F, a crosslinkable group, a substituted or unsubstituted aromatic ring system containing 5 to 40 ring atoms or a substituted or unsubstituted heteroaromatic ring system containing 5 to 40 ring atoms, and an aryloxy group containing 5 to 40 ring atoms or a heteroaryloxy group containing 5 to 40 ring atoms. At least one of $R^2$ forms a monocyclic or polycyclic aliphatic or aromatic ring with a ring bonded to the group, or a plurality of $R^2$ form a monocyclic or polycyclic aliphatic or aromatic ring with each other.

n is selected from 0, 1, or 2; m is selected from 0, 1, or 2.

In some embodiment, n is selected from 1 or 2; m is selected from 1 or 2. Further, n and m in the general formula (1) are both 1.

The aforementioned boron-containing organic compound can be used in an organic electronic device, particularly as a light-emitting layer material in an organic electronic device. The D group and the A group of the aforementioned boron-containing organic compound are both contained in the same conjugated ring, thereby facilitating realization of a non-D-A structure, such that the aforementioned boron-containing organic compound has thermally activated delayed fluorescence luminescence characteristics, and the energy level difference between the first triplet excited state $T_1$ and the first singlet excited state $S_1$ of the boron-containing organic compound is small. Thus, the boron-containing organic compound can be used as a TADF luminescent material, since the energy level difference between the first triplet excited state $T_1$ and the first singlet excited state $S_1$ of the boron-containing organic compound is small, the triplet excitons thereof can be converted to singlet excitons by reverse intersystem crossing. Therefore, by coordinating with a suitable host material, the boron-containing organic compound can improve the luminous efficiency and lifetime of the organic electronic device, so that the organic electronic device has a low manufacturing cost and has the advantages of high efficiency, long lifetime, and low roll-off.

In one embodiment, $Ar^1$ to $Ar^7$ are independently selected from an aromatic ring system containing 2 to 20 carbon atoms or a heteroaromatic ring system containing 2 to 20 carbon atoms. It should be noted that the hydrogen on the ring of $Ar^1$ to $Ar^7$ may be substituted by one or more groups $R^1$ or unsubstituted, and the group $R^1$ may be the same or different at each occurrence. In addition, the aryl or heteroaryl in the aromatic ring and/or heteroaromatic ring may be selected from the group consisting of benzene, naphthalene, anthracene, phenanthrene, pyridine, pyrene, and thiophene.

In one embodiment, L1 to L6 in the general formula (1) may be the same or different, and L1 to L6 are independently selected from the group consisting of a linear alkane containing 1 to 15 carbon atoms, a branched alkane containing 1 to 15 carbon atoms, a cycloalkane containing 1 to 15 carbon atoms, an aromatic ring system containing 2 to 20 carbon atoms, a heteroaromatic ring system containing 2 to 20 carbon atoms, and a non-aromatic ring system containing 2 to 20 carbon atoms.

In one embodiment, n and m in the general formula (1) are each selected from 0 or 1.

In one embodiment, $Y_1$ to $Y_6$ are independently selected from a single bond, or a doubly-bridging group or triply-bridging group having one or more of the following structural groups:

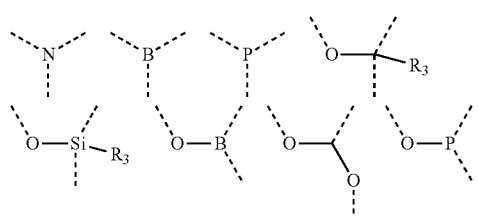

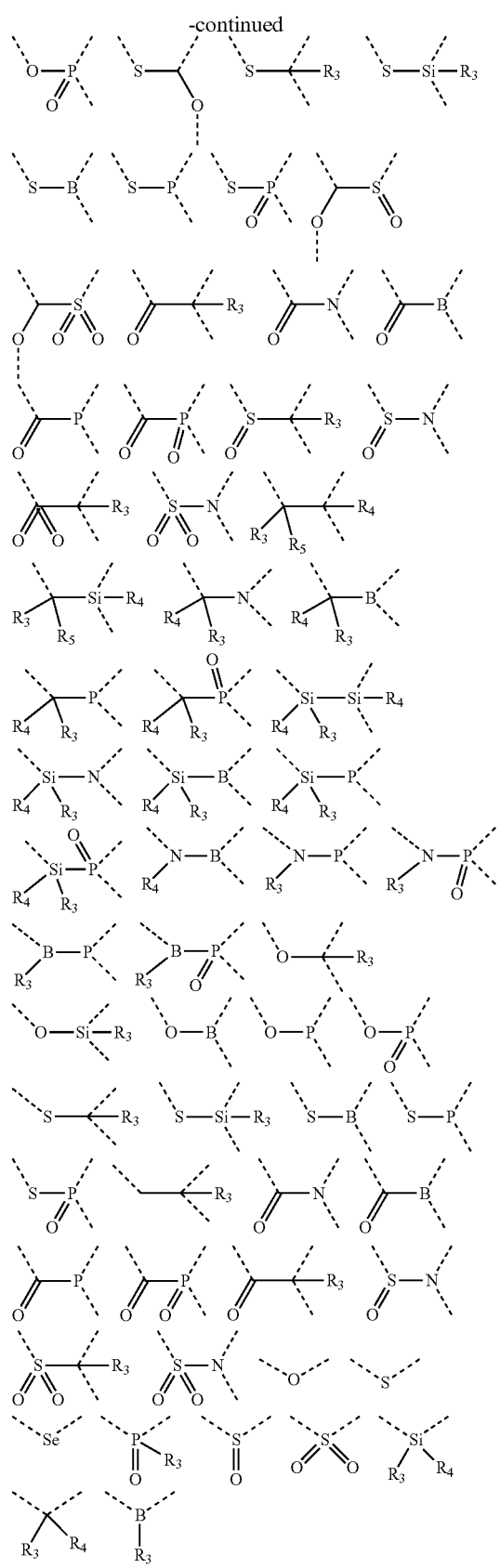

$R^3$, $R^4$, and $R^5$ are independently selected from the group consisting of —H, —F, —Cl, Br, I, -D, —CN, —NO$_2$, —CF$_3$, B(OR$^2$)$_2$, Si(R$^2$)$_3$, a linear alkane group, an alkane ether group, an alkane thioether group containing 1 to 10 carbon atoms, a branched alkane group, and a cycloalkane group.

R$^2$ is one or more selected from the group consisting of H, D, a linear alkyl group containing 1 to 20 carbon atoms, an alkoxy group containing 1 to 20 carbon atoms, a thioalkoxy group containing 1 to 20 carbon atoms, a branched alkyl group containing 3 to 20 carbon atoms, a cyclic alkyl group containing 3 to 20 carbon atoms, a silyl group containing 3 to 20 carbon atoms, a substituted keto group containing 1 to 20 carbon atoms, an alkoxy carbonyl group containing 2 to 20 carbon atoms, an aryloxy carbonyl group containing 7 to 20 carbon atoms, a cyano group, a carbamoyl group, a haloformyl group (—C(=O)—X, where X represents a halogen atom), a formyl group (—C(=O)—H), an isocyano group, an isocyanate group, a thiocyanate group, an isothiocyanate group, a hydroxyl group, a nitro group, a CF$_3$ group, Cl, Br, F, a crosslinkable group, a substituted or unsubstituted aromatic ring system containing 5 to 40 ring atoms or a substituted or unsubstituted heteroaromatic ring system containing 5 to 40 ring atoms, and an aryloxy group containing 5 to 40 ring atoms or a heteroaryloxy group containing 5 to 40 ring atoms. At least one of R$^2$ forms a monocyclic or polycyclic aliphatic or aromatic ring with a ring bonded to the group, or a plurality of R$^2$ form a monocyclic or polycyclic aliphatic or aromatic ring with each other.

A dashed bond represents a bond by which the structural group is bonded to adjacent structural unit thereof.

In addition, Y$_1$ to Y$_6$ are independently selected from the group consisting of a single bond and any of the aforementioned doubly or triply-bridging groups.

It should be noted that, in one embodiment, the aromatic ring system contains 5 to 10 carbon atoms in the ring system. The heteroaromatic ring system contains 1 to 10 carbon atoms and at least one heteroatom in the ring system and the total number of carbon atoms and heteroatoms is at least 4. The heteroatom is one or more selected from the group consisting of Si, N, P, O, S, and Ge. In one embodiment, the heteroatom is one or more selected from the group consisting of Si, N, P, O, and S. In addition, in the present embodiment, the aromatic or heteroaromatic ring system includes not only aryl or heteroaryl, but also a plurality of aryl or heteroaryl may also be interrupted by short non-aromatic units (<10% non-H atoms, in one embodiment less than 5% of non-H atoms, such as C, N, or O atoms). Therefore, systems such as 9, 9'-spirobifluorene, 9, 9-diarylfluorene, triarylamine, diaryl ether, and the like are also considered to be an aromatic ring system for the purpose of the present disclosure.

Moreover, the non-aromatic ring system contains 1 to 10 carbon atoms in the ring system, and includes not only saturated ring systems but also partially unsaturated ring systems. The hydrogen on the ring may be unsubstituted, or monosubstituted or polysubstituted by the group R$^1$. The group R$^1$ may be the same or different at each occurrence, and may also contain one or more heteroatoms. The heteroatoms may be Si, N, P, O, S, and/or Ge. In one embodiment, the heteroatoms are selected from Si, N, P, O, and/or S. These may be, for example, cyclohexyl- or piperidine-like systems, but also can be cyclooctadiene-like cyclic systems. The term also applies to fused non-aromatic ring systems. In addition, the non-aromatic ring system may contain 1 to 3 carbon atoms in the ring system.

In one embodiment, the H atom on the NH or the bridging group CH$_2$ group in the boron-containing organic compound may be substituted with a R$^1$ group. R$^1$ may be selected from the group consisting of an alkyl containing 1 to 10 carbon atoms, an alkoxy containing 1 to 10 carbon atoms, and an aryl containing 2 to 10 carbon atoms or a heteroaryl containing 2 to 10 carbon atoms. The alkyl containing 1 to 10 carbon atoms may be selected from the group consisting of methyl, ethyl, n-propyl, isopropyl, cyclopropyl, n-butyl, isobutyl, sec-butyl, t-butyl, cyclobutyl, 2-methylbutyl, n-pentyl, n-hexyl, cyclohexyl, n-heptyl, cycloheptyl, n-octyl, cyclooctyl, 2-ethylhexyl, trifluoromethyl, pentafluoromethyl, 2,2,2-trifluoroethyl, vinyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl, and octynyl. The alkoxy containing 1 to 10 carbon atoms may be selected from the group consisting of methoxy, ethoxy, n-propoxy, isopropoxy, n-butoxy, isobutoxy, sec-butoxy, t-butoxy, and 2-methylbutoxy. The aryl containing 2 to 10 carbon atoms or the heteroaryl containing 2 to 10 carbon atoms may be monovalent or divalent depending on the use, and in each case may also be substituted by the aforementioned R$^1$ group and may be connected to the aromatic or heteroaromatic ring at any desired position. In addition, the aryl or heteroaryl containing 2 to 10 carbon atoms may be selected from the group consisting of benzene, naphthalene, anthracene, pyrene, dihydropyrene, chrysene, perylene, fluoranthene, naphthacene, pentacene, benzopyrene, furan, benzofuran, isobenzofuran, dibenzofuran, thiophene, benzothiophene, isobenzothiophene, dibenzothiophen, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazol, indazole, imidazole, benzimidazole, naphthoimidazole, phenanthroimidazole, pyridimazole, pyrazimidazole, quinoxalineimidazole, oxazole, benzoxazole, naphthoxazole, anthraoxazole, phenanthroxazole, isoxazole, 1,2-thiazole, 1,3-thiazole, benzothiazole, pyridazine, benzopyridazine, pyrimidine, benzopyrimidine, quinoxaline, pyrazine, diazaanthracenyl, 1,5-naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole. 1,2,4,5-tetrazine, 1,2,3,4-tetrazine, 1,2,3,5-tetrazine, purine, pteridine, indolizine or benzothiadiazole. In addition, aromatic and heteroaromatic ring systems are considered to refer in particular to biphenylene, terphenylene, fluorene, spirobifluorene, dihydrophenanthrene, tetrahydropyrene, cis- and trans-indenofluorene, in addition to the aforementioned aryl and heteroaryl.

In one embodiment, Ar$^1$ to Ar$^7$ independently include one or more of the following structural groups:

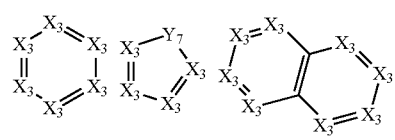

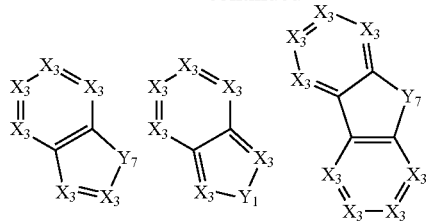

$X_3$ is selected from $CR^6$ or N;

$Y_7$ is selected from $CR^7R^8$, $SiR^9R^{10}$, $NR^{11}$, $C(=O)$, S or O;

wherein, $R^6$, $R^7$, $R^8$, $R^9$, $R^{10}$, and $R^{11}$ are one or more independently selected from the group consisting of H, D, a linear alkyl group containing 1 to 20 carbon atoms, an alkoxy group containing 1 to 20 carbon atoms, a thioalkoxy group containing 1 to 20 carbon atoms, a branched alkyl group containing 3 to 20 carbon atoms, a cyclic alkyl group containing 3 to 20 carbon atoms, a silyl group containing 3 to 20 carbon atoms, a substituted keto group containing 1 to 20 carbon atoms, an alkoxy carbonyl group containing 2 to 20 carbon atoms, an aryloxy carbonyl group containing 7 to 20 carbon atoms, a cyano group (—CN), a carbamoyl group (—C(=O)NH$_2$), a haloformyl group (—C(=O)—X, where X represents a halogen atom), a formyl group (—C(=O)—H), an isocyano group, an isocyanate group, a thiocyanate group, an isothiocyanate group, a hydroxyl group, a nitro group, a $CF_3$ group, Cl, Br, F, a crosslinkable group, a substituted or unsubstituted aromatic ring system containing 5 to 40 ring atoms or a substituted or unsubstituted heteroaromatic ring system containing 5 to 40 ring atoms, and an aryloxy group containing 5 to 40 ring atoms or a heteroaryloxy group containing 5 to 40 ring atoms. At least one of $R^6$, $R^7$, $R^8$, $R^9$, $R^{10}$, and $R^{11}$ forms a monocyclic or polycyclic aliphatic or aromatic ring with a ring bonded to the group, or at least two of $R^6$, $R^7$, $R^8$, $R^9$, $R^{10}$, and $R^{11}$ are bonded to each other to form a monocyclic or polycyclic aliphatic or aromatic ring.

In addition, $Ar^1$ to $Ar^7$ may be independently selected from any of the aforementioned groups.

Moreover, in one embodiment, $Ar^1$ to $Ar^7$ are independently selected from a phenyl group.

Furthermore, the boron-containing organic compound is one selected from the group consisting of structures represented by the following general formulas (2) to (7):

(2)

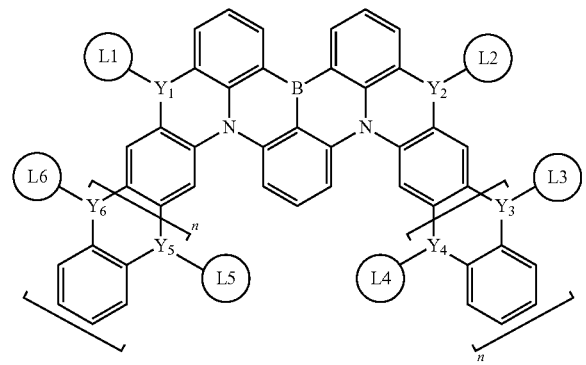

(3)

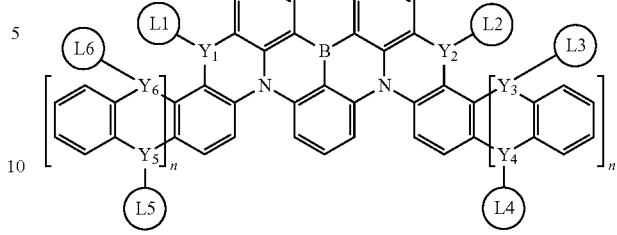

(4)

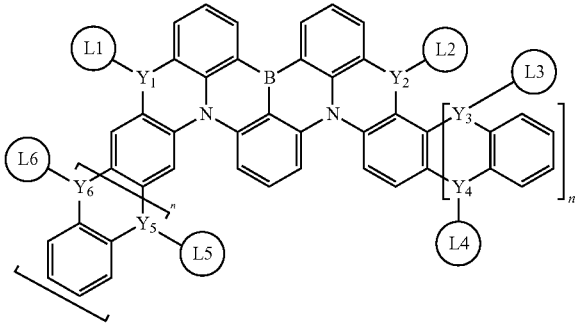

(5)

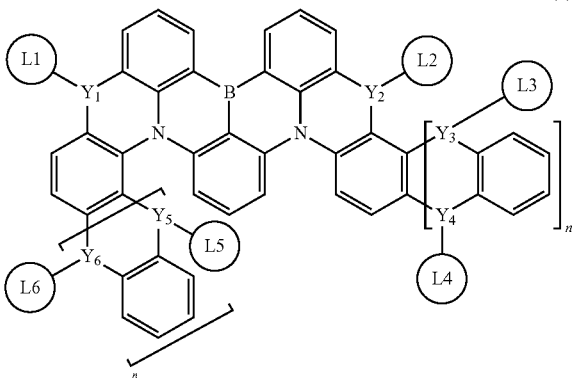

(6)

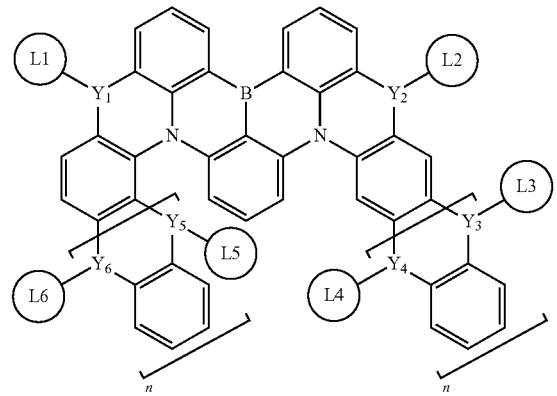

-continued (7)

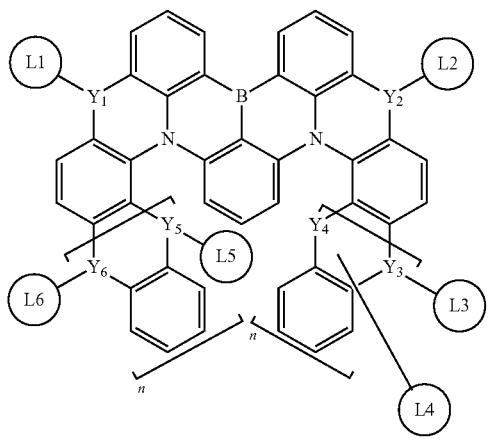

L1 to L6 may be the same or different, and L1 to L6 are independently selected from the group consisting of a hydrogen, a linear alkane containing 1 to 15 carbon atoms, a branched alkane containing 1 to 15 carbon atoms, a cycloalkane containing 1 to 15 carbon atoms, an aromatic ring system containing 2 to 20 carbon atoms, a heteroaromatic ring system containing 2 to 20 carbon atoms, and a non-aromatic ring system containing 2 to 20 carbon atoms. When one or more of $Y_1$ to $Y_6$ are a single bond or a doubly-bridging group, the corresponding L is not present.

$Y_1$ to $Y_6$ are the same or different, $Y_1$ to $Y_6$ are independently selected from the group consisting of a single bond, a doubly-bridging group, and a triply-bridging group, and $Y_1$ to $Y_6$ are independently linked to three adjacent groups thereof by a single bond or a double bond.

n is selected from 0, 1, or 2. m is selected from 0, 1, or 2.

In one embodiment, L1 to L6 in the general formulas (1) to (7) may be the same or different, and L1 to L6 are independently selected from the group consisting of a linear alkane containing 1 to 15 carbon atoms, a branched alkane containing 1 to 15 carbon atoms, and a cycloalkane containing 1 to 15 carbon atoms.

In addition, in another embodiment, L1 to L6 may be the same or different, and independently include one or more of the following structural units:

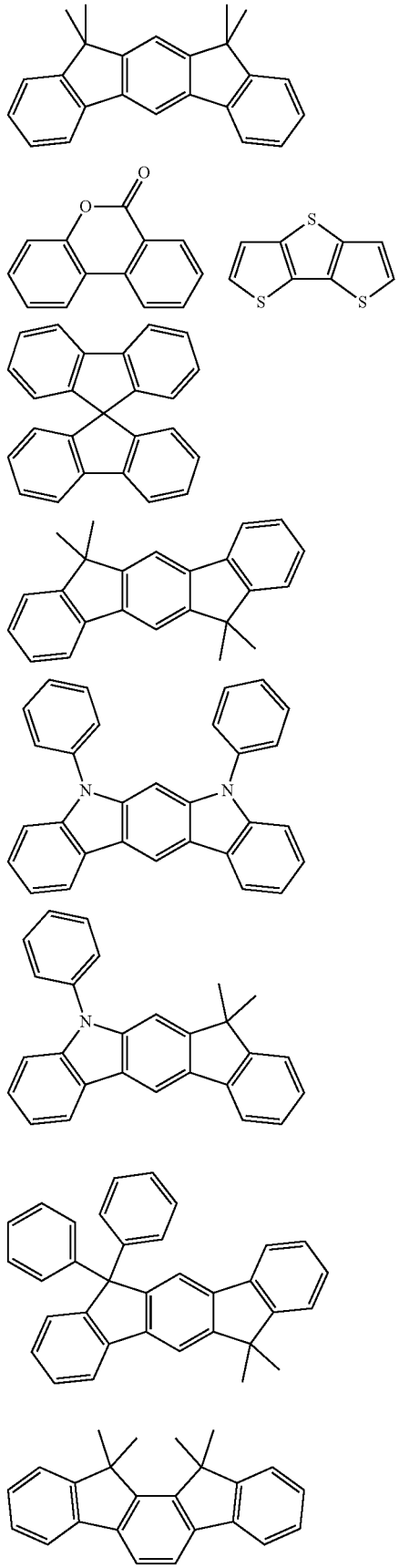

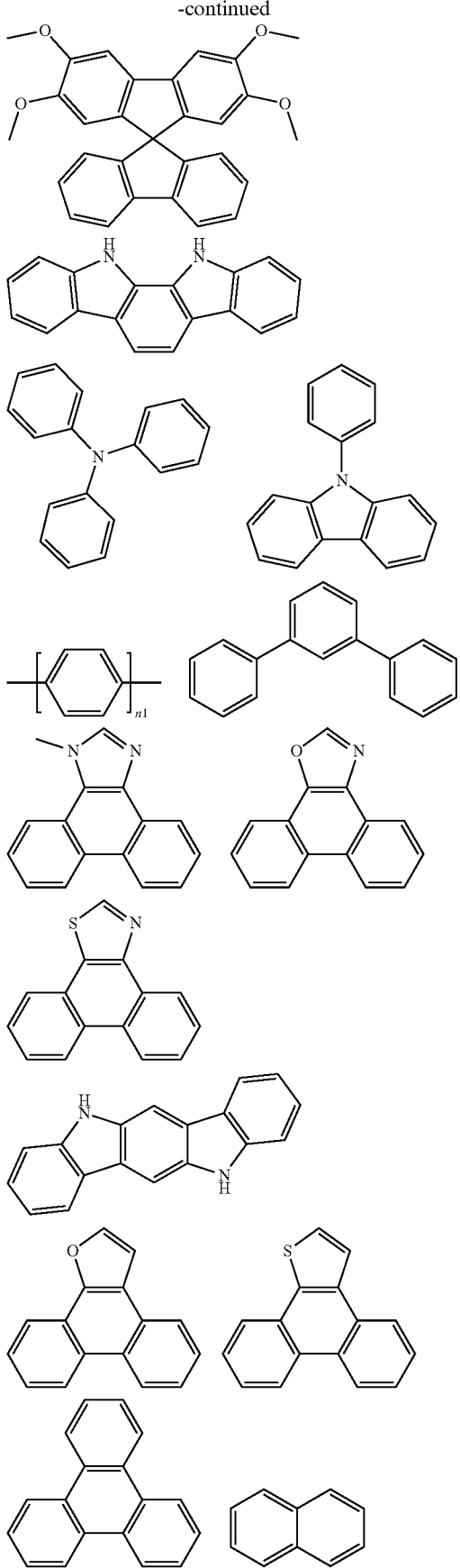

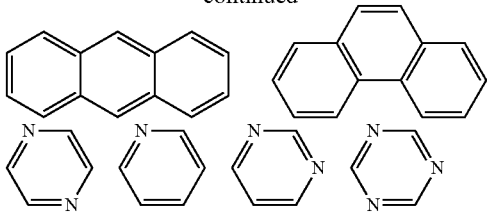

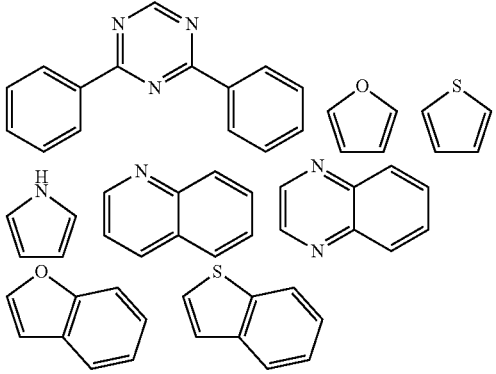

wherein n1 is selected from 1, 2, 3 or 4.

In addition, L1 to L6 may be the same or different, and are independently selected from any of the groups in the above table.

The compound according to the present disclosure facilitates the obtaining of thermally activated delayed fluorescence TADF characteristics. According to the principle of thermally activated delayed fluorescence TADF material (see Adachi et al., Nature, Vol 492, 234, (2012)), when $(S_1-T_1)$ of the organic compound is sufficiently small, the triplet excitons of the organic compound can be converted to singlet excitons through reverse intersystem crossing, thereby achieving high efficiency light emission. In general, the TADF material is obtained by linking an electron-donating group (Donor) to an electron-deficiency group or an electron-accepting group (Acceptor). In other words, the TADF material has an obvious distinct D-A structure.

In one embodiment, the boron-containing organic compound has a $(S_1-T_1) \leq 0.30$ eV. In another embodiment, the $(S_1-T_1) \leq 0.25$ eV. In yet another embodiment, the $(S_1-T_1) \leq 0.20$ eV.

In a further embodiment, the $(S_1-T_1) \leq 0.10$ eV. The $(S_1-T_1)$ represents an energy level difference between the first triplet excited state $T_1$ of the boron-containing organic compound and the first singlet excited state $S_1$ of the boron-containing organic compound.

In one embodiment, at least one of L1 to L6 contains an electron-donating group. The electron-donating group may be selected from the group consisting of the following groups:

(D1)

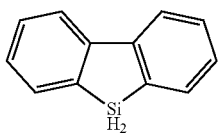

(D2)

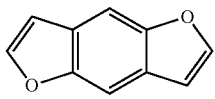

-continued

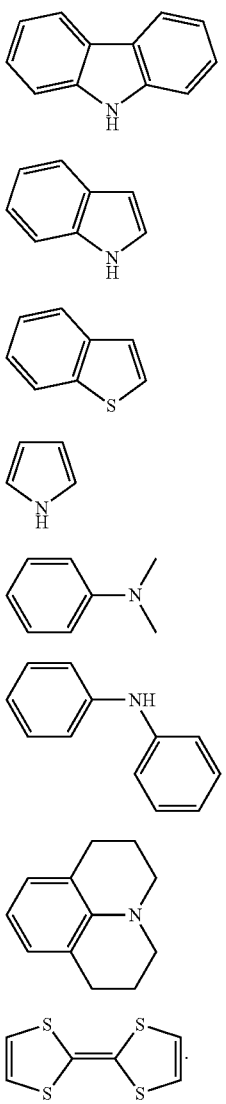

(D3)
(D4)
(D5)
(D6)
(D7)
(D8)
(D9)
(D10)

In another embodiment, at least one of L1 to L6 contains an electron-accepting group. The electron-accepting group may be selected from the group consisting of F, a cyano group, and a structure containing the following groups.

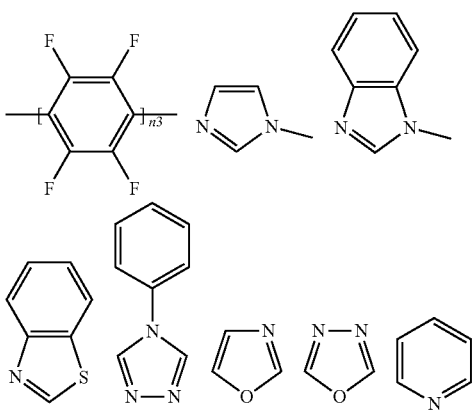

-continued

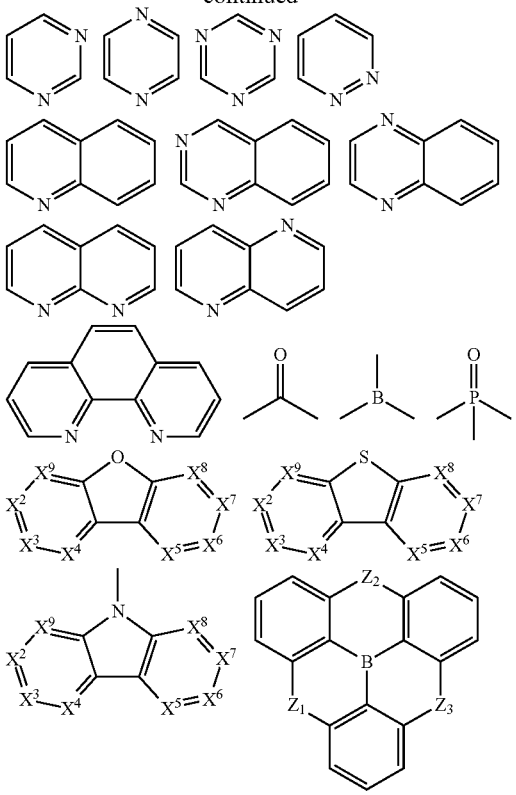

n3 is selected from 1, 2, or 3. $X^1$ to $X^8$ are independently selected from $CR^{12}$ or N, and at least one of $X^1$ to $X^8$ is selected from N. $Z_1$ to $Z_3$ are independently selected from the group consisting of $C(R^{12})_2$, O, and S. $R^{12}$ is selected from the group consisting of a hydrogen, an alkyl, an alkoxy, an amino, an alkene, an alkyne, an aralkyl, a heteroalkyl, an aryl, and a heteroaryl.

It should be noted that the electron-accepting group may be selected from the group consisting of F, a cyano group, and any of the aforementioned groups.

In alternative embodiments, at least one of L1 to L6 contains an electron-donating group, and at least one of L1 to L6 contains an electron-accepting group. The electron-donating group is as described above, and the electron-accepting group is also as described above.

The aforementioned boron-containing organic compound can be used as an organic functional material in an organic electronic device, especially OLED. The organic functional materials can be classified into hole injection materials (HIM), hole transport materials (HTM), electron transport materials (ETM), electron injection materials (EIM), electron blocking materials (EBM), hole blocking materials (HBM), emitters, host materials (Host), and organic dyes. The boron-containing organic compound can be used as a host material, an electron transport material or a hole transport material. In addition, the boron-containing organic compound can be used as a phosphorescent host material or a co-host material.

When the boron-containing organic compound is used as a phosphorescent host material, the boron-containing organic compound must have an appropriate triplet energy level. In one embodiment, the boron-containing organic compound has a $T_1$ greater than or equal to 2.2 eV, and $T_1$ represents the first triplet excited state of the boron-containing organic compound. In addition, in another embodiment, the $T_1$ of the boron-containing organic compound is greater than or equal to 2.4 eV. In yet another embodiment, the $T_1$ of the boron-containing organic compound is greater than or equal to 2.6 eV. In still another embodiment, the $T_1$ of the boron-containing organic compound is greater than or equal to 2.65 eV. In a further another embodiment, the $T_1$ of the boron-containing organic compound is greater than or equal to 2.7 eV.

It should be noted that, the function of the boron-containing organic compound depends on the substitution form, the organic compound according to the general formulas (1) to (7) may have various functions including, but not limited to, a hole transport function, an electron transport function, a light-emitting function, an exciton blocking function, and the like. In particular, it is described which compounds are particularly suitable for which functions by substituents L1 to L6. The substituents L1 to L6 have an influence on the electronic characteristics of the units of the general formulas (1) to (8).

In one embodiment, at least one of hydrogens on the ring of the boron-containing compound is deuterated. In addition, the deuterated hydrogen on the ring of the boron-containing compound accounts for 5% to 50% of all hydrogens on the ring of the boron-containing compound. In another embodiment, 10% of H is deuterated. In yet another embodiment, 20% of H is deuterated. In still another embodiment, 30% of H is deuterated. In a further embodiment, 40% of H is deuterated.

The triplet energy level T1 of the organic compound depends on the sub-structure having the largest conjugated system in the organic compound. Generally, T1 decreases as the conjugated system increases. In one embodiment, in the general formula (1), the sub-structure represented by the general formula (1a) has the largest conjugated system.

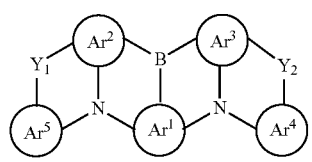

(1a)

In one embodiment, when the substituent of the general formula (1a) is removed, the number of ring atoms is less than or equal to 36. In another embodiment, the number of ring atoms is less than or equal to 30. In yet another embodiment, the number of ring atoms is less than or equal to 26. In a further embodiment, the number of ring atoms is less than or equal to 20.

In addition, in one embodiment, the boron-containing organic compound having the general formula (1a) has a T1≥2.3 eV. In another embodiment, T1≥2.5 eV. In yet another embodiment, T1≥2.7 eV. In still another embodiment, T1≥2.75 eV. In a further embodiment, T1≥2.8 eV.

When the boron-containing organic compound is used as a phosphorescent host material, it is required to have high thermal stability. In one embodiment, the boron-containing organic compound has a glass transition temperature $T_g$≥100° C. In addition, $T_g$≥120° C. Moreover, $T_g$≥140° C. Furthermore, $T_g$≥160° C. Still furthermore, $T_g$≥180° C.

In one embodiment, the boron-containing organic compound has a TADF property and is used as a co-host or auxiliary host material. The boron-containing organic compound can also be used as an emitter. Examples of units of the general formulas (2) to (7) are the following structures. These structures can be substituted at all possible substitution positions.

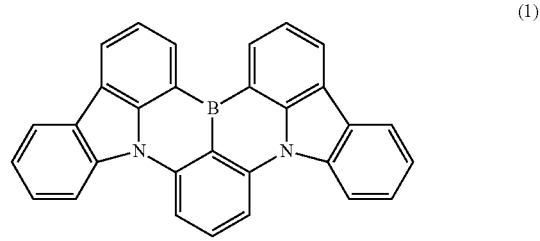

(1)

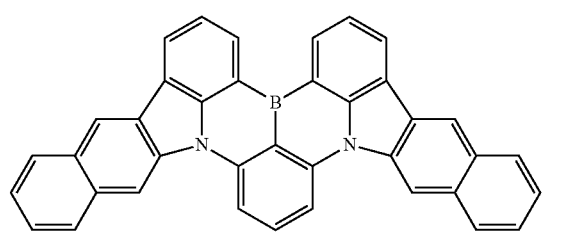

(2)

(3)

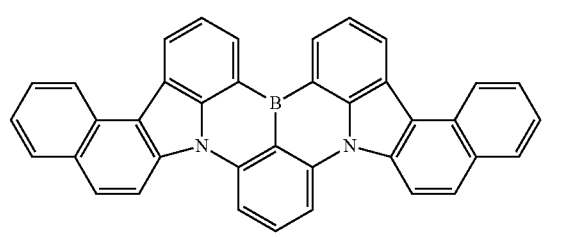

(4)

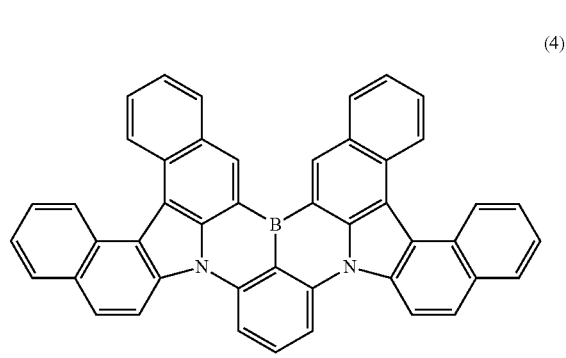

(5)

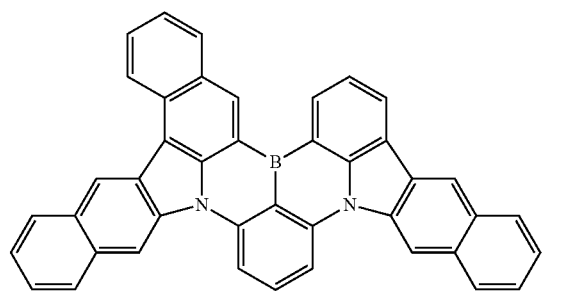

(6)
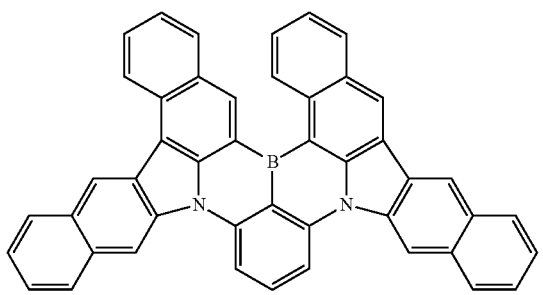
(7)
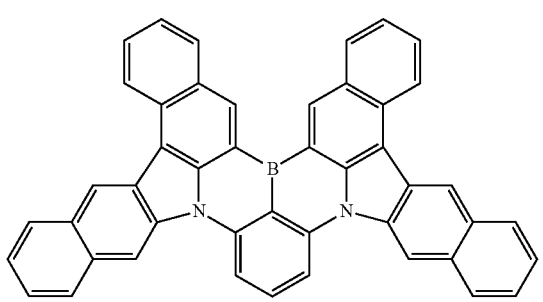
(8)
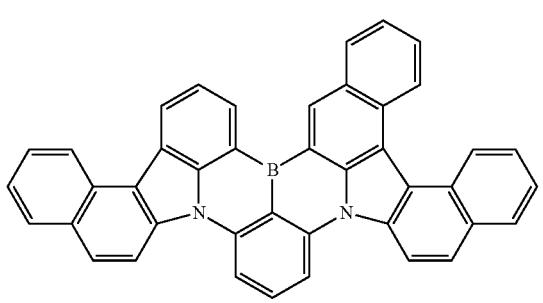
(9)
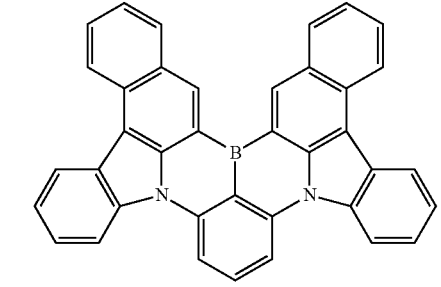
(10)
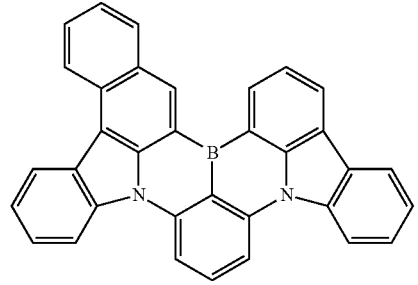
(11)
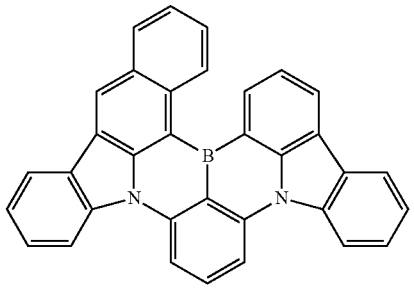
(12)
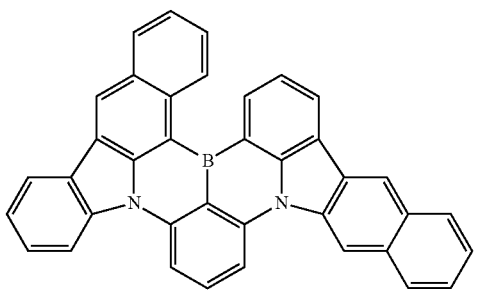
(13)
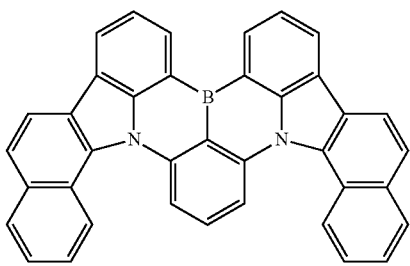
(14)
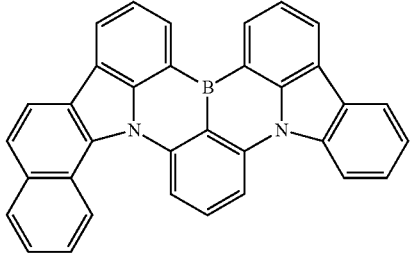
(15)
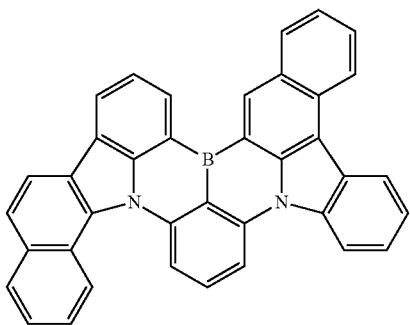

-continued
(16)
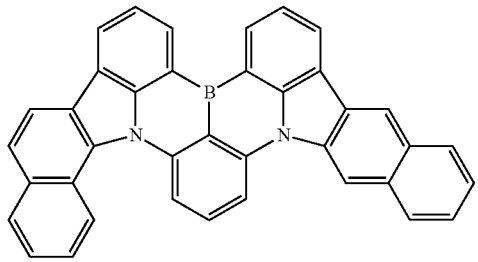
(17)
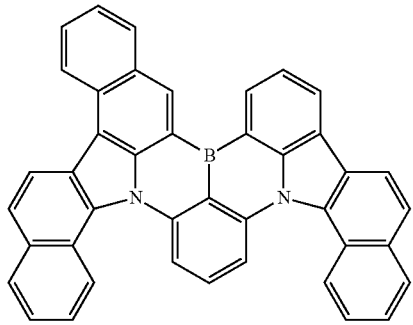
(18)
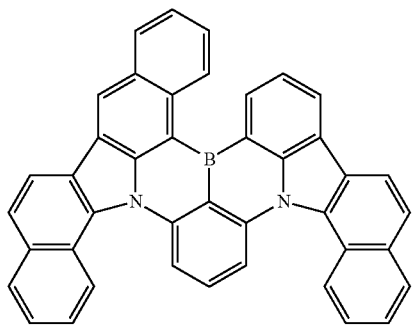
(19)
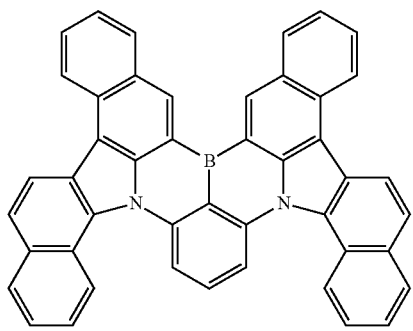
(20)
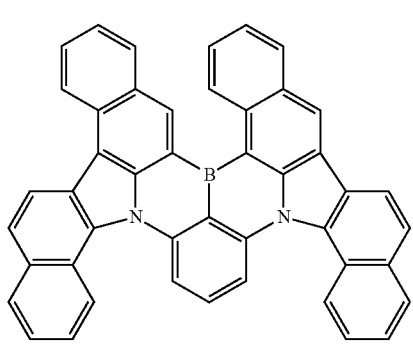
-continued
(21)
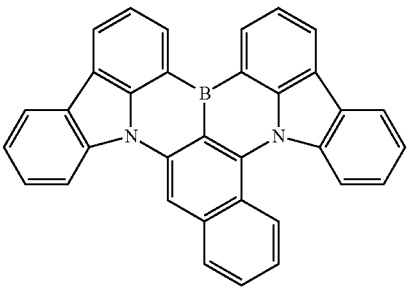
(22)
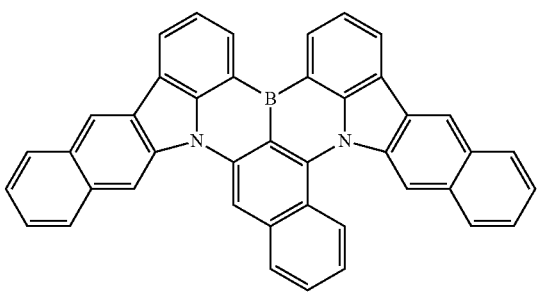
(23)
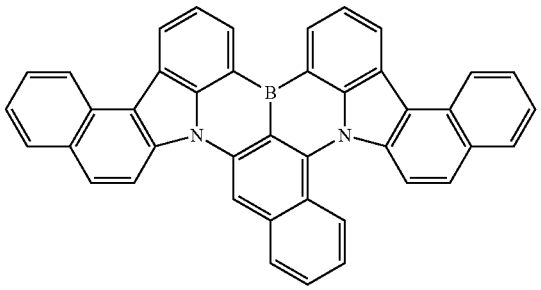
(24)
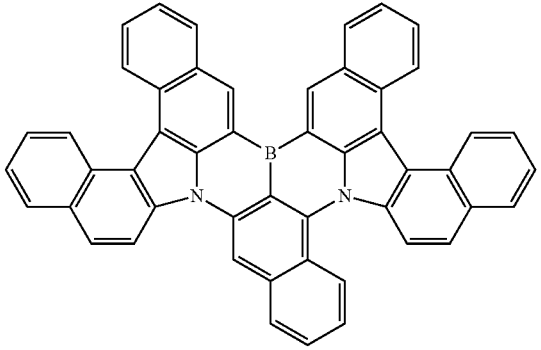
(25)
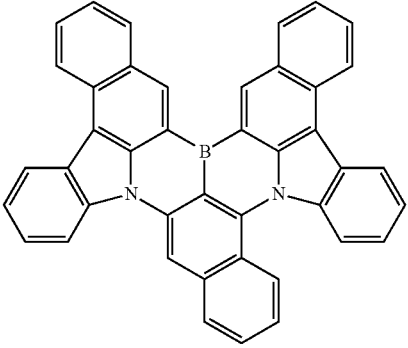

(26)
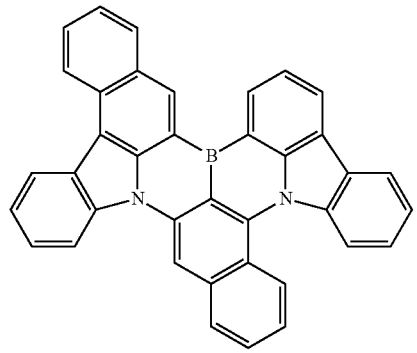
(27)
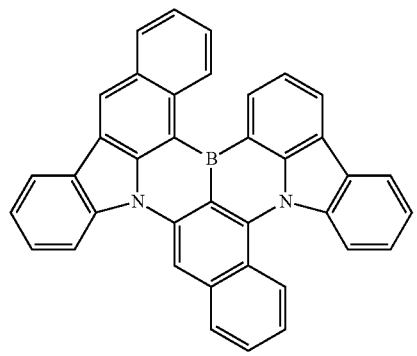
(28)
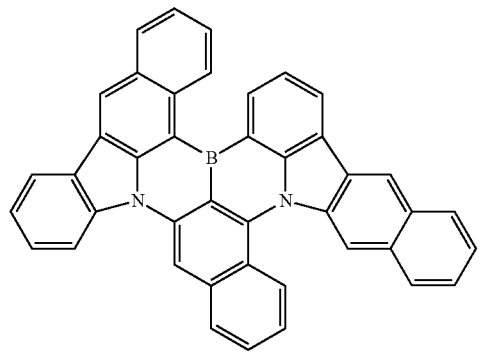
(29)
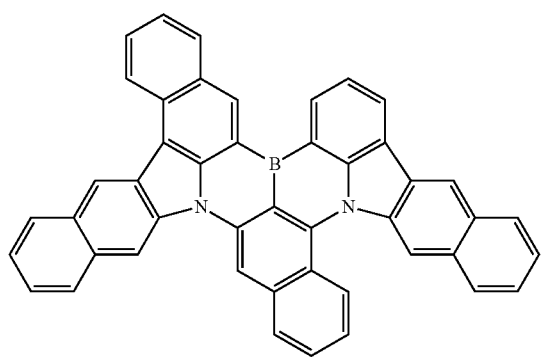
(30)
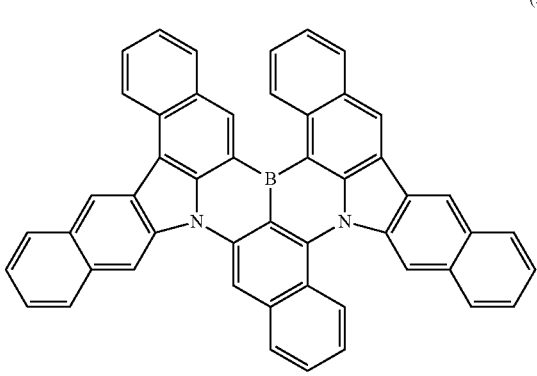
(31)
(32)
(33)
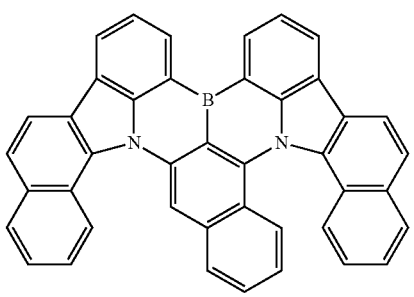

(34)
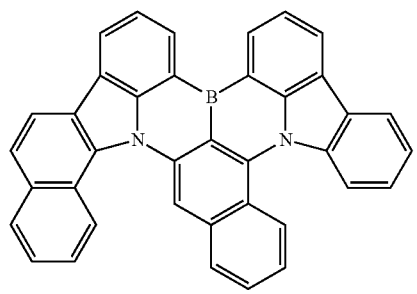
(35)
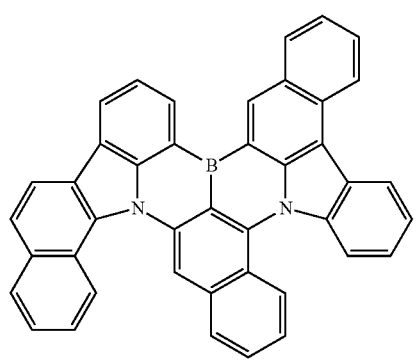
(36)
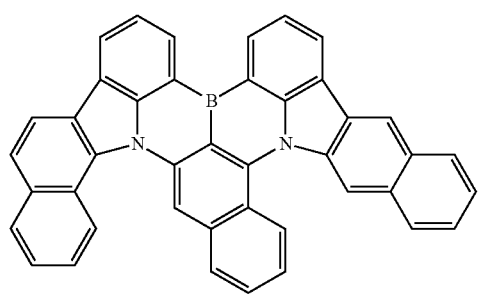
(37)
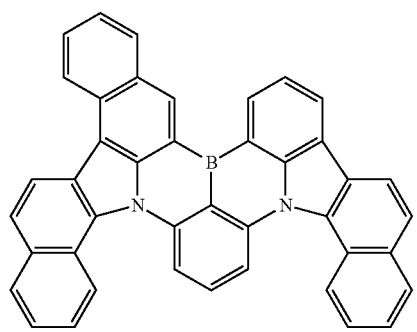
(38)
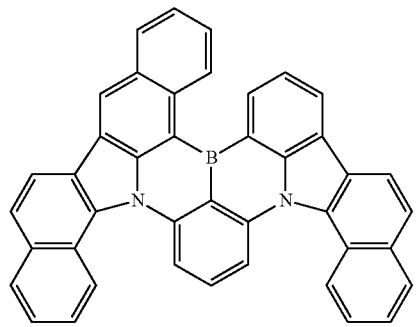
(39)
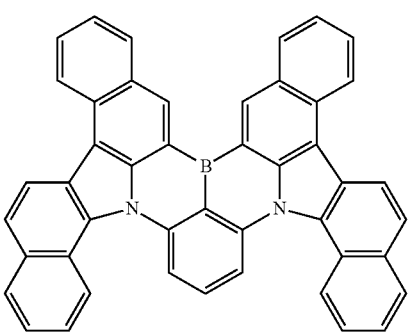
(40)
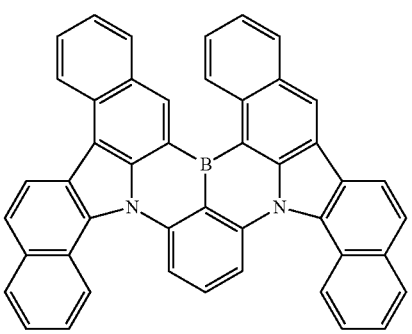
(41)
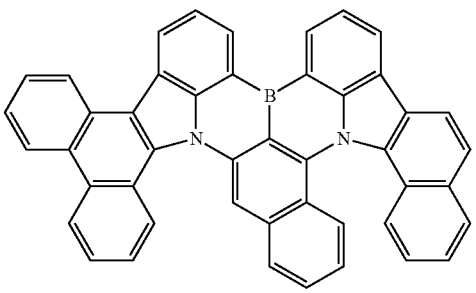
(42)
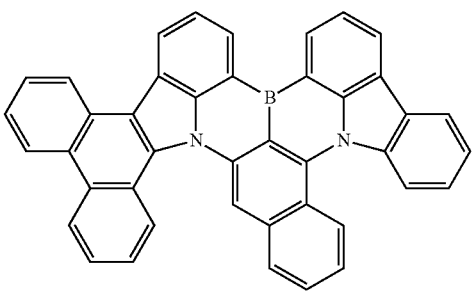
(43)
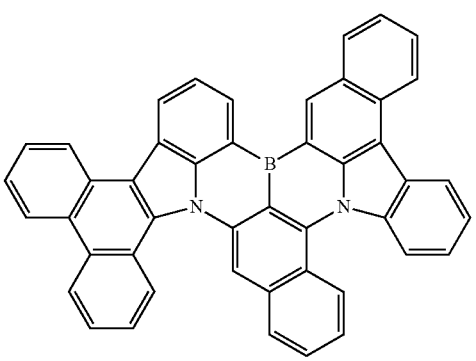

(44)
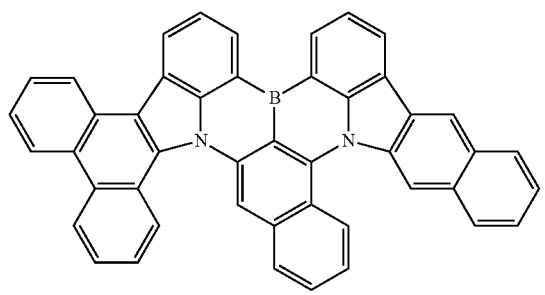
(45)
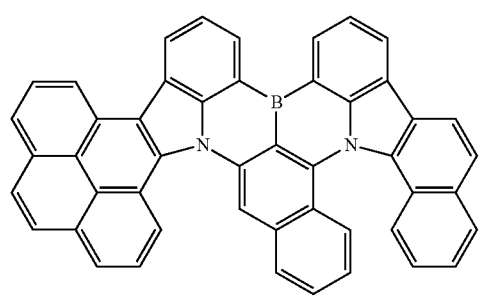
(46)
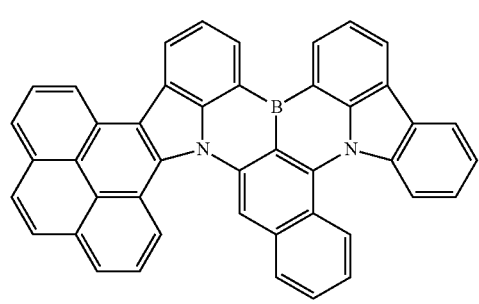
(47)
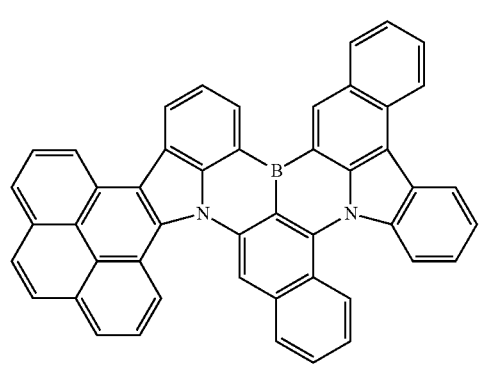
(48)
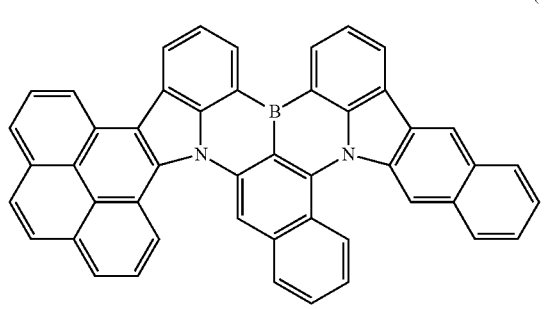
(49)
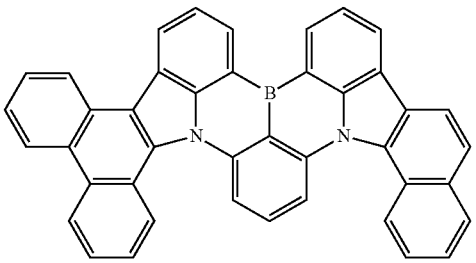
(50)
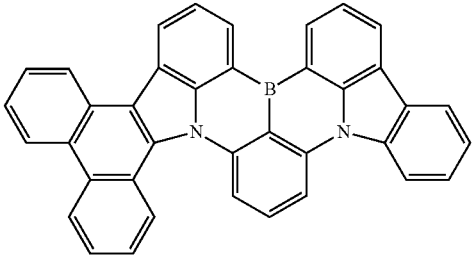
(51)
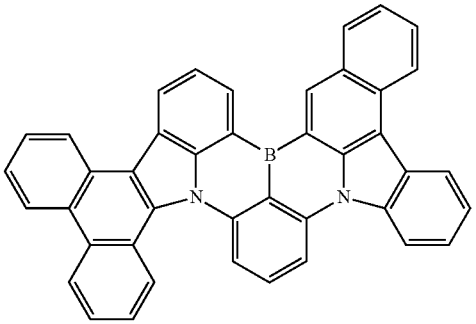
(52)
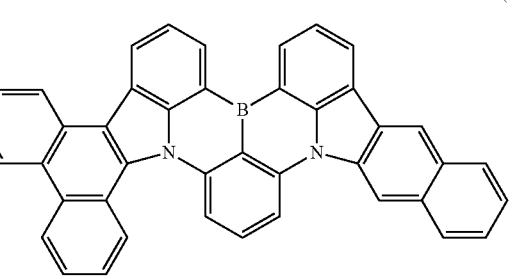
(53)
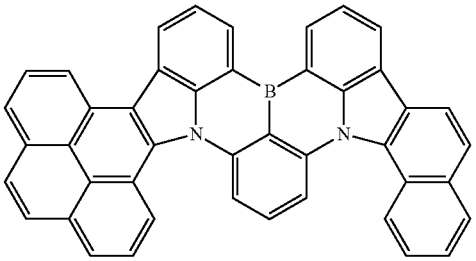

(54)
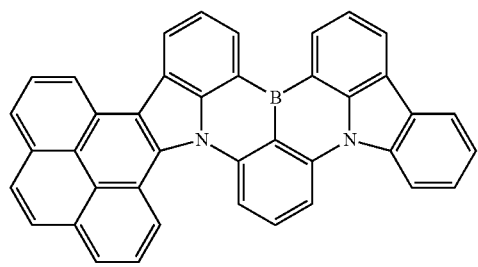
(55)
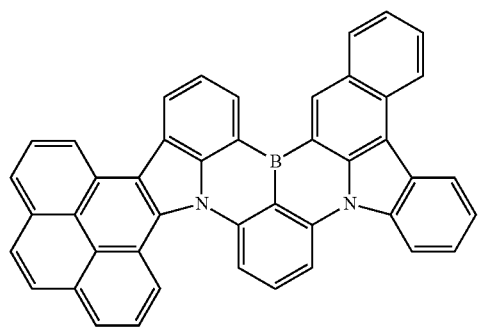
(56)
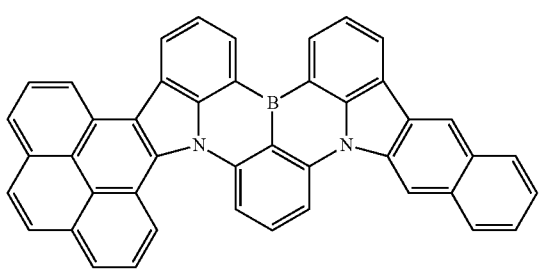
(57)
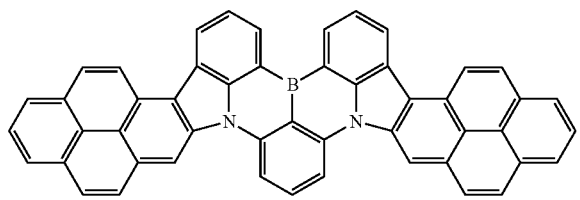
(58)
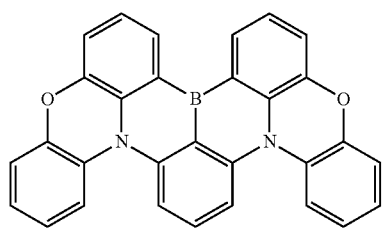
(59)
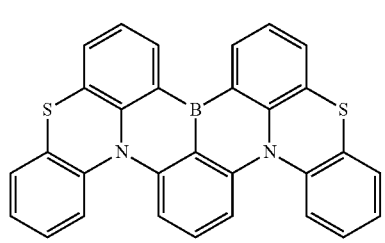
(60)
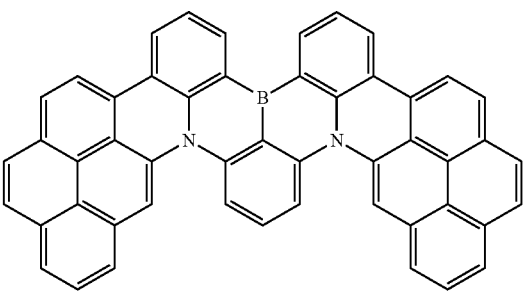
(61)
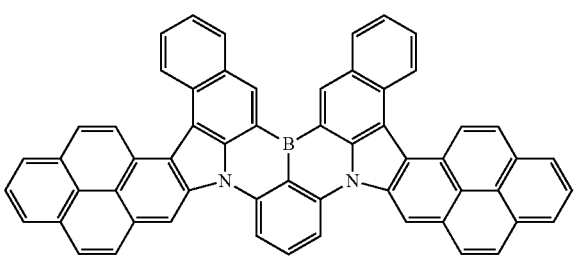
(62)
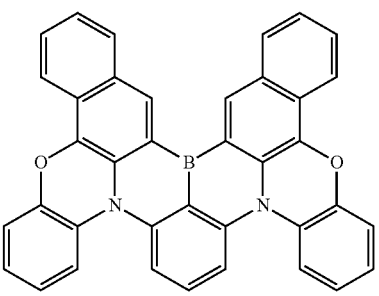
(63)
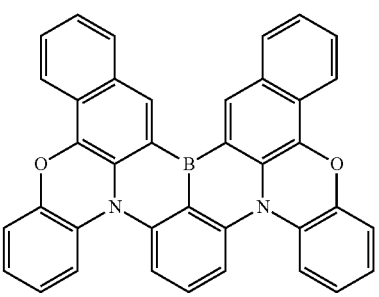
(64)
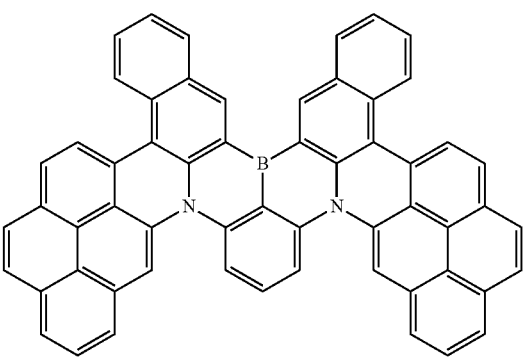

-continued
(65)
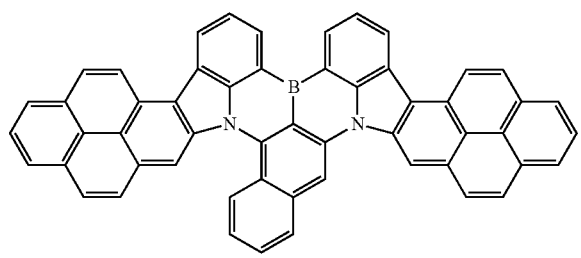
(66)
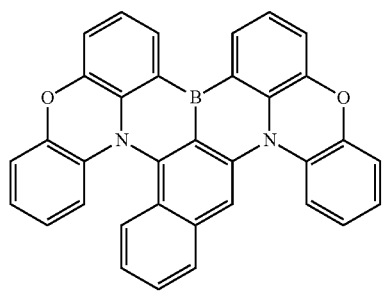
(67)
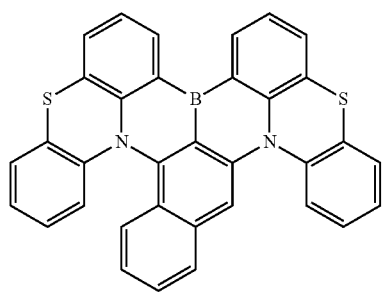
(68)
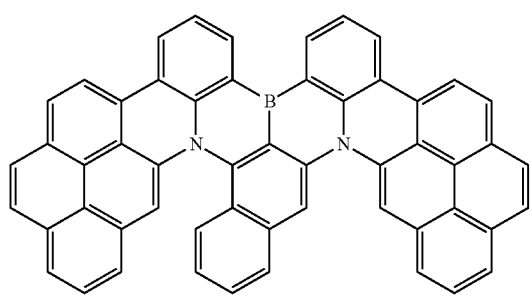
(69)
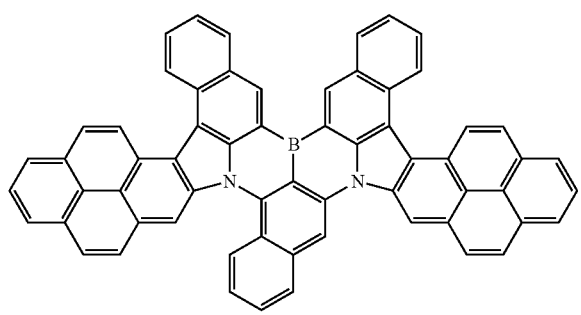
-continued
(70)
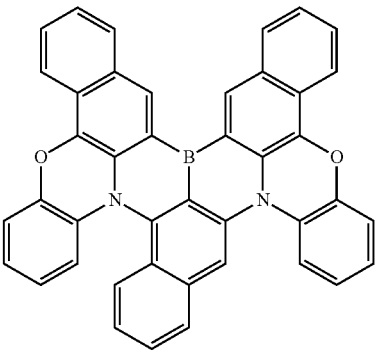
(71)
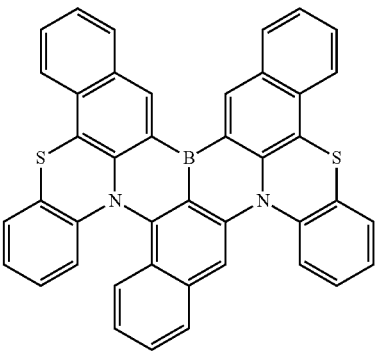
(72)
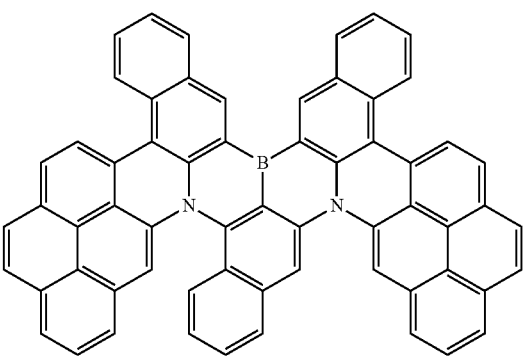
(73)
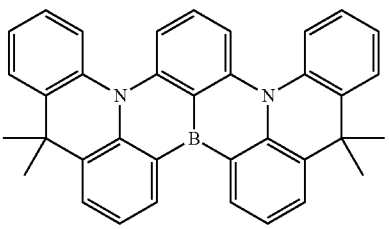
(74)
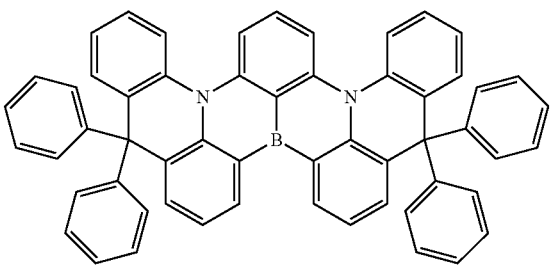

(75)
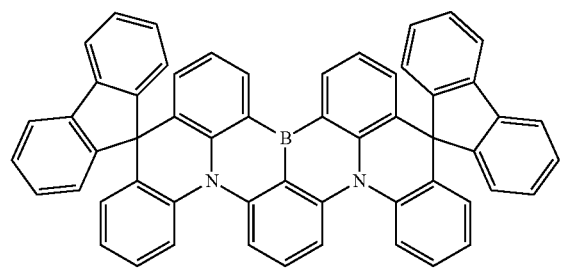
(76)
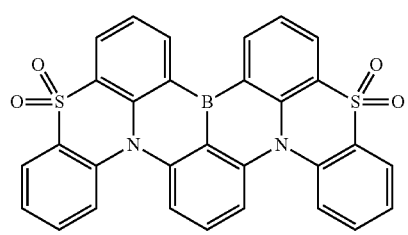
(77)
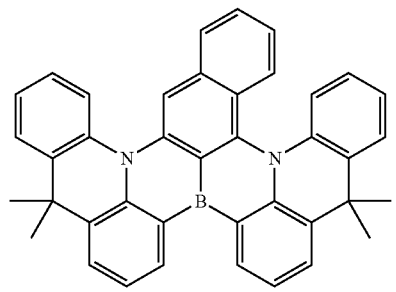
(78)
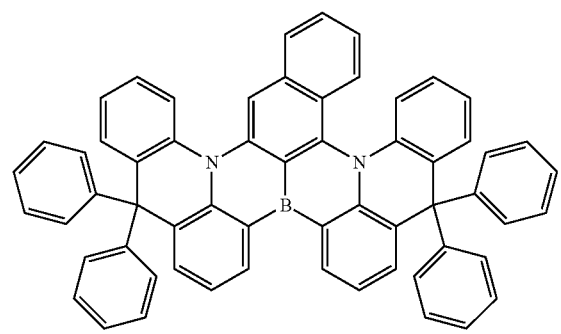
(79)
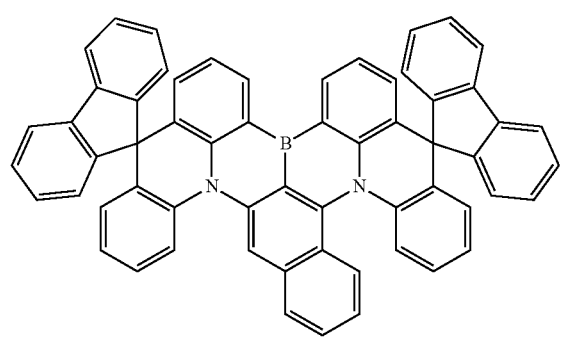
(80)
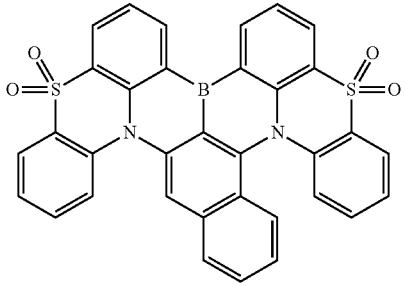
(81)
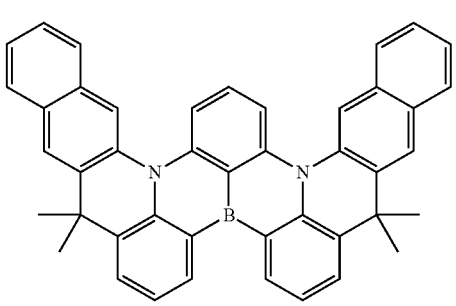
(82)
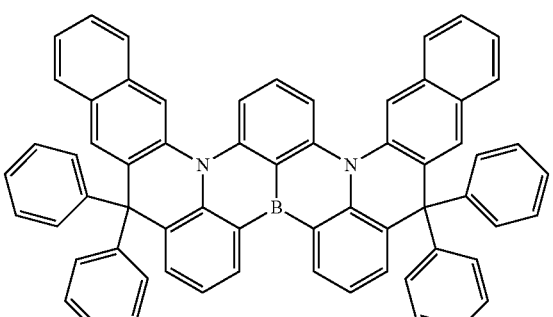
(83)
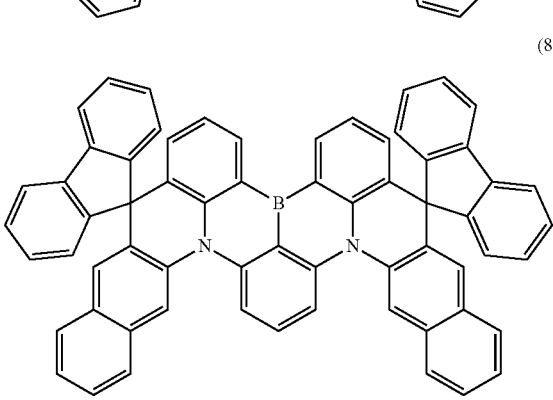
(84)
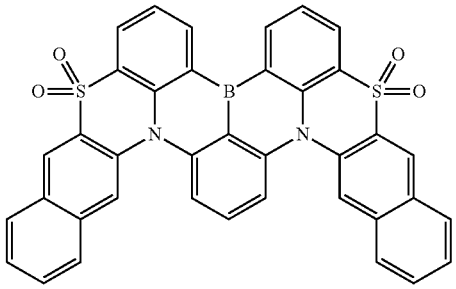

(85)
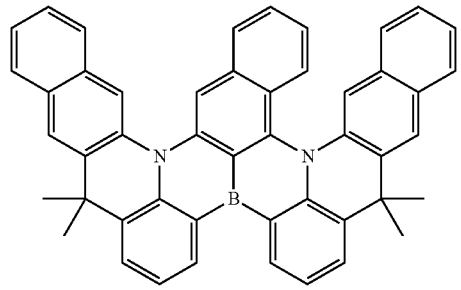
(90)
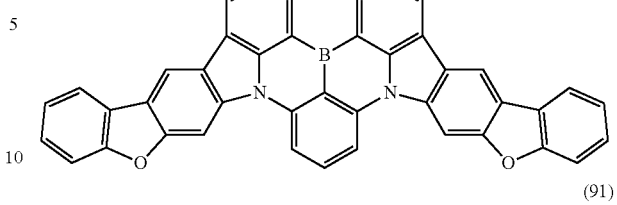
(86)
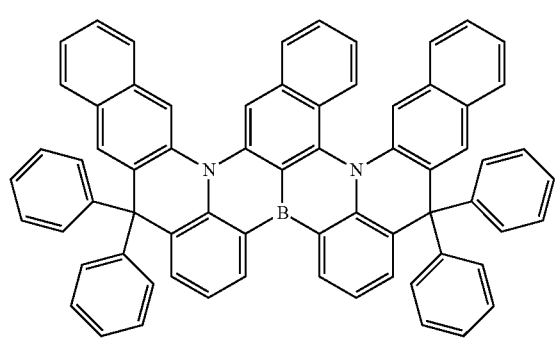
(91)
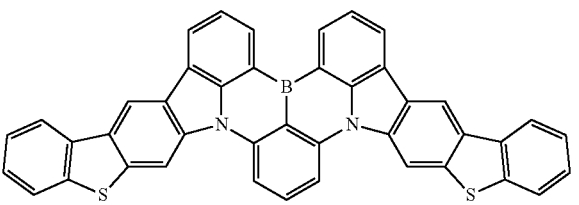
(92)
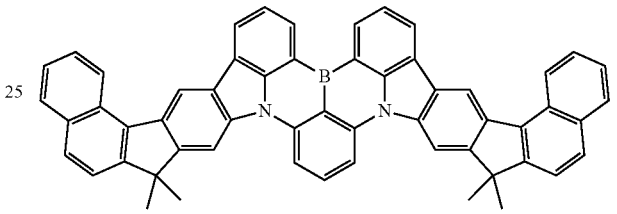
(87)
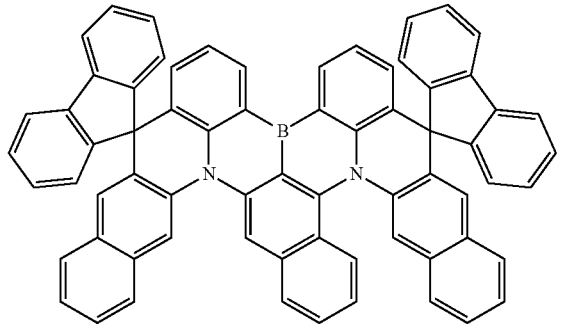
(93)
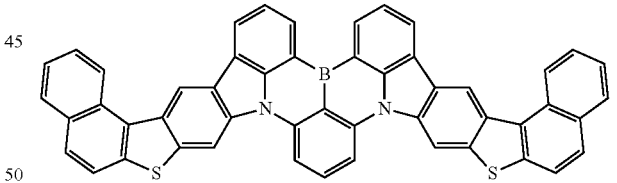
(88)
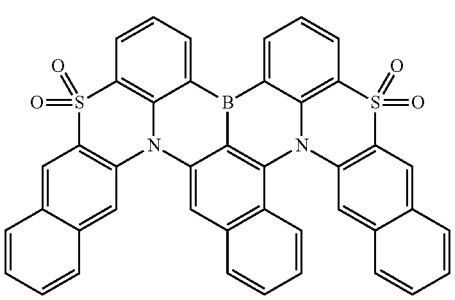
(94)
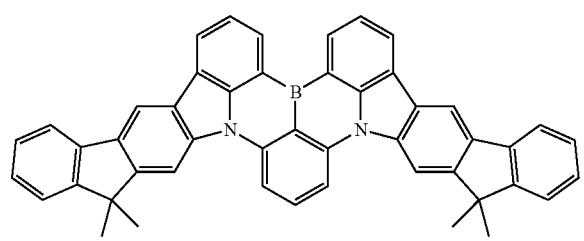
(89)
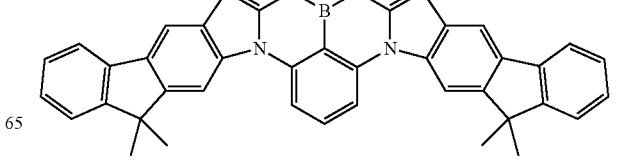
(95)

(96)
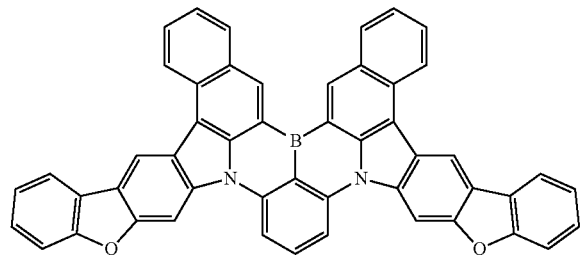
(97)
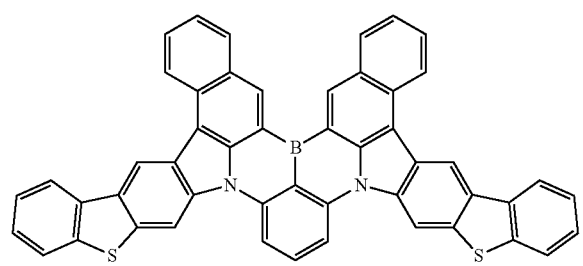
(98)
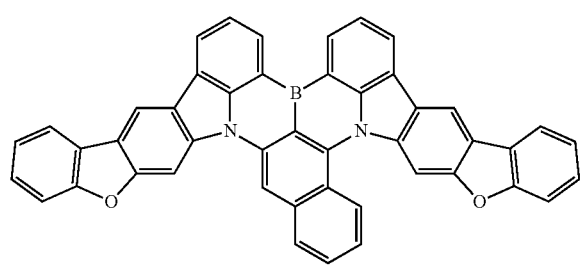
(99)
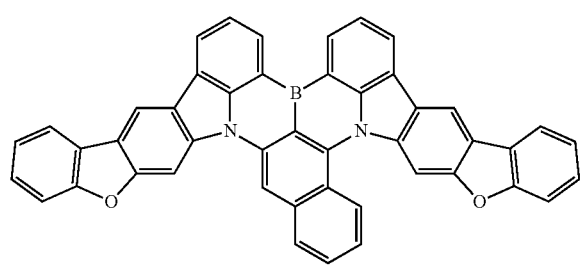
(100)
(101)
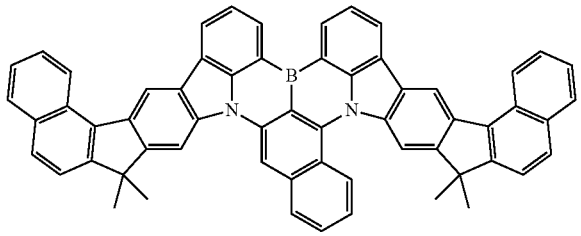
(102)
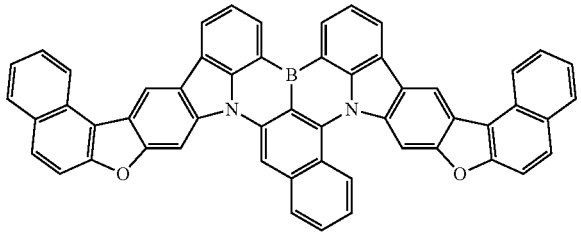
(103)
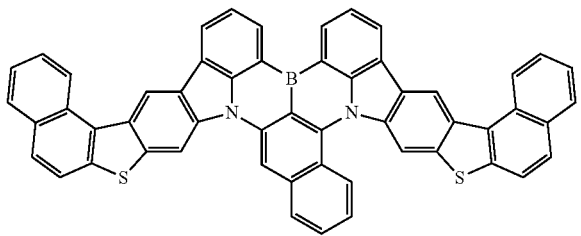
(104)
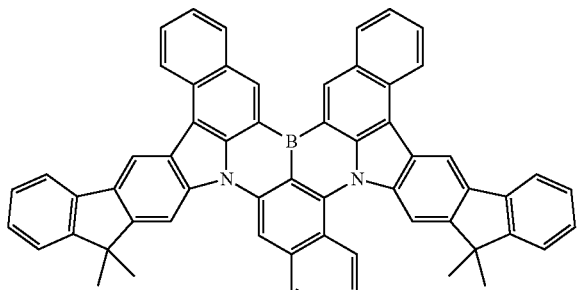
(105)
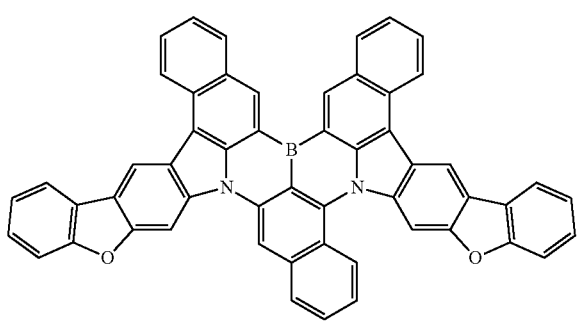

(106)
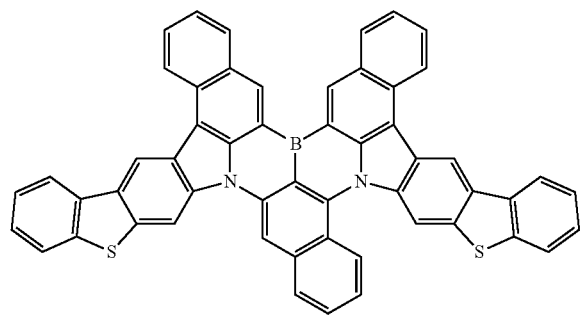
(107)
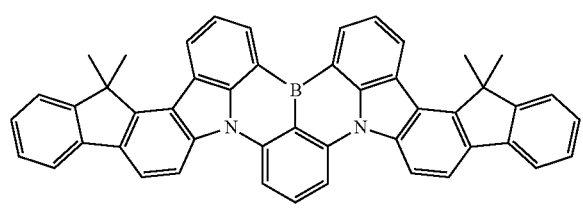
(108)
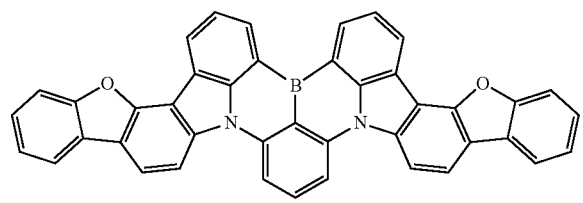
(109)
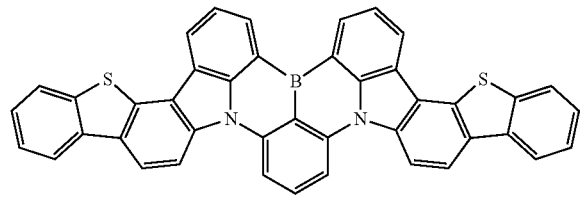
(110)
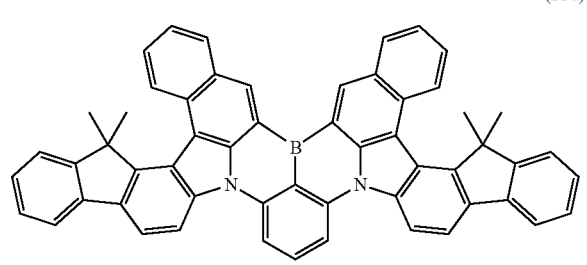
(111)
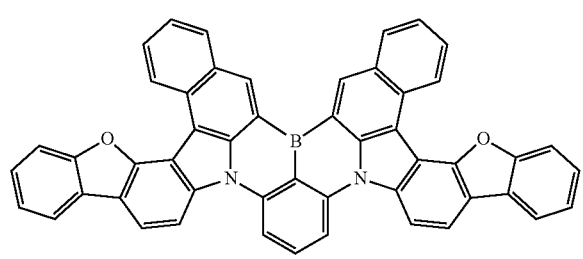
(112)
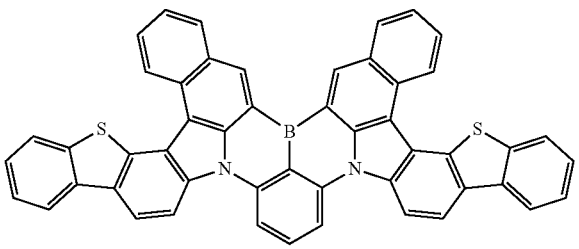
(113)
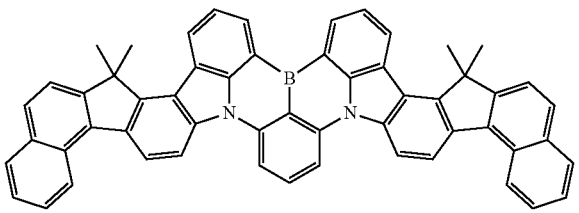
(114)
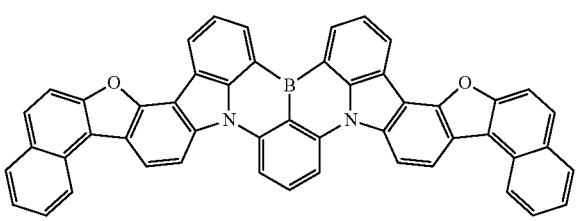
(115)
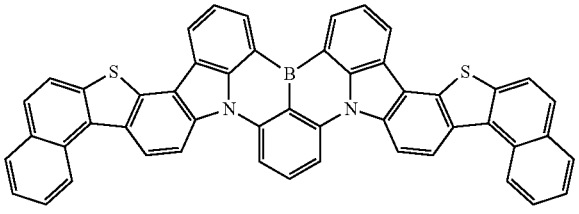
(116)
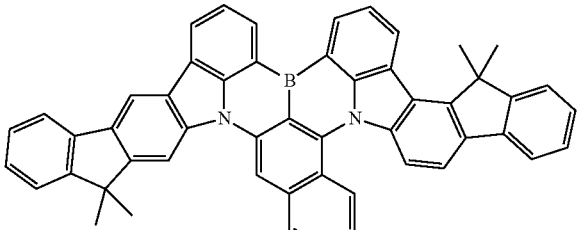
(117)
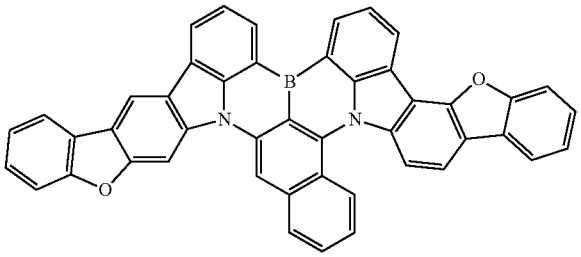

(118)
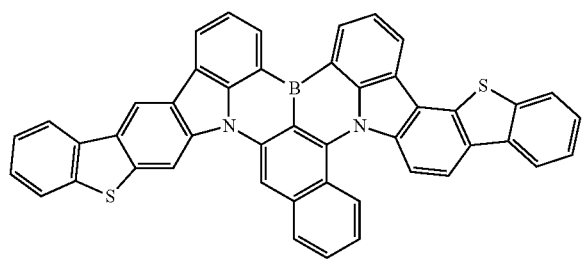
(119)
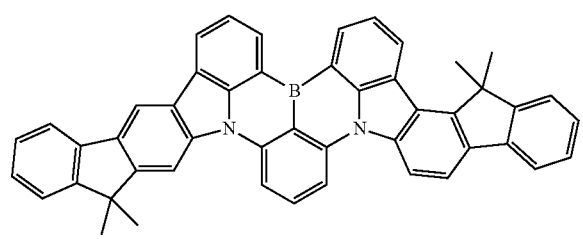
(120)
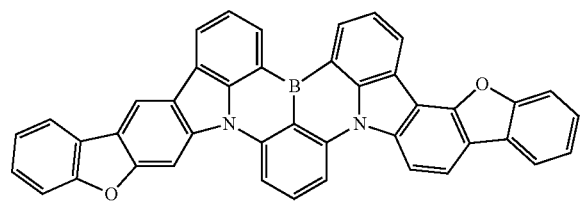
(121)
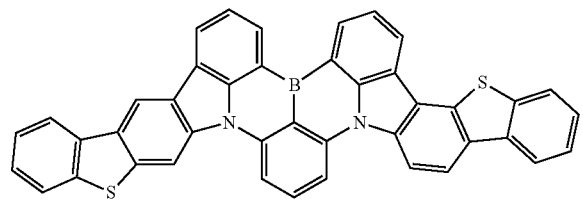
(122)
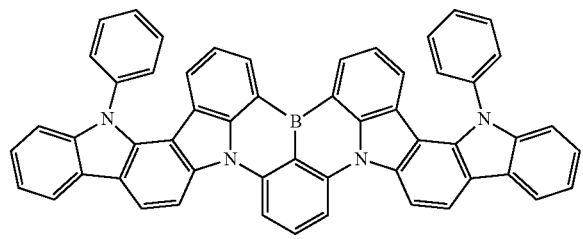
(123)
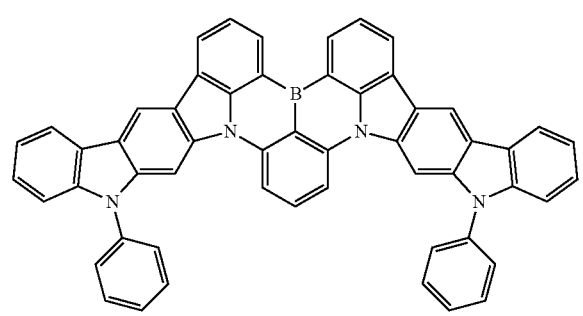
(124)
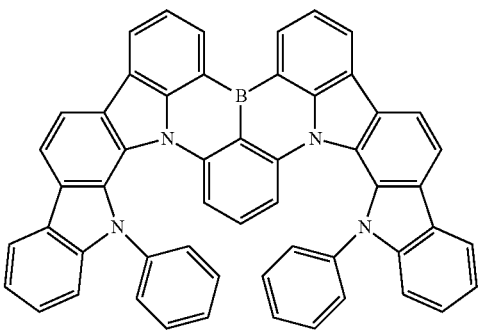
(125)
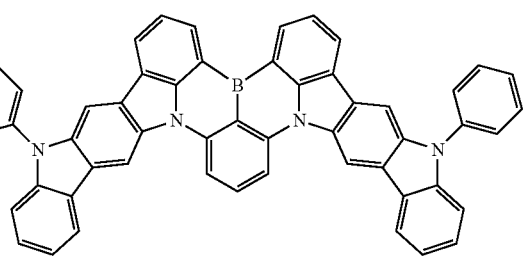
(126)
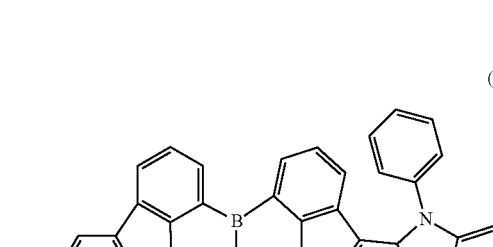
(127)
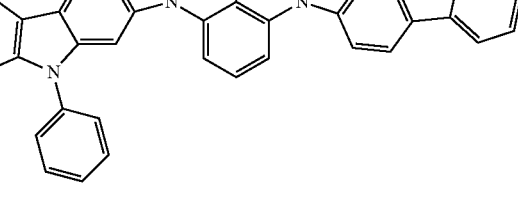

(128)
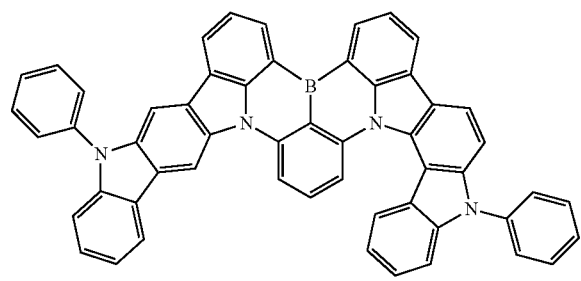
(129)
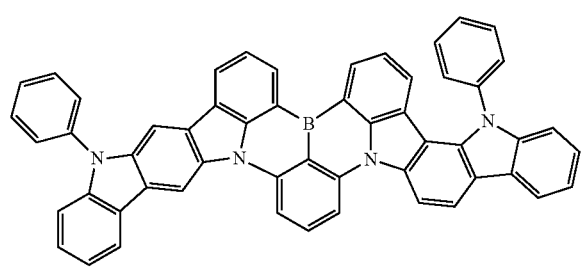
(130)
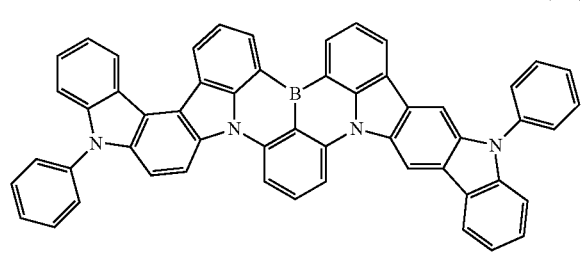
(131)
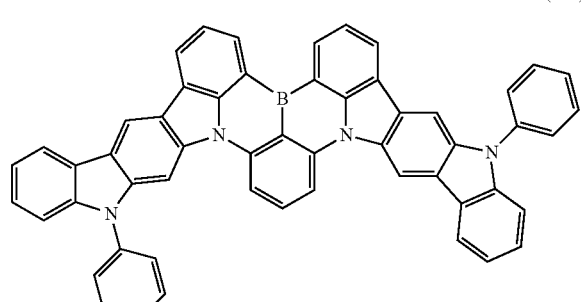
(132)
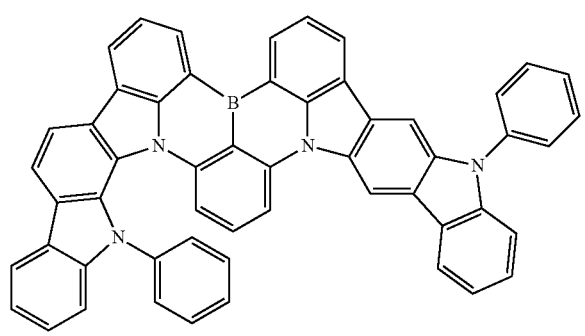
(133)
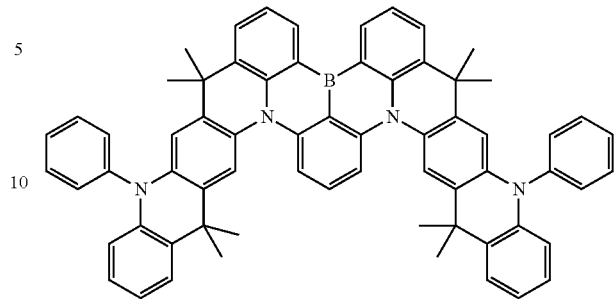
(134)
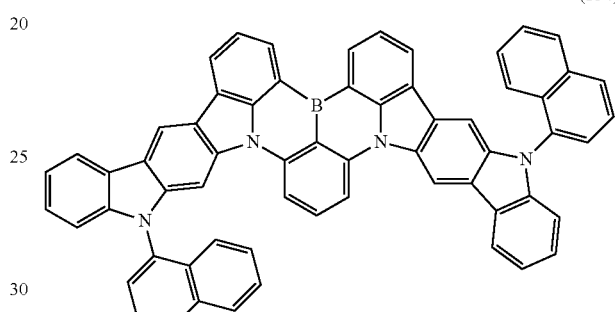
(135)
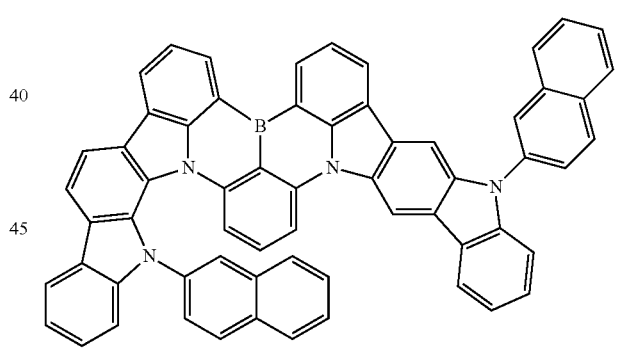
(136)
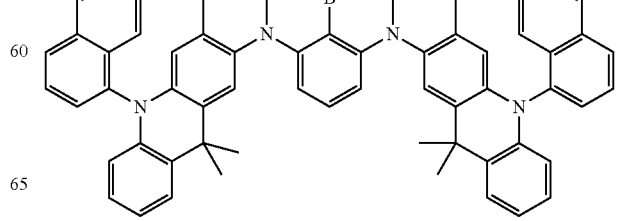

(137)
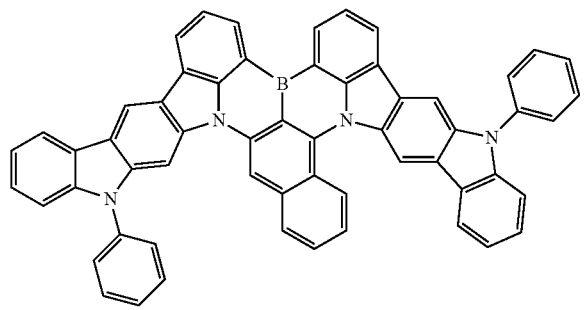
(142)
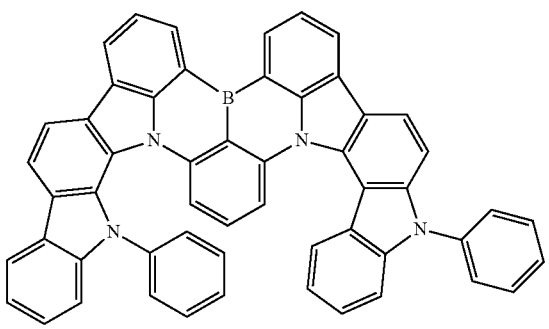
(138)
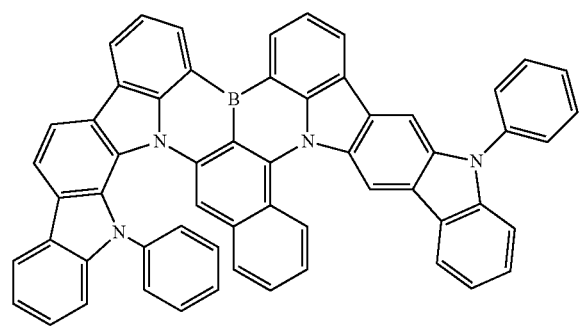
(143)
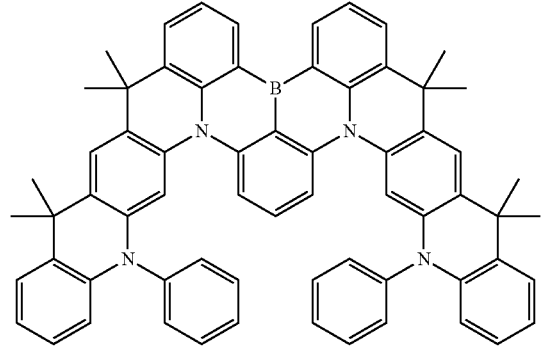
(139)
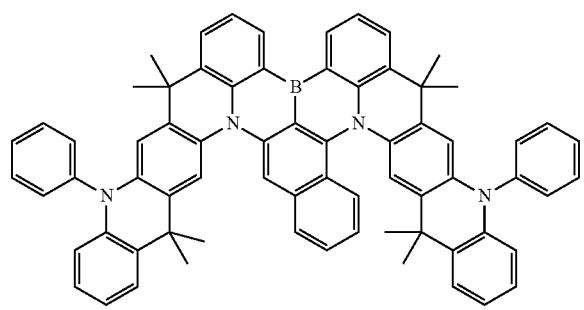
(144)
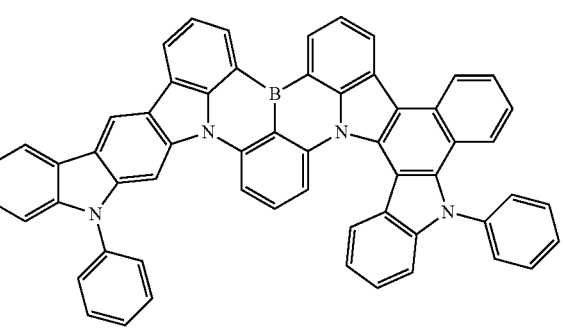
(141)
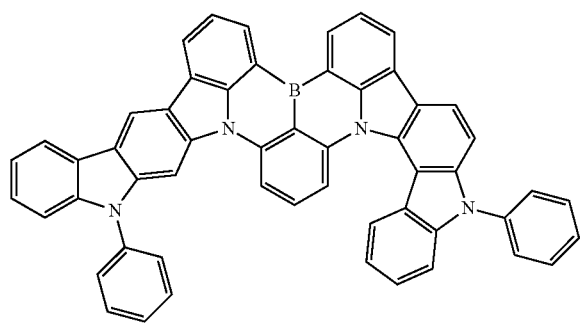
(145)
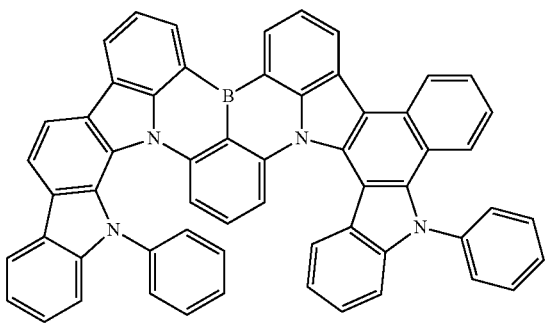

(146)

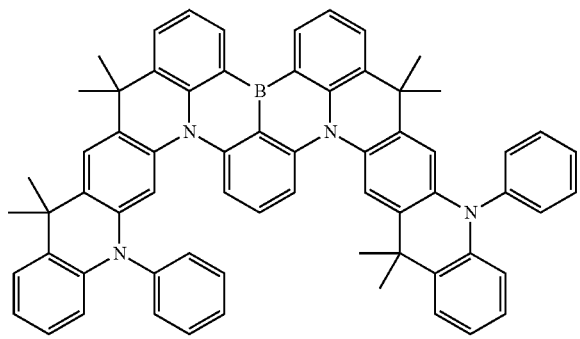

In one embodiment, the boron-containing organic compound is a small molecule material. Therefore, the boron-containing organic compound can be used for an evaporated OLED. In one embodiment, the boron-containing organic compound has a molecular weight less than or equal to 1000 g/mol. In addition, the boron-containing organic compound has a molecular weight less than or equal to 900 g/mol. Moreover, the boron-containing organic compound has a molecular weight less than or equal to 850 g/mol. Furthermore, the boron-containing organic compound has a molecular weight less than or equal to 800 g/mol. Still furthermore, the boron-containing organic compound has a molecular weight less than or equal to 700 g/mol.

It should be noted that, the term "small molecule" as defined herein refers to a molecule that is not a polymer, oligomer, dendrimer, or blend. In particular, there is no repeating structure in the small molecule. The small molecule has a molecular weight less than or equal to 3000 g/mol. In one embodiment, the molecular weight is less than or equal to 2000 g/mol. In another embodiment, the molecular weight is less than or equal to 1500 g/mol.

The polymer includes a homopolymer, a copolymer, and a block copolymer. In addition, in the present disclosure, the polymer also includes a dendrimer. Regarding the synthesis and application of the dendrimer, see [Dendrimers and Dendrons, Wiley-VCH Verlag GmbH & Co. KGaA, 2002, Ed. George R. Newkome, Charles N. Moorefield, Fritz Vogtle.].

The conjugated polymer is a polymer whose backbone is mainly composed of $sp^2$ hybrid orbital of carbon (C) atoms. Famous examples are: polyacetylene and poly(phenylene vinylene). The C atom on the backbone thereof can also be substituted by other non-C atoms, and it is still considered to be a conjugated polymer when the $sp^2$ hybridization on the backbone is interrupted by some natural defects. In addition, in the present disclosure, the conjugated polymer further includes aryl amine, aryl phosphine and other heteroarmotics, organometallic complexes, and the like.

In one embodiment, the boron-containing organic compound has a molecular weight greater than or equal to 700 g/mol. Therefore, the boron-containing organic compound can be used for a printed OLED. In addition, the boron-containing organic compound has a molecular weight greater than or equal to 800 g/mol. Moreover, the boron-containing organic compound has a molecular weight greater than or equal to 900 g/mol. Furthermore, the boron-containing organic compound has a molecular weight greater than or equal to 1000 g/mol. Still furthermore, the boron-containing organic compound has a molecular weight greater than or equal to 1100 g/mol.

In one embodiment, the boron-containing organic compound has a solubility in toluene greater than or equal to 10 mg/ml at 25° C. In addition, the boron-containing organic compound has a solubility in toluene greater than or equal to 15 mg/ml at 25° C. Moreover, the boron-containing organic compound has a solubility in toluene greater than or equal to 20 mg/ml at 25° C.

The aforementioned boron-containing organic compounds can be used in organic functional materials. The aforementioned boron-containing organic compounds can also be used in inks. The aforementioned boron-containing organic compounds can also be used in organic electronic devices.

A polymer according to one embodiment has at least one repeating unit including the aforementioned boron-containing organic compound. The polymer can be a conjugated polymer or a non-conjugated polymer. When the polymer is a non-conjugated polymer, the aforementioned boron-containing organic compound is on the side chain of the polymer.

The aforementioned polymers can be used in organic functional materials. The aforementioned polymers can also be used in inks. The aforementioned polymers can also be used in organic electronic devices.

An organic mixture according to one embodiment includes at least one organic functional material and the aforementioned boron-containing organic compound. In one embodiment, the organic functional material is selected from the group consisting of a hole injection material, a hole transport material, a hole blocking material, an electron injection material, an electron transport material, an electron blocking material, an organic host material, and a light-emitting material. Various organic functional materials are described in detail in, for example, WO2010135519A1, US20090134784A1, and WO 2011110277A1, the entire contents of which are hereby incorporated by reference. The organic functional material may be a small molecule and a polymer material.

In one embodiment, the light-emitting material is selected from the group consisting of a fluorescent emitter, a phosphorescent emitter, an organic thermally activated delayed fluorescent material, and a light-emitting quantum dot material.

In one embodiment, the organic functional material is selected from a phosphorescent emitter, and the boron-containing organic compound is used as a host material. The weight percentage of the organic functional material is greater than 0 and less than or equal to 30%. In addition, the weight percentage of the organic functional material is greater than 0 and less than or equal to 25%. Moreover, the weight percentage of the organic functional material is greater than 0 and less than or equal to 20%.

In one embodiment, the organic functional material is selected from an organic host material. The boron-containing organic compound is used as the light-emitting material. The weight percentage of the boron-containing organic compound is greater than 0 and less than or equal to 30%. In addition, the weight percentage of the boron-containing organic compound is greater than 0 and less than or equal to 25%. Moreover, the weight percentage of the boron-containing organic compound is greater than 0 and less than or equal to 20%. Furthermore, the weight percentage of the boron-containing organic compound is greater than 0 and less than or equal to 15%.

In one embodiment, the organic functional material is selected from a phosphorescent emitter and an organic host material, and the boron-containing organic compound is an auxiliary light-emitting material or an auxiliary host material. A weight ratio of the boron-containing organic compound to the phosphorescent emitter ranges from (1:2) to (2:1). In addition, the first triplet excited state of the boron-containing organic compound may be higher than the first triplet excited state of the phosphorescent emitter.

In one embodiment, the organic functional material is selected from the TADF material.

The singlet emitter, the triplet emitter, and the TADF material are described in further detail below (but are not limited thereto).

1. Triplet Emitter

Examples of a triplet host material are not particularly limited, and any metal complex or organic compound may be used as the host material as long as its triplet energy is higher than that of the emitter, particularly the triplet emitter or the phosphorescent emitter. Examples of metal complexes that can be used as triplet hosts include, but are not limited to, the general structure as follows:

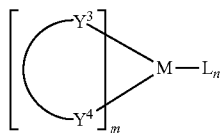

M is a metal; ($Y^3$-$Y^4$) is a bidentate ligand, $Y^3$ and $Y^4$ are independently selected from the group consisting of C, N, O, P, and S; L is an auxiliary ligand; m is an integer ranging from 1 to the maximum coordination number of the metal; and m+n is the maximum number of coordination of the metal.

In one embodiment, the metal complex that can be used as the triplet host has the following formula:

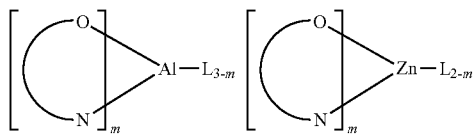

wherein, (O—N) is a bidentate ligand; the metal is coordinated to O and N atoms.

In one embodiment, M may be selected from Ir or Pt.

Examples of the organic compound which can be used as the triplet host are selected from the group consisting of compounds containing cyclic aryl, such as benzene, biphenyl, triphenyl, benzo, and fluorene; compounds containing heterocyclic aryl, such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, oxazole, bibenzoxazole, benzisoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furopyridine, benzothienopyridine, thienopyridine, benzoselenophenopyridine, and selenophenobenzodipyridine; and groups containing 2 to 10 ring structures. The groups may be the same or different types of cyclic aryl or heterocyclic aryl and are linked to each other directly or by at least one of the following groups, such as oxygen atom, nitrogen atom, sulfur atom, silicon atom, phosphorus atom, boron atom, chain structural unit, and aliphatic ring group. Each of Ar may be further substituted, and the substituents may be selected from the group consisting of hydrogen, alkyl, alkoxy, amino, alkenyl, alkynyl, aralkyl, heteroalkyl, aryl, and heteroaryl.

In one embodiment, the triplet host material can be selected from compounds containing at least one of the following groups:

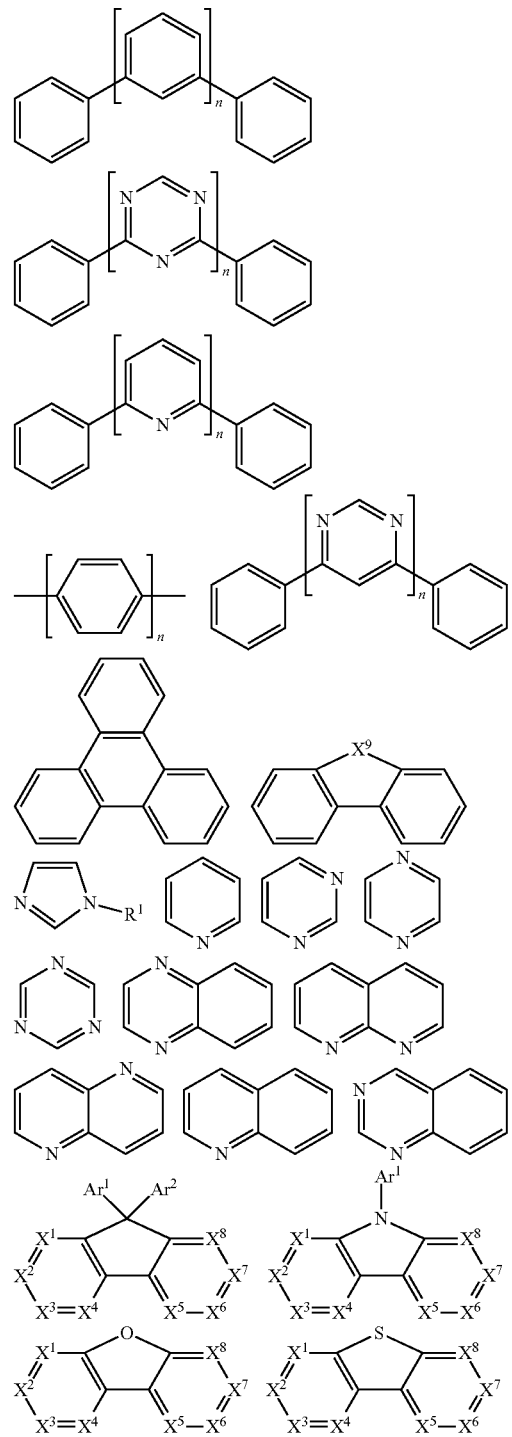

-continued

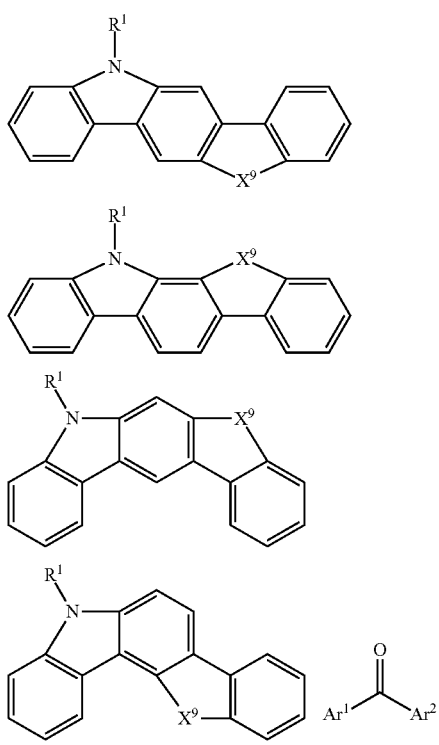

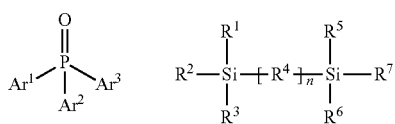

where $R^1$ to $R^7$ are independently selected from the group consisting of hydrogen, alkyl, alkoxy, amino, alkenyl, alkynyl, aralkyl, heteroalkyl, aryl, and heteroaryl, which have the same meaning as the aforementioned $Ar^1$ and $Ar^2$ when $R^1$ to $R^7$ are selected from aryl or heteroaryl. n is selected from an integer from 0 to 20. $X^1$ to $X^8$ are independently selected from CH or N; and $X^9$ is selected from $CR^1R^2$ or $NR^1$.

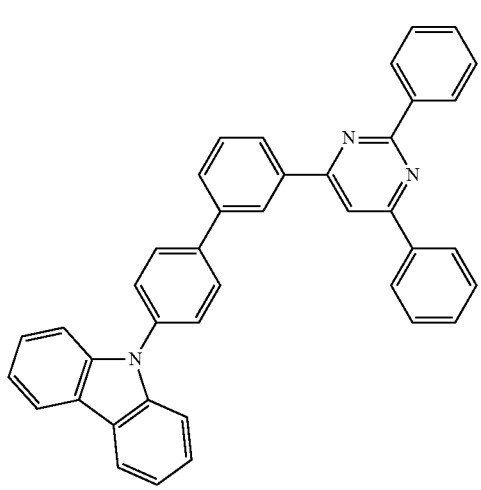

-continued

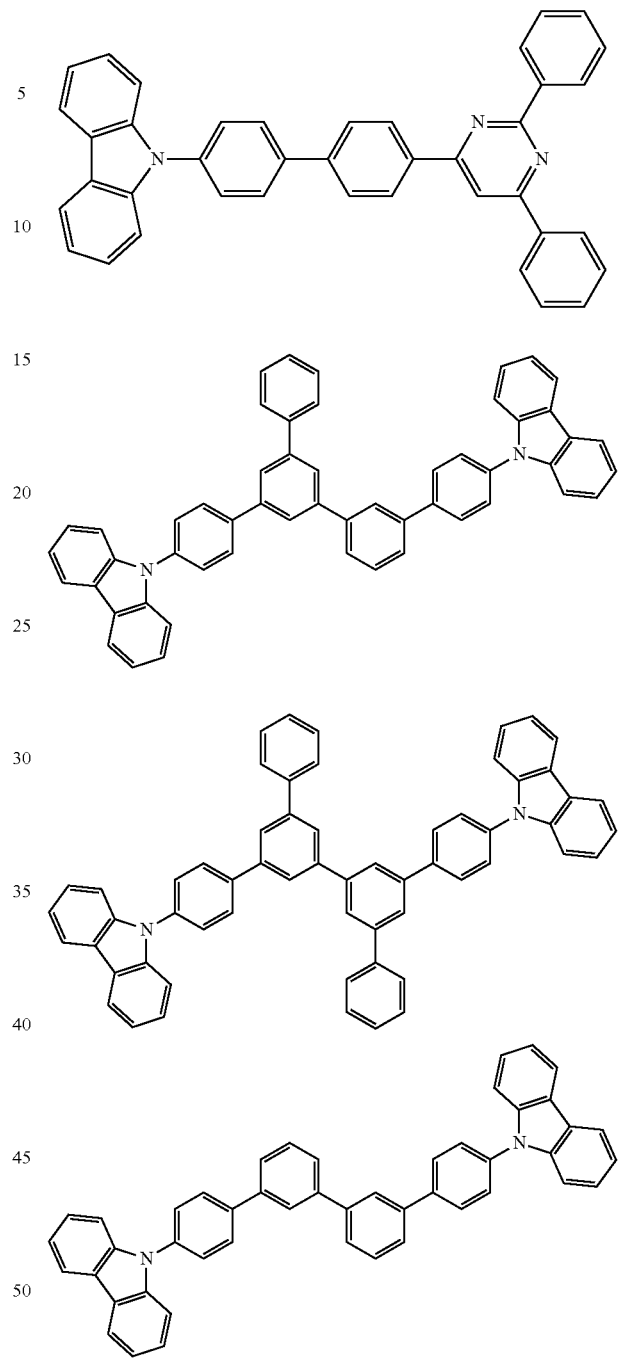

2. Phosphorescent Material

The phosphorescent material is also called the triplet emitter. The triplet emitter is a metal complex having a general formula $M(L)_n$. M is a metal atom. L is an organic ligand, which may be the same or different at each occurrence, and is bonded or coordinated to the metal atom M at one or more positions. n is an integer greater than 1. In one embodiment, n is selected from 1, 2, 3, 4, 5 or 6. In one embodiment, these metal complexes are coupled to the polymer at one or more positions. Particularly, these metal complexes are attached to the polymer, especially by an organic ligand.

In one embodiment, the metal atom M is selected from the group consisting of a transition metal element, a lanthanide element, and an actinide element. In addition, the metal atom M is selected from the group consisting of Ir, Pt, Pd, Au, Rh, Ru, Os, Sm, Eu, Gd, Tb, Dy, Re, Cu, and Ag. Moreover, the metal atom M is selected from the group consisting of Os, Ir, Ru, Rh, Re, Pd, and Pt.

In one embodiment, the triplet emitter includes a chelating ligand, i.e., a ligand, and is coordinated to the metal by at least two bonding sites. Particularly, the triplet emitter includes two or three identical or different bidentate or multidentate ligands. The chelating ligand is beneficial for improving the stability of metal complexes.

The organic ligand may be selected from the group consisting of phenylpyridine derivative, 7, 8-benzoquinoline derivative, 2(2-thienyl) pyridine derivative, 2(1-naphthyl) pyridine derivative, and 2-phenylquinoline derivative. All of these organic ligands may be substituted, for example, by fluoromethyl or trifluoromethyl. The auxiliary ligand may be selected from acetylacetonate or picric acid.

In one embodiment, the metal complex used as the triplet emitter has a general formula as follows:

Where M is a metal selected from the group consisting of a transition metal element, a lanthanide element, and an actinide element.

$Ar_1$ is a cyclic group which may be the same or different at each occurrence, and $Ar_1$ contains at least one donor atom, that is, an atom having a lone pair of electrons, such as nitrogen or phosphorus, through which the cyclic group is coordinated to a metal. $Ar_2$ is a cyclic group which may be the same or different at each occurrence, and $Ar_2$ contains at least one C atom through which the cyclic group is bonded to the metal. $Ar_1$ and $Ar_2$ are covalently bonded together, and each of $Ar_1$ and $Ar_2$ can have one or more substituents, which may also be linked together by the substituents. L may be the same or different at each occurrence and is an auxiliary ligand. In one embodiment, L is a bidentate chelate ligand. In another embodiment, L is a monoanionic bidentate chelate ligand. m is selected from 1, 2 or 3. In one embodiment, m is 2 or 3. In another embodiment, m is 3. n is selected from 0, 1, or 2. In one embodiment, n is 0 or 1. In another embodiment, n is 0.

Examples of materials for some triplet emitters and applications thereof can be found in the following patent documents and literatures: WO 200070655, WO 200141512, WO 200202714, WO 200215645, EP 1191613, EP 1191612, EP 1191614, WO 2005033244, WO 2005019373, US 2005/0258742, WO 2009146770, WO 2010015307, WO 2010031485, WO 2010054731, WO 2010054728, WO 2010086089, WO 2010099852, WO 2010102709, US 20070087219 A1, US 20090061681 A1, US 20010053462 A1, Baldo, Thompson et al. Nature 403, (2000), 750-753, US 20090061681 A1, J. Kido et al. Appl. Phys. Lett. 65 (1994), 2124, Kido et al. Chem. Lett. 657, 1990, US 2007/0252517 A1, Johnson et al., JACS 105, 1983, 1795, Wrighton, JACS 96, 1974, 998, Ma et al., Synth. Metals 94, 1998, 245, U.S. Pat. Nos. 6,824,895, 7,029,766, 6,835,469, 6,830,828, US 20010053462 A1, WO 2007095118 A1, US 2012004407A1, WO 2012007088A1, WO2012007087A1, WO 2012007086A1, US 2008027220A1, WO 2011157339A1, CN 102282150A, and WO 2009118087A1. The entire contents of the above-listed patent documents and literatures are hereby incorporated by reference.

3. Thermally Activated Delayed Fluorescent Material (TADF):

Conventional organic fluorescent materials can only emit light by using 25% singlet excitons formed by electrical excitation, and the internal quantum efficiency of the device is low (up to 25%). The phosphorescent material enhances the intersystem crossing due to the strong spin-orbit coupling of the center of the heavy atom, the singlet excitons and triplet excitons formed by electrical excitation can be effectively utilized to emit light, so that the internal quantum efficiency of the device reaches 100%. However, the phosphorescent materials are expensive, the material stability is poor, and the device efficiency is severe roll-off, which limit their application in OLEDs. The thermally activated delayed fluorescent material is a third generation organic luminescent material developed after the organic fluorescent materials and the organic phosphorescent materials. Such materials generally have a small singlet-triplet energy level difference ($\Delta E_{st}$), the triplet excitons can be converted into the singlet excitons by reverse intersystem crossing to emit light. This can make full use of the singlet excitons and triplet excitons formed under electrical excitation, and the internal quantum efficiency of the device can reach 100%.

The TADF material needs to have a small singlet-triplet energy level difference, typically $\Delta Est<0.3$ eV. In one embodiment, $\Delta Est<0.2$ eV. In another embodiment, $\Delta Est<0.1$ eV. In yet another embodiment, $\Delta Est<0.05$ eV. In one embodiment, TADF has a better fluorescence quantum efficiency. Some TADF luminescent materials can be found in the following patent documents: CN103483332(A), TW201309696(A), TW201309778(A), TW201350558(A), US20120217869(A1), WO2013133359(A1), WO2013154064(A1), Adachi, et. al. Adv. Mater., 21, 2009, 4802, Adachi, et. al. Appl. Phys. Lett., 98, 2011, 083302, Adachi, et. al. Appl. Phys. Lett., 101, 2012, 093306, Adachi, et. al. Chem. Commun., 48, 2012, 11392, Adachi, et. al. Nature Photonics, 6, 2012, 253, Adachi, et. al. Nature, 492, 2012, 234, Adachi, et. al. J. Am. Chem. Soc, 134, 2012, 14706, Adachi, et. al. Angew. Chem. Int. Ed, 51, 2012, 11311, Adachi, et. al. Chem. Commun., 48, 2012, 9580, Adachi, et. al. Chem. Commun., 48, 2013, 10385, Adachi, et. al. Adv. Mater., 25, 2013, 3319, Adachi, et. al Adv. Mater., 25, 2013, 3707, Adachi, et. al. Chem. Mater., 25, 2013, 3038, Adachi, et. al. Chem. Mater., 25, 2013, 3766, Adachi, et. Al. J. Mater. Chem. C., 1, 2013, 4599, and Adachi, et. al. J. Phys. Chem. A., 117, 2013, 5607. The entire contents of the above-listed patents and literature documents are hereby incorporated by reference.

Some examples of suitable TADF light-emitting materials are listed in the following table.

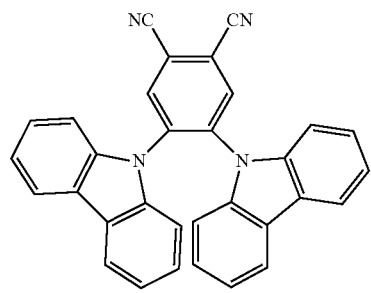 [SMILES: N#Cc1cc(-n2c3ccccc3c3ccccc32)c(-n2c3ccccc3c3ccccc32)cc1C#N]
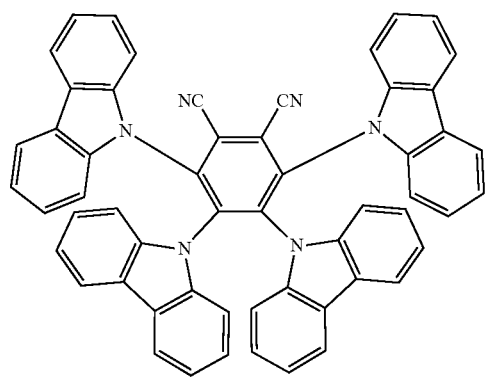 [SMILES: N#Cc1c(C#N)c(-n2c3ccccc3c3ccccc32)c(-n2c3ccccc3c3ccccc32)c(-n2c3ccccc3c3ccccc32)c1-n1c2ccccc2c2ccccc21]
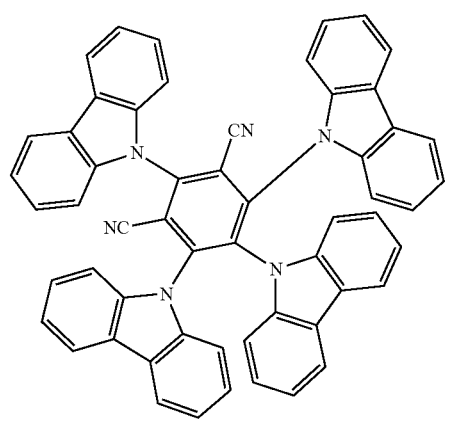 [SMILES: N#Cc1c(-n2c3ccccc3c3ccccc32)c(C#N)c(-n2c3ccccc3c3ccccc32)c(-n2c3ccccc3c3ccccc32)c1-n1c2ccccc2c2ccccc21]

-continued
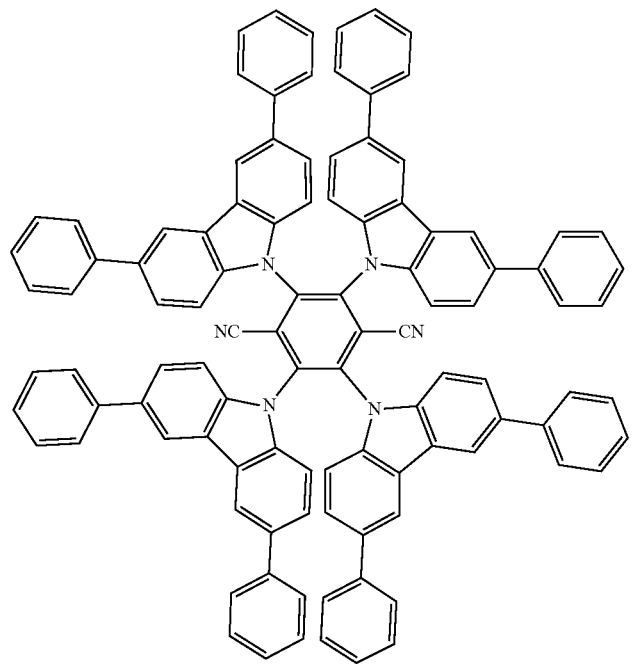 [SMILES: N#Cc1c(-n2c3ccc(-c4ccccc4)cc3c3cc(-c4ccccc4)ccc32)c(-n2c3ccc(-c4ccccc4)cc3c3cc(-c4ccccc4)ccc32)c(C#N)c(-n2c3ccc(-c4ccccc4)cc3c3cc(-c4ccccc4)ccc32)c1-n1c2ccc(-c3ccccc3)cc2c2cc(-c3ccccc3)ccc21]
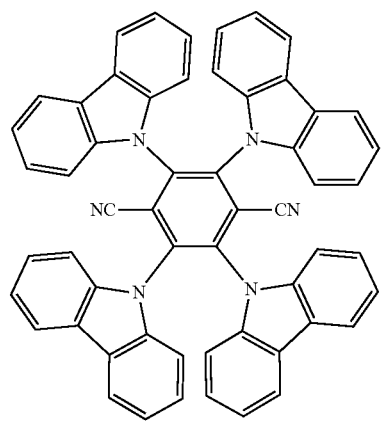 [SMILES: N#Cc1c(-n2c3ccccc3c3ccccc32)c(-n2c3ccccc3c3ccccc32)c(C#N)c(-n2c3ccccc3c3ccccc32)c1-n1c2ccccc2c2ccccc21]
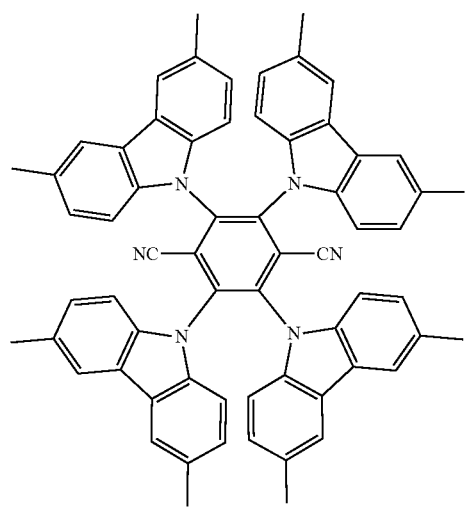

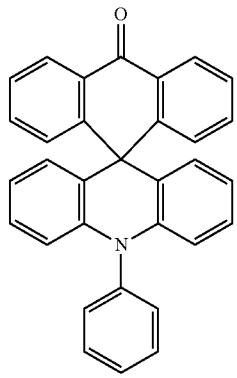 [SMILES: O=C1c2ccccc2C2(c3ccccc31)c1ccccc1N(c1ccccc1)c1ccccc12]
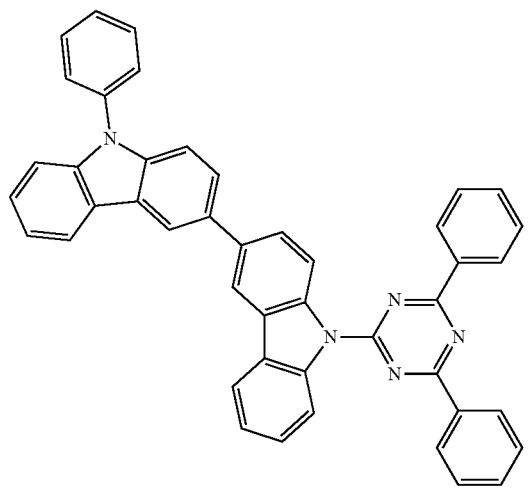 [SMILES: c1ccc(-c2nc(-c3ccccc3)nc(-n3c4ccccc4c4cc(-c5ccc6c(c5)c5ccccc5n6-c5ccccc5)ccc43)n2)cc1]
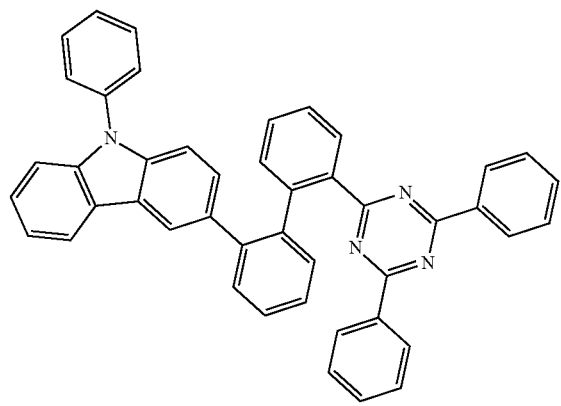 [SMILES: c1ccc(-c2nc(-c3ccccc3)nc(-c3ccccc3-c3ccccc3-c3ccc4c(c3)c3ccccc3n4-c3ccccc3)n2)cc1]

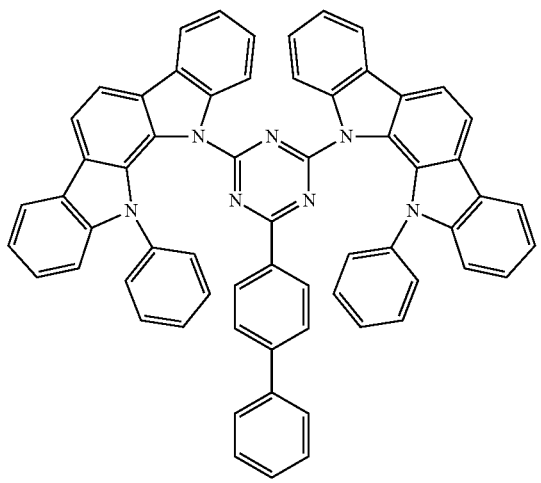 [SMILES: c1ccc(-c2ccc(-c3nc(-n4c5ccccc5c5ccc6c7ccccc7n(-c7ccccc7)c6c54)nc(-n4c5ccccc5c5ccc6c7ccccc7n(-c7ccccc7)c6c54)n3)cc2)cc1]
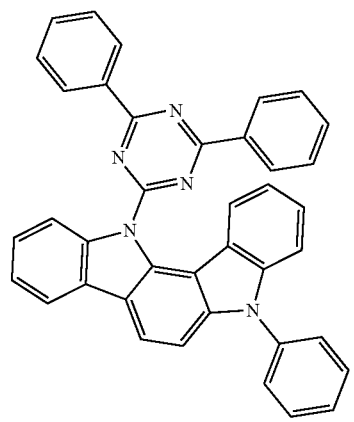 [SMILES: c1ccc(-c2nc(-c3ccccc3)nc(-n3c4ccccc4c4ccc5c(c6ccccc6n5-c5ccccc5)c43)n2)cc1]
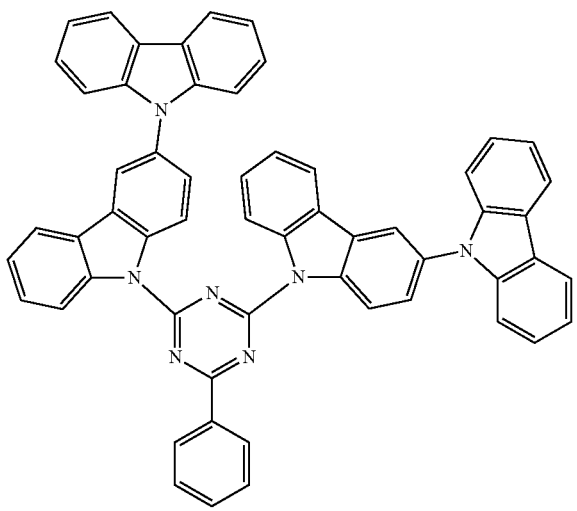 [SMILES: c1ccc(-c2nc(-n3c4ccccc4c4cc(-n5c6ccccc6c6ccccc65)ccc43)nc(-n3c4ccccc4c4cc(-n5c6ccccc6c6ccccc65)ccc43)n2)cc1]

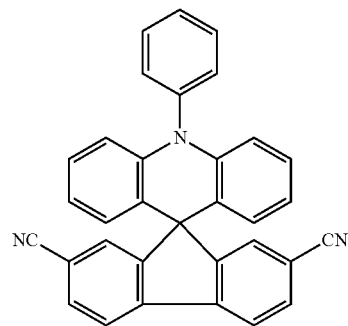 [SMILES: N#Cc1ccc2c(c1)C1(c3cc(C#N)ccc3-2)c2ccccc2N(c2ccccc2)c2ccccc21]
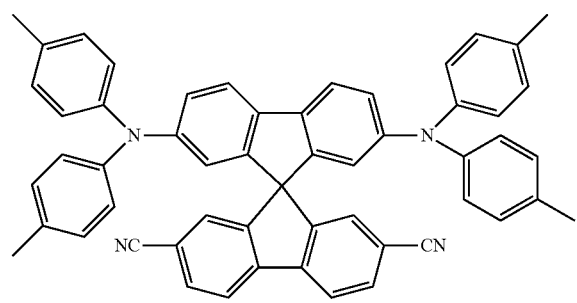
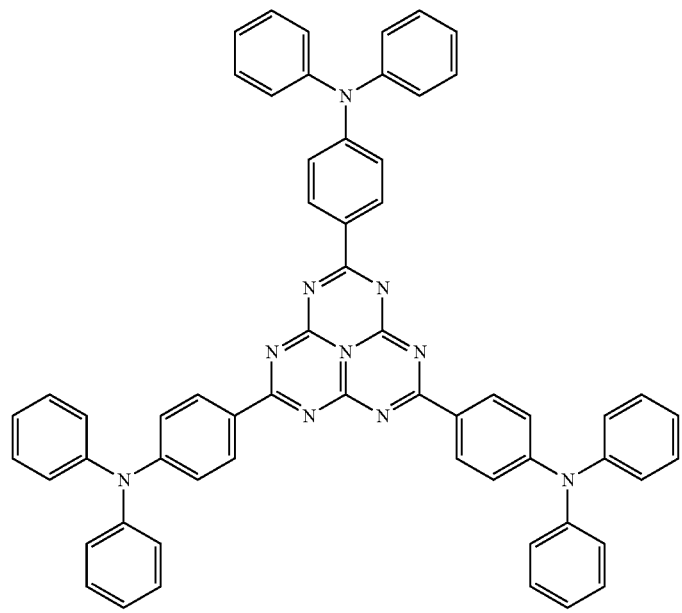

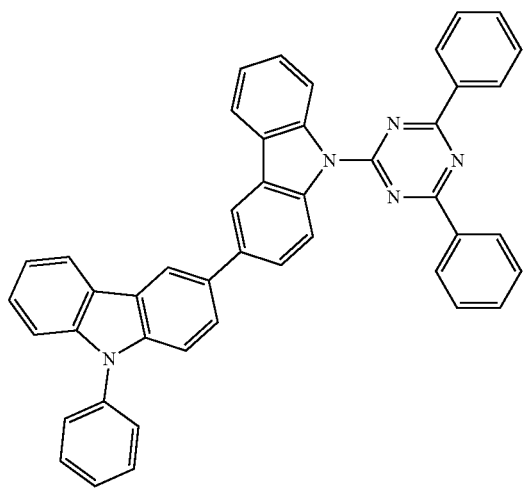 [SMILES: c1ccc(-c2nc(-c3ccccc3)nc(-n3c4ccccc4c4cc(-c5ccc6c(c5)c5ccccc5n6-c5ccccc5)ccc43)n2)cc1]
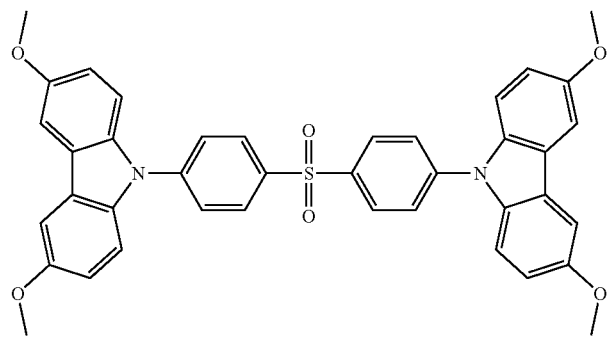 [SMILES: COc1ccc2c(c1)c1cc(OC)ccc1n2-c1ccc(S(=O)(=O)c2ccc(-n3c4ccc(OC)cc4c4cc(OC)ccc43)cc2)cc1]
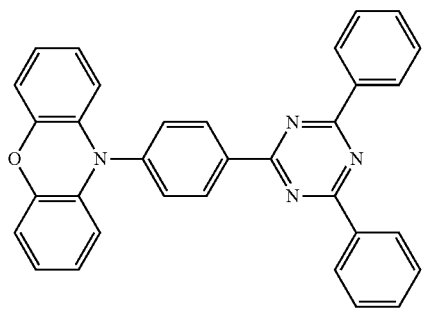 [SMILES: c1ccc(-c2nc(-c3ccccc3)nc(-c3ccc(N4c5ccccc5Oc5ccccc54)cc3)n2)cc1]
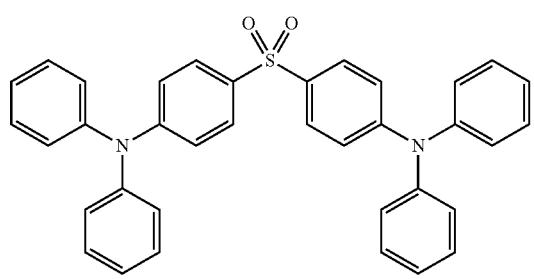 [SMILES: O=S(=O)(c1ccc(N(c2ccccc2)c2ccccc2)cc1)c1ccc(N(c2ccccc2)c2ccccc2)cc1]

-continued
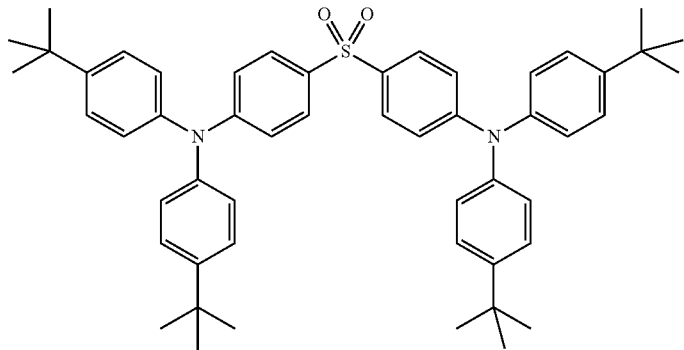 [SMILES: CC(C)(C)c1ccc(N(c2ccc(C(C)(C)C)cc2)c2ccc(S(=O)(=O)c3ccc(N(c4ccc(C(C)(C)C)cc4)c4ccc(C(C)(C)C)cc4)cc3)cc2)cc1]
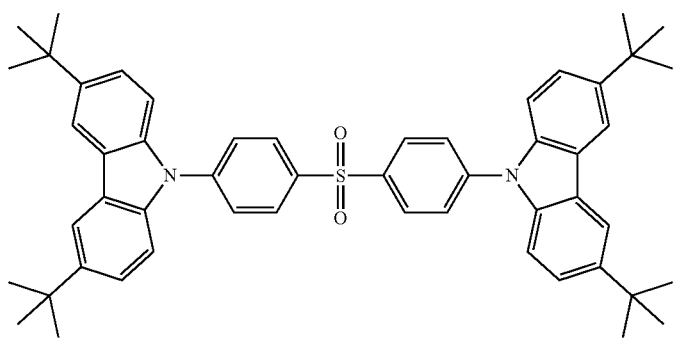 [SMILES: CC(C)(C)c1ccc2c(c1)c1cc(C(C)(C)C)ccc1n2-c1ccc(S(=O)(=O)c2ccc(-n3c4ccc(C(C)(C)C)cc4c4cc(C(C)(C)C)ccc43)cc2)cc1]
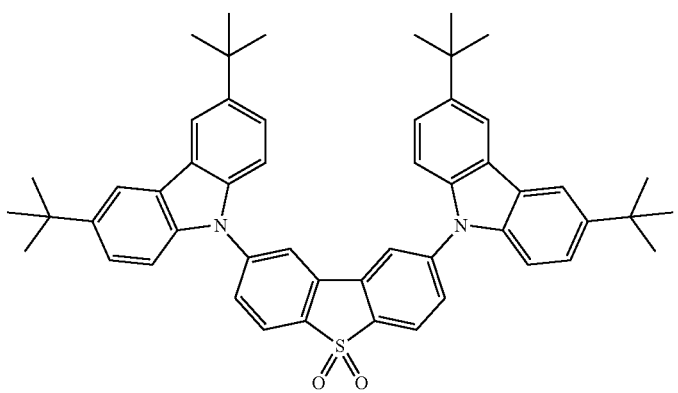 [SMILES: CC(C)(C)c1ccc2c(c1)c1cc(C(C)(C)C)ccc1n2-c1ccc2c(c1)-c1cc(-n3c4ccc(C(C)(C)C)cc4c4cc(C(C)(C)C)ccc43)ccc1S2(=O)=O]
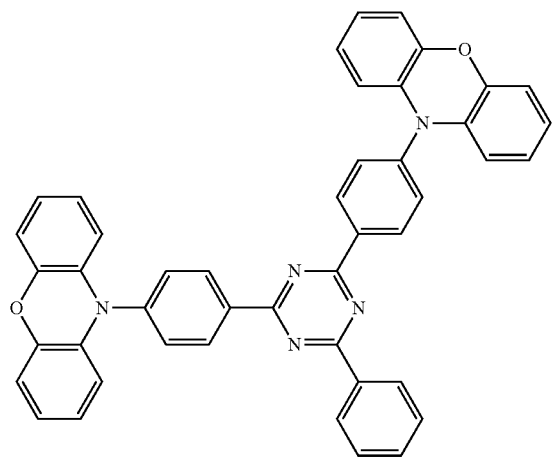 [SMILES: c1ccc(-c2nc(-c3ccc(N4c5ccccc5Oc5ccccc54)cc3)nc(-c3ccc(N4c5ccccc5Oc5ccccc54)cc3)n2)cc1]

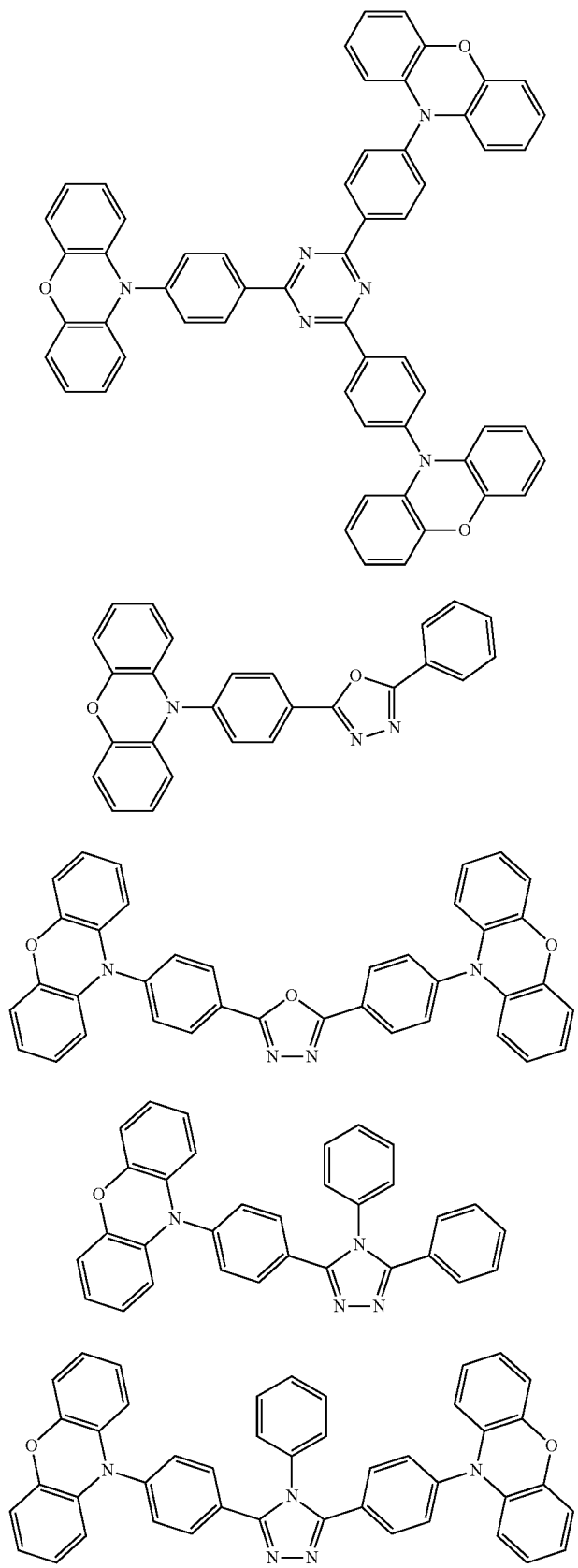

-continued
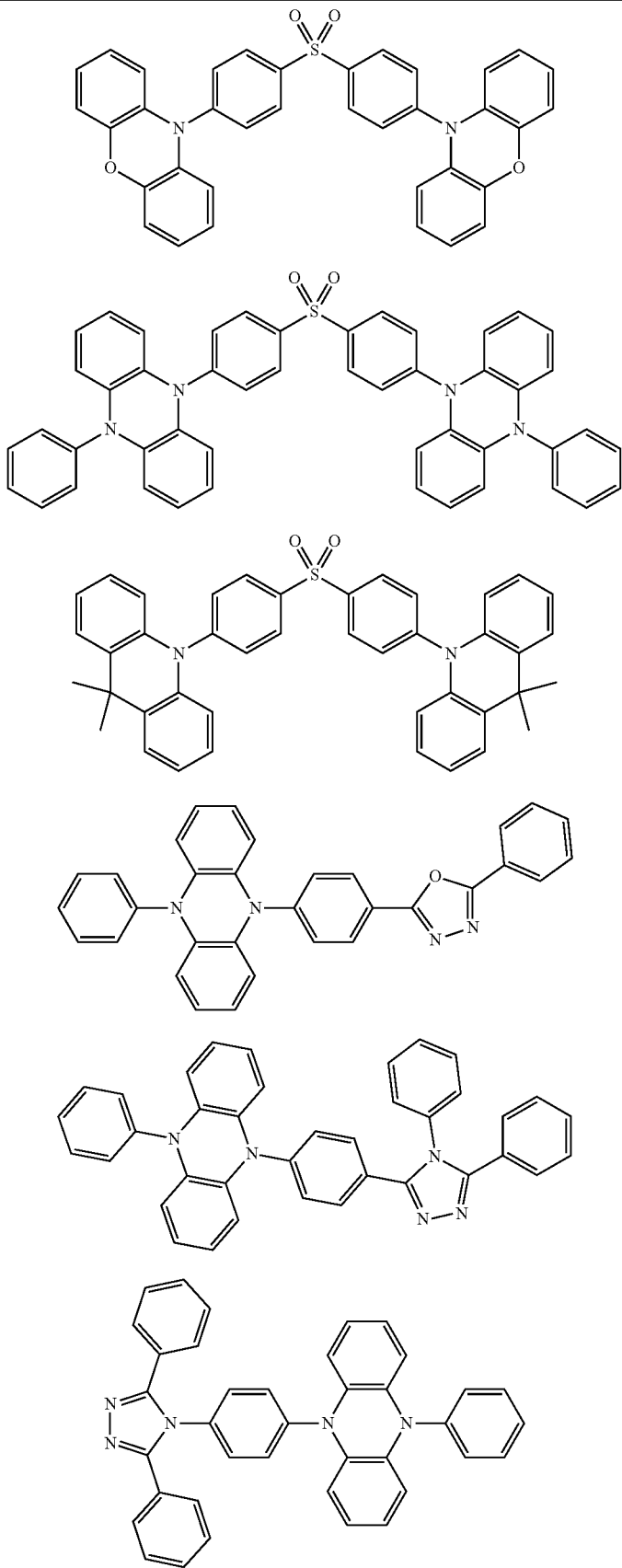

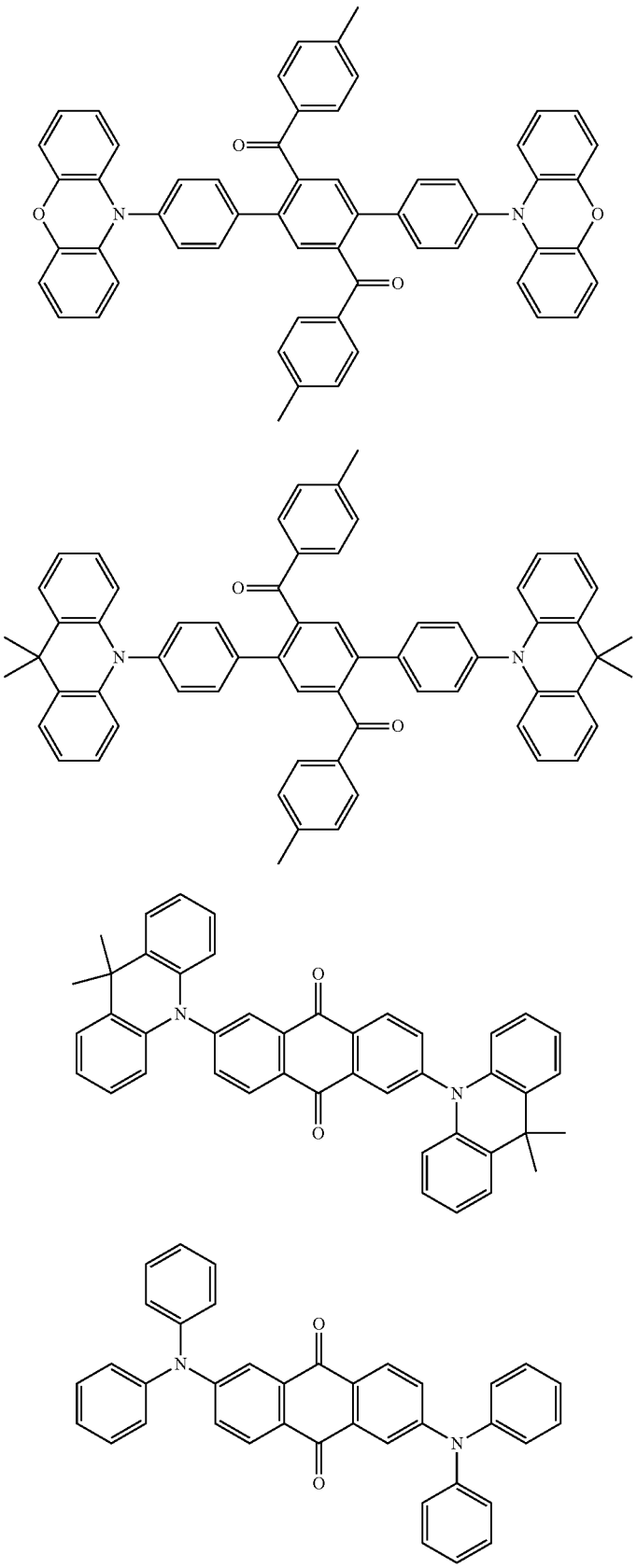

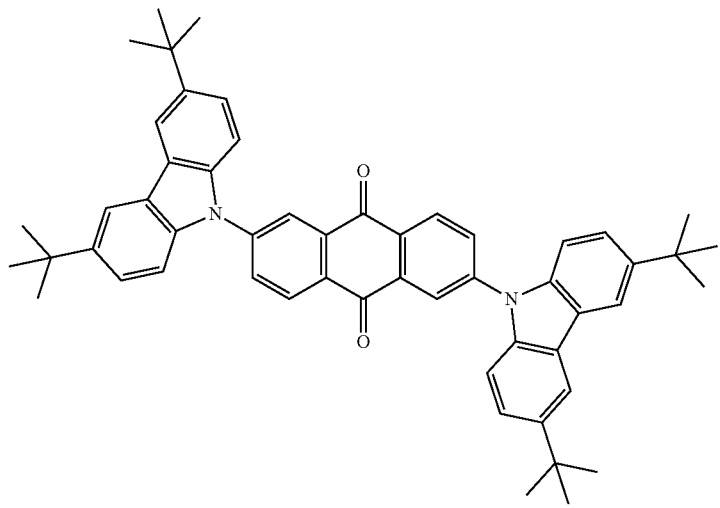 [SMILES: CC(C)(C)c1ccc2c(c1)c1cc(C(C)(C)C)ccc1n2-c1ccc2c(c1)C(=O)c1ccc(-n3c4ccc(C(C)(C)C)cc4c4cc(C(C)(C)C)ccc43)cc1C2=O]
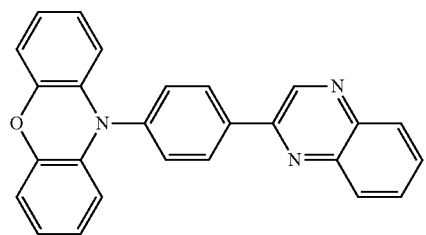 [SMILES: c1ccc2c(c1)Oc1ccccc1N2c1ccc(-c2cnc3ccccc3n2)cc1]
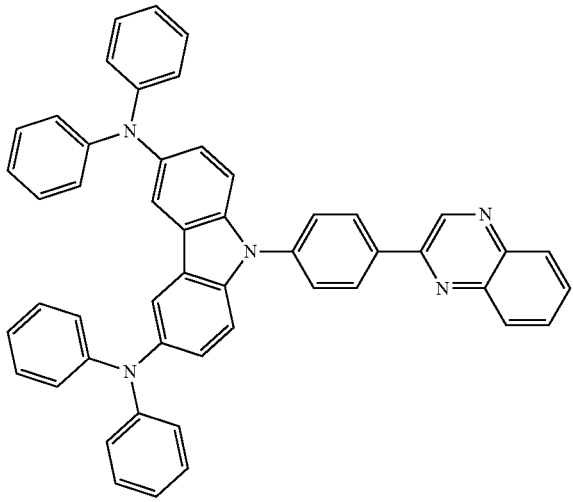 [SMILES: c1ccc(N(c2ccccc2)c2ccc3c(c2)c2cc(N(c4ccccc4)c4ccccc4)ccc2n3-c2ccc(-c3cnc4ccccc4n3)cc2)cc1]
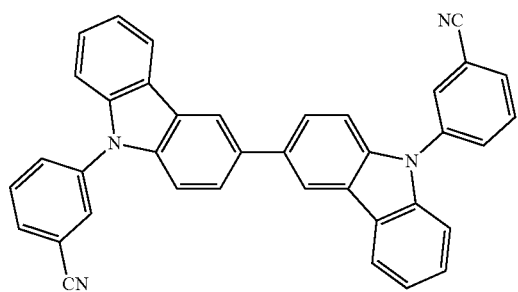 [SMILES: N#Cc1cccc(-n2c3ccccc3c3cc(-c4ccc5c(c4)c4ccccc4n5-c4cccc(C#N)c4)ccc32)c1]

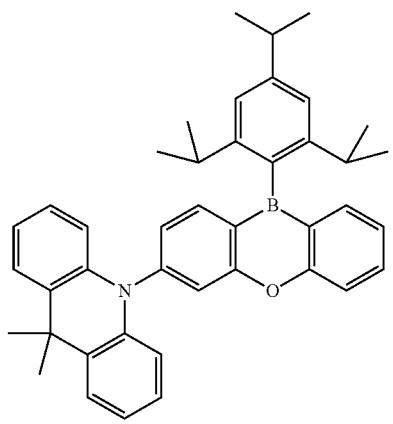 [SMILES: CC(C)c1cc(C(C)C)c(B2c3ccccc3Oc3cc(N4c5ccccc5C(C)(C)c5ccccc54)ccc32)c(C(C)C)c1]
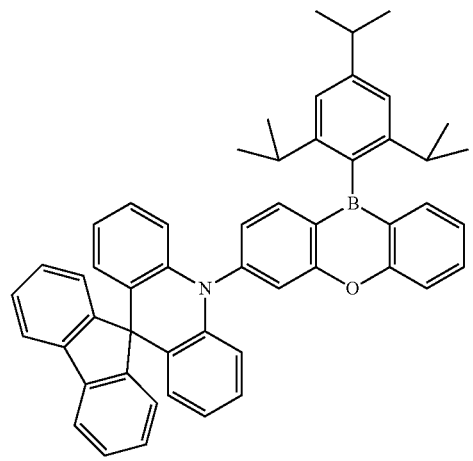 [SMILES: CC(C)c1cc(C(C)C)c(B2c3ccccc3Oc3cc(N4c5ccccc5C5(c6ccccc6-c6ccccc65)c5ccccc54)ccc32)c(C(C)C)c1]
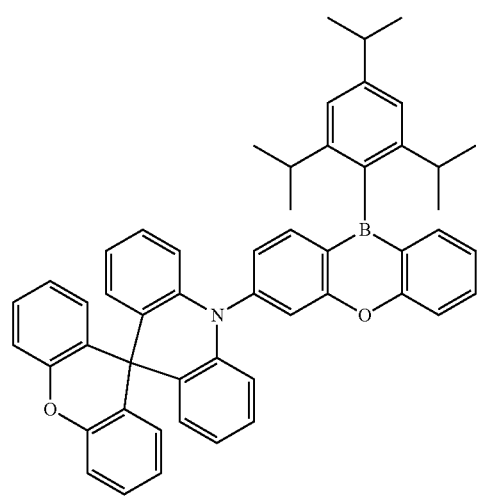 [SMILES: CC(C)c1cc(C(C)C)c(B2c3ccccc3Oc3cc(N4c5ccccc5C5(c6ccccc6Oc6ccccc65)c5ccccc54)ccc32)c(C(C)C)c1]

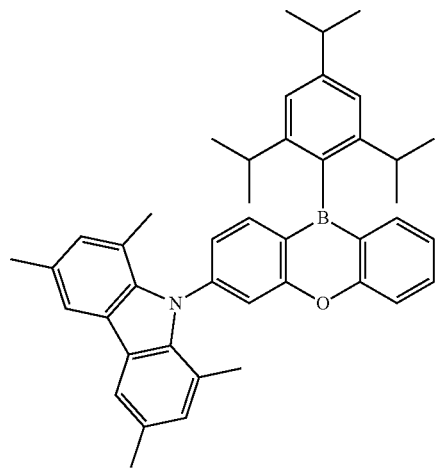 [SMILES: Cc1cc(C)c2c(c1)c1cc(C)cc(C)c1n2-c1ccc2c(c1)Oc1ccccc1B2c1c(C(C)C)cc(C(C)C)cc1C(C)C]
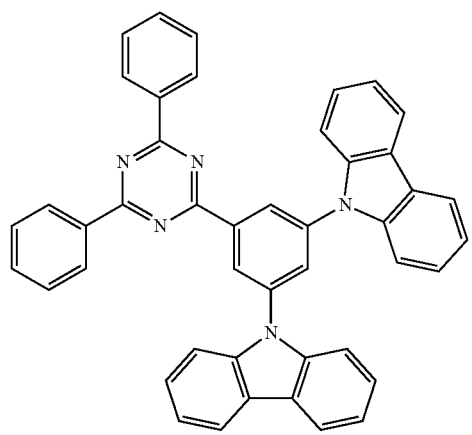 [SMILES: c1ccc(-c2nc(-c3ccccc3)nc(-c3cc(-n4c5ccccc5c5ccccc54)cc(-n4c5ccccc5c5ccccc54)c3)n2)cc1]
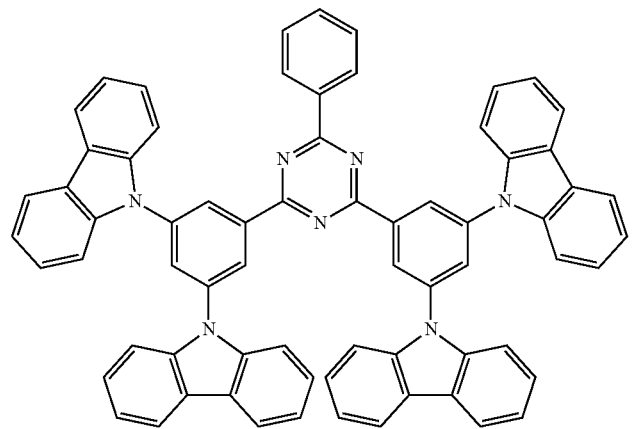 [SMILES: c1ccc(-c2nc(-c3cc(-n4c5ccccc5c5ccccc54)cc(-n4c5ccccc5c5ccccc54)c3)nc(-c3cc(-n4c5ccccc5c5ccccc54)cc(-n4c5ccccc5c5ccccc54)c3)n2)cc1]
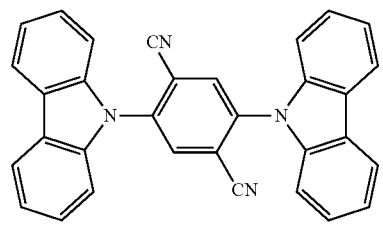 [SMILES: N#Cc1cc(-n2c3ccccc3c3ccccc32)c(C#N)cc1-n1c2ccccc2c2ccccc21]

-continued
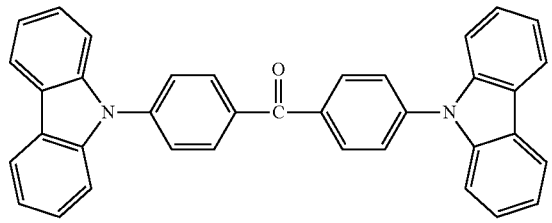 [SMILES: O=C(c1ccc(-n2c3ccccc3c3ccccc32)cc1)c1ccc(-n2c3ccccc3c3ccccc32)cc1]
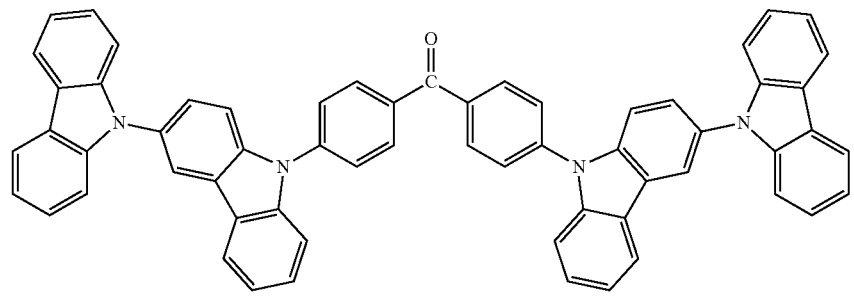 [SMILES: O=C(c1ccc(-n2c3ccccc3c3cc(-n4c5ccccc5c5ccccc54)ccc32)cc1)c1ccc(-n2c3ccccc3c3cc(-n4c5ccccc5c5ccccc54)ccc32)cc1]
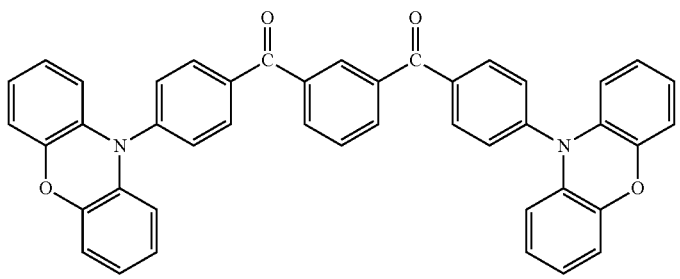 [SMILES: O=C(c1ccc(N2c3ccccc3Oc3ccccc32)cc1)c1cccc(C(=O)c2ccc(N3c4ccccc4Oc4ccccc43)cc2)c1]
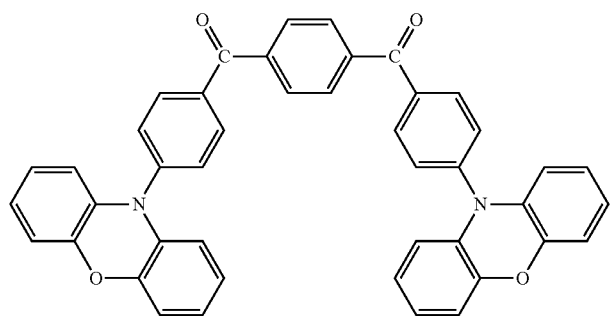 [SMILES: O=C(c1ccc(C(=O)c2ccc(N3c4ccccc4Oc4ccccc43)cc2)cc1)c1ccc(N2c3ccccc3Oc3ccccc32)cc1]
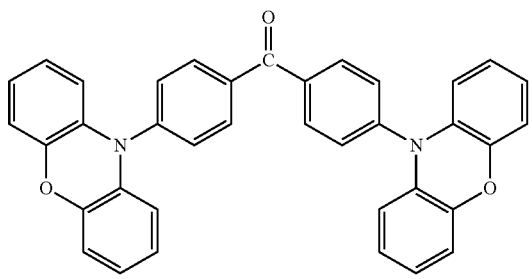 [SMILES: O=C(c1ccc(N2c3ccccc3Oc3ccccc32)cc1)c1ccc(N2c3ccccc3Oc3ccccc32)cc1]
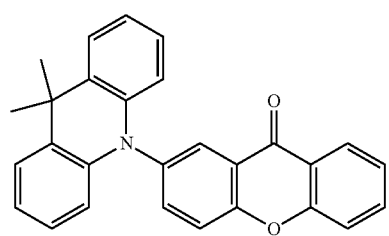 [SMILES: CC1(C)c2ccccc2N(c2ccc3oc4ccccc4c(=O)c3c2)c2ccccc21]

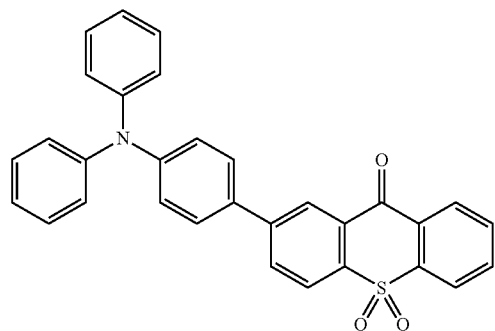 [SMILES: O=C1c2ccccc2S(=O)(=O)c2ccc(-c3ccc(N(c4ccccc4)c4ccccc4)cc3)cc21]
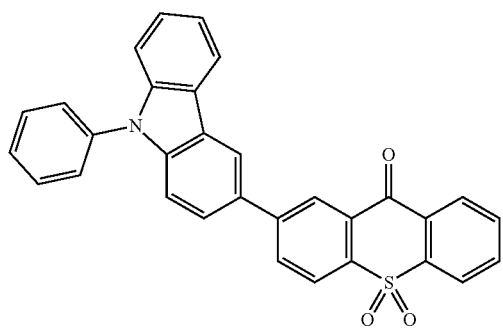 [SMILES: O=C1c2ccccc2S(=O)(=O)c2ccc(-c3ccc4c(c3)c3ccccc3n4-c3ccccc3)cc21]
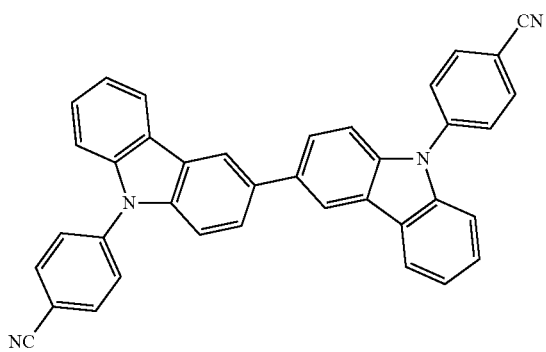 [SMILES: N#Cc1ccc(-n2c3ccccc3c3cc(-c4ccc5c(c4)c4ccccc4n5-c4ccc(C#N)cc4)ccc32)cc1]
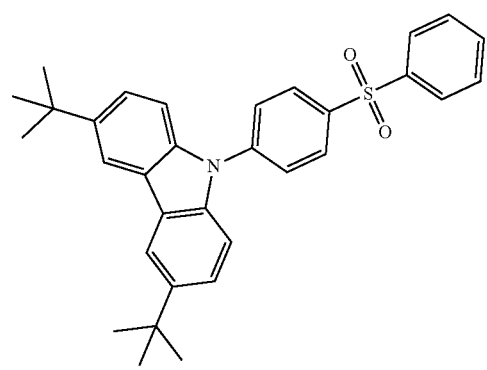 [SMILES: CC(C)(C)c1ccc2c(c1)c1cc(C(C)(C)C)ccc1n2-c1ccc(S(=O)(=O)c2ccccc2)cc1]

-continued
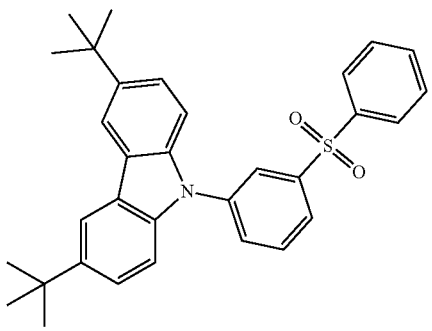 [SMILES: CC(C)(C)c1ccc2c(c1)c1cc(C(C)(C)C)ccc1n2-c1cccc(S(=O)(=O)c2ccccc2)c1]
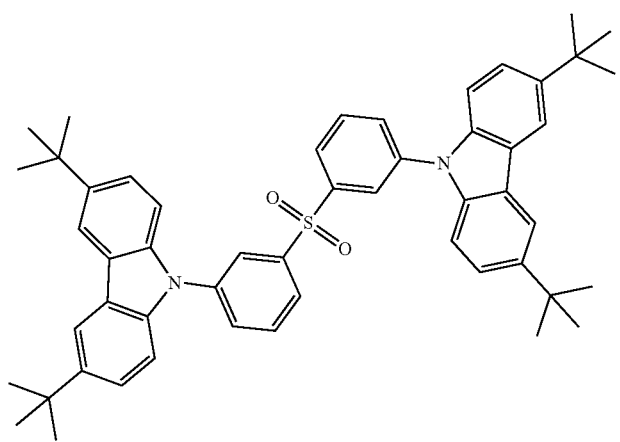 [SMILES: CC(C)(C)c1ccc2c(c1)c1cc(C(C)(C)C)ccc1n2-c1cccc(S(=O)(=O)c2cccc(-n3c4ccc(C(C)(C)C)cc4c4cc(C(C)(C)C)ccc43)c2)c1]
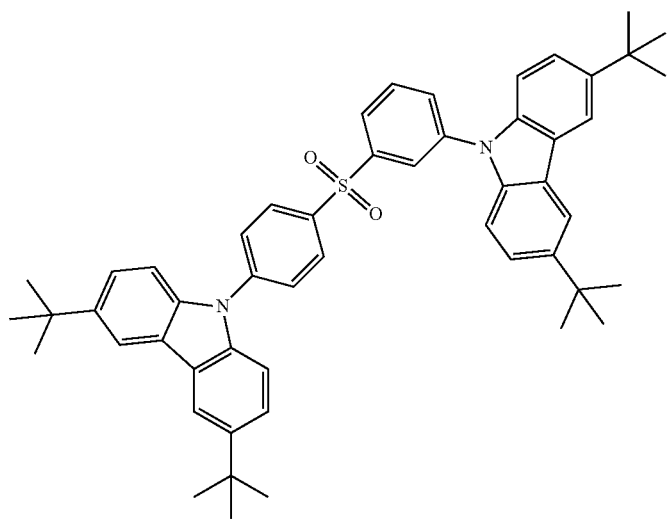 [SMILES: CC(C)(C)c1ccc2c(c1)c1cc(C(C)(C)C)ccc1n2-c1ccc(S(=O)(=O)c2cccc(-n3c4ccc(C(C)(C)C)cc4c4cc(C(C)(C)C)ccc43)c2)cc1]
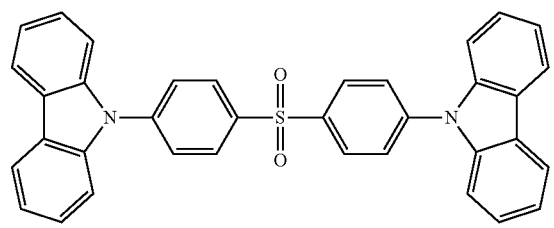 [SMILES: O=S(=O)(c1ccc(-n2c3ccccc3c3ccccc32)cc1)c1ccc(-n2c3ccccc3c3ccccc32)cc1]

The aforementioned organic mixture is used in inks.

The aforementioned organic mixture is used in organic electronic devices. Therefore, the organic electronic device has higher luminous efficiency and longer lifetime.

The organic mixture according to one embodiment includes at least one organic functional material and the aforementioned polymer. The performance and selection of the organic functional material are as described in the above embodiments, and will not be described herein.

An ink according to one embodiment includes an organic solvent and the aforementioned boron-containing organic compound. The ink is a formulation. Thus, the viscosity and surface tension of the ink are important parameters when the formulation is used in a printing process. Suitable surface tension parameter of the ink is suitable for a particular substrate and a particular printing method.

In one embodiment, the surface tension of the ink at an operating temperature or at 25° C. is in a range of about 19 dyne/cm to 50 dyne/cm. In another embodiment, the surface tension is in a range of 22 dyne/cm to 35 dyne/cm. In yet another embodiment, the surface tension is in a range of 25 dyne/cm to 33 dyne/cm.

In one embodiment, the viscosity of the ink at an operating temperature or at 25° C. is in a range of about 1 cps to 100 cps. In one embodiment, the viscosity is in a range of 1 cps to 50 cps. In another embodiment, the viscosity is in a range of 1.5 cps to 20 cps. In yet another embodiment, the viscosity is in a range of 4.0 cps to 20 cps. This makes the formulation more convenient for ink jet printing.

The viscosity can be adjusted by various methods, such as by a suitable solvent selection and the concentration of functional materials in the ink. The ink including a metal organic complex or a polymer can facilitate the adjustment of the printing ink in an appropriate range in accordance with the printing method used. Generally, the organic functional material contained in the formulation has a weight ratio of 0.3% to 30% by weight. In one embodiment, the weight ratio is in a range of 0.5% to 20% by weight. In another embodiment, the weight ratio is in a range of 0.5% to 15% by weight. In yet another embodiment, the weight ratio is in a range of 0.5% to 10% by weight. In a further embodiment, the weight ratio is in a range of 1% to 5% by weight.

In one embodiment, the organic solvent includes a first solvent selected from solvents based on aromatic and/or heteroaromatic. In addition, the first solvent may be an aliphatic chain/cycle-substituted aromatic solvent, or an aromatic ketone solvent, or an aromatic ether solvent.

Examples of the first solvent include, but are not limited to, solvents based on aromatic or heteroaromatic: such as p-diisopropylbenzene, amylbenzene, tetrahydronaphthalene, phenylcyclohexane, chloronaphthalene, 1, 4-dimethylnaphthalene, 3-isopropylbiphenyl, p-methylisopropylbenzene, diamylbenzene, triamylbenzene, pentyltoluene, o-xylene, m-xylene, p-xylene, o-diethylbenzene, m-diethylbenzene, p-diethylbenzene, 1, 2, 3, 4-tetramethylbenzene, 1, 2, 3, 5-tetramethylbenzene, 1, 2, 4, 5-tetramethylbenzene, butylbenzene, dodecylbenzene, dihexylbenzene, dibutylbenzene, p-diisopropylbenzene, 1-methoxynaphthalene, phenylcyclohexane, dimethylnaphthalene, 3-isopropylbiphenyl, p-methylisopropylbenzene, 1-methylnaphthalene, 1, 2, 4-trichlorobenzene, 1, 3-dipropoxybenzene, 4, 4-difluorodiphenylmethane, 1, 2-dimethoxy-4-(1-propenyl)benzene, diphenylmethane, 2-phenylpyridine, 3-phenylpyridine, N-methyldiphenylamine, 4-isopropylbiphenyl, a, α-dichlorodiphenylmethane, 4-(3-phenylpropyl)pyridine, benzyl benzoate, 1, 1-bis(3, 4-dimethylphenyl)ethane, 2-isopropylnaphthalene, dibenzyl ether, and the like; solvents based on ketone, such as 1-tetralone, 2-tetralone, 2-(phenylepoxy) tetralone, 6-(methoxy)-tetralone, acetophenone, propiophenone, benzophenone, and derivatives thereof, such as 4-methylacetophenone, 3-methylacetophenone, 2-methylacetophenone, 4-methylpropiophenone, 3-methylpropiophenone, 2-methylpropiophenone, isophorone, 2, 6, 8-trimethyl-4-nonanone, fenchone, 2-nonanone, 3-nonanone, 5-nonanone, 2-decanone, 2,5-hexanedione, phorone, and di-n-amyl ketone; aromatic ether solvents, such as 3-phenoxytoluene, butoxybenzene, benzyl butylbenzene, p-anisaldehyde dimethyl acetal, tetrahydro-2-phenoxy-2H-pyran, 1, 2-dimethoxy-4-(1-propenyl)benzene, 1, 4-benzodioxane, 1, 3-dipropylbenzene, 2, 5-dimethoxytoluene, 4-ethylphenetole, 1, 2, 4-trimethoxybenzene, 4-(1-propenyl)-1,2-dimethoxybenzene, 1,3-dimethoxybenzene, glycidyl phenyl ether, dibenzyl ether, 4-tert-butylanisole, trans-p-propenylanisole, 1, 2-dimethoxybenzene, 1-methoxynaphthalene, diphenyl ether, 2-phenoxymethyl ether, 2-phenoxytetrahydrofuran, ethyl-2-naphthyl ether, amyl ether, hexyl ether, dioctyl ether, ethylene glycol dibutyl ether, diethylene glycol diethyl ether, diethylene glycol butyl methyl ether, diethylene glycol dibutyl ether, triethylene glycol dimethyl ether, triethylene glycol ethyl methyl ether, triethylene glycol butyl methyl ether, tripropylene glycol dimethyl ether, and tetraethylene glycol dimethyl ether; and ester solvents, such as alkyl octoate, alkyl sebacate, alkyl stearate, alkyl benzoate, alkyl phenylacetate, alkyl cinnamate, alkyl oxalate, alkyl maleate, alkyl lactone, alkyl oleate, and the like.

In addition, the first solvent may also be one or more selected from the group consisting of: aliphatic ketone, such as 2-nonanone, 3-nonanone, 5-nonanone, 2-decanone, 2,5-hexanedione, 2,6,8-trimethyl-4-nonanone, phorone, di-n-amyl ketone, and the like; and aliphatic ether, such as pentyl ether, hexyl ether, dioctyl ether, ethylene glycol dibutyl ether, diethylene glycol diethyl ether, diethylene glycol butyl methyl ether, diethylene glycol dibutyl ether, triethylene glycol dimethyl ether, triethylene glycol ethyl methyl ether, triethylene glycol butyl methyl ether, tripropylene glycol dimethyl ether, tetraethylene glycol dimethyl ether, and the like.

In one embodiment, the organic solvent further includes a second solvent, which is one or more selected from the group consisting of methanol, ethanol, 2-methoxyethanol, dichloromethane, trichloromethane, chlorobenzene, o-dichlorobenzene, tetrahydrofuran, anisole, morpholine, toluene, o-xylene, m-xylene, p-xylene, 1,4-dioxahexane, acetone, methyl ethyl ketone, 1, 2-dichloroethane, 3-phenoxytoluene, 1, 1, 1-trichloroethane, 1, 1, 2, 2-tetrachloroethane, ethyl acetate, butyl acetate, dimethylformamide, dimethylacetamide, dimethyl sulfoxide, tetrahydronaphthalene, decalin, and indene.

In an embodiment, the ink can be a solution or a suspension, which is determined based on the compatibility between the boron-containing organic compound and the organic solvent.

In one embodiment, the boron-containing organic compound in the formulation has a weight percentage from 0.01 wt % to 20 wt %. In one embodiment, the weight percentage is 0.1 wt % to 15 wt %. In another embodiment, the weight percentage is 0.2 wt % to 10 wt %. In yet another embodiment, the weight percentage is 0.25 wt % to 5 wt %.

In one embodiment, the aforementioned formulation is used in a preparation of an organic electronic device. In particular, the aforementioned formulation is used as a coating or printing ink in the preparation of organic electronic device, especially, a preparation method is that by printing or coating.

Suitable printing or coating techniques include, but are not limited to, inkjet printing, nozzle printing, typography printing, screen printing, dip coating, spin coating, blade coating, roller printing, torsion printing, lithography, flexographic printing, rotary printing, spraying, brushing or pad printing, or slit-type extrusion coating and so on. In one embodiment, the printing or coating techniques are gravure printing, nozzle printing, and inkjet printing. The formulation may further include a component, which is one or more selected from the group consisting of a surface active compound, a lubricant, a wetting agent, a dispersing agent, a hydrophobic agent, and a binder, for adjusting the viscosity and film forming properties, and improving adhesion. Detailed information relevant to printing technology and related requirements for related solutions, such as solvent, concentration, viscosity, and the like, may be referred to Handbook of Print Media: Technologies and Production Methods, Helmut Kipphan, ISBN 3-540-67326-1.

In one embodiment, the aforementioned boron-containing organic compound is used in an organic electronic device. The organic electronic device may be selected from the group consisting of an organic light-emitting diode (OLED), an organic photovoltage (OPV), an organic light-emitting electrochemical cell (OLEEC), an organic field-effect transistor (OFET), an organic light-emitting field-effect transistor, an organic laser, an organic spin electronic device, an organic sensor, and an organic plasmon emitting diode. In one embodiment, the organic electronic device is an electroluminescent device such as an OLED, an OLEEC, and an organic light-emitting field-effect transistor. In addition, the organic mixture is used for a light-emitting layer for an OLED device.

An ink according to another embodiment includes an organic solvent and the aforementioned polymer. The polymer is as described above and will not be described herein.

The aforementioned inks can be used in the preparation of organic electronic devices.

An organic electronic device according to one embodiment includes the aforementioned boron-containing organic compound. Therefore, the organic electronic device has a longer lifetime and a higher luminous efficiency.

In one embodiment, the organic electronic device includes an anode, a cathode, and a functional layer located between the anode and the cathode, and the functional layer includes the boron-containing organic compound described above. The organic electronic device may be selected from, but are not limited to, organic light-emitting diode (OLED), organic photovoltage (OPV), organic light-emitting electrochemical cell (OLEEC), organic field-effect transistor (OFET), organic light-emitting field-effect transistor, organic laser, organic spin electronic device, organic sensor, and organic plasmon emitting diode, and the like, particularly organic electroluminescent devices such as OLED, OLEEC, and organic light-emitting field-effect transistor.

In one embodiment, the light-emitting layer of the electroluminescent device includes one of the aforementioned boron-containing organic compounds, or includes one of the aforementioned boron-containing organic compounds and a phosphorescent emitter, or includes one of the aforementioned boron-containing organic compounds and a host material, or includes one of the aforementioned boron-containing organic compounds, a phosphorescent emitter, and a host material.

In one embodiment, an electroluminescent device, particularly an OLED, includes a substrate, an anode, a light-emitting layer, and a cathode, which are sequentially laminated. The light-emitting layer includes the aforementioned boron-containing organic compound.

The substrate can be opaque or transparent. The transparent substrate can be used to manufacture a transparent light-emitting device, which may be referred to Bulovic et al., Nature 1996, 380, p 29, and Gu et al., Appl. Phys. Lett. 1996, 68, p 2606. The substrate may be rigid or elastic. The substrate can also be plastic, metal, semiconductor wafer, or glass. In one embodiment, the substrate has a smooth surface. The substrates without surface defects are a particularly desirable choice. In one embodiment, the substrate is flexible and may be selected from a polymer film or a plastic having a glass transition temperature Tg greater than 150° C. In another embodiment, the glass transition temperature is greater than 200° C. In yet another embodiment, the glass transition temperature is greater than 250° C. In a further embodiment, the glass transition temperature is greater than 300° C. The flexible substrate can be poly (ethylene terephthalate) (PET) or polyethylene glycol (2, 6-naphthalene) (PEN).

The anode can include a conductive metal or a metal oxide, or a conductive polymer. The anode can easily inject holes into the hole injection layer (HIL) or the hole transport layer (HTL) or the light-emitting layer. In one embodiment, the absolute value of the difference between the work function of the anode and the HOMO energy level or the valence band energy level of the emitter in the light-emitting layer or of the p-type semiconductor material as the HIL or HTL or electron blocking layer (EBL) is less than 0.5 eV, further less than 0.2 eV. Examples of the anode materials include, but are not limited to, Al, Cu, Au, Ag, Mg, Fe, Co, Ni, Mn, Pd, Pt, ITO, aluminum-doped zinc oxide (AZO), and the like. The anode material can also be other materials. The anode material can be deposited using any suitable technique, such as a suitable physical vapor deposition process, including radio frequency magnetron sputtering, vacuum thermal evaporation, electron beam (e-beam), and the like. In other embodiments, the anode is patterned. A patterned ITO conductive substrate is commercially available and can be used to fabricate the organic electronic device according to the present embodiment.

The cathode can include a conductive metal or a metal oxide. The cathode can easily inject electrons into the EIL or ETL or directly into the light-emitting layer. In one embodiment, the absolute value of the difference between the work function of the cathode and the LUMO energy level or the conduction band energy level of the emitter in the light-emitting layer or of the n-type semiconductor material as the electron injection layer (EIL) or the electron transport layer (ETL) or the hole blocking layer (HBL) is less than 0.5 eV. In one embodiment, the absolute value is less than 0.3 eV. In another embodiment, the absolute value is less than 0.2 eV. All the materials that can be used as the cathode of the OLED can serve as the cathode material of the organic electronic device of the present embodiment. Examples of the cathode material include, but are not limited to, Al, Au, Ag, Ca, Ba, Mg, LiF/Al, MgAg alloy, BaF$_2$/Al, Cu, Fe, Co, Ni, Mn, Pd, Pt, ITO, and the like. The cathode material can be deposited using any suitable technique, such as a suitable physical vapor deposition process, including radio frequency magnetron sputtering, vacuum thermal evaporation, and electron beam (e-beam), and the like.

When the electroluminescent device is an OLED, OLED may further include other functional layers such as a hole injection layer (HIL), a hole transport layer (HTL), an electron blocking layer (EBL), an electron injection layer (EIL), an electronic transport layer (ETL), or a hole blocking layer (HBL). Suitable materials for these functional layers are described in detail above and in WO2010135519A1, US20090134784A1, and WO2011110277A1, the entire contents of these three patent documents are hereby incorporated by reference.

In one embodiment, the electron transport layer (ETL) or the hole blocking layer (HBL) in the electroluminescent device includes the aforementioned boron-containing organic compound and is manufactured by a solution processing method.

In an embodiment, the organic electroluminescent device has a light emission wavelength between 300 nm and 1000 nm. In one embodiment, the light emission wavelength is between 350 and 900 nm. In another embodiment, the light emission wavelength is between 400 and 800 nm.

In one embodiment, the aforementioned organic electronic device is used in an electronic device. The electronic device is selected from a display device, a lighting device, a light source, or a sensor. The organic electronic device may be an organic electroluminescent device.

An electronic device according to one embodiment includes the aforementioned organic electronic device, which has a longer lifetime and a higher luminous efficiency.

An organic electronic device according to another embodiment includes the aforementioned polymer, which has a longer service life, higher stability, and luminous efficiency. The organic electronic device is as described in the above embodiments, and details are not described herein again.

The aforementioned organic electronic device can be used in an electronic device. The electronic device is selected from a display device, a lighting device, a light source, or a sensor. The organic electronic device may be an organic electroluminescent device.

An electronic device according to another embodiment includes the aforementioned organic electronic device, which has a longer lifetime and a higher luminous efficiency.

Example 1

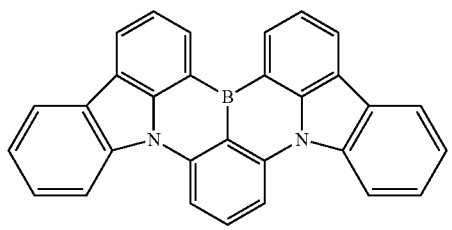

(1)

4.86 g, 10 mmol of 9, 9'-(2-bromo-1, 3-phenyl)bis(9H-carbazole) and 100 ml of dry toluene were added to a 250 ml three-necked flask in an atmosphere of $N_2$, and when the temperature was cooled to −30° C. n-BuLi n-hexane solution (6.0 ml, 1.7 M, 10.2 mmol) was added dropwise. The temperature was raised to a temperature of 60° C. for 2 hours, and the n-hexane solvent therein was distilled off under reduced pressure. The reaction solution was again cooled to the temperature of −30° C., and 10.5 mol of boron tribromide solution was added thereto, and then the reaction solution was heated to room temperature and stirred for 0.5 hour. Afterwards, the reaction solution was cooled to a temperature of 0° C., and 21 mmol of N, N-diisopropylethylamine was added thereto. After the dropwise addition was completed, the reaction solution was heated to room temperature and stirred, and then further heated to a temperature of 120° C. and stirred for 3 hours. The reaction solution was then cooled to room temperature. The reaction was quenched by the addition of aqueous sodium carbonate and ethyl acetate. The aqueous phase was extracted with ethyl acetate and the organic phases were combined. The solvent therein was rotary evaporated off to obtain a crude product, which was purified using a flash silica gel column to give a purified product. Recrystallization was carried out with toluene and ethyl acetate to obtain a product as a white solid powder. MS(ASAP)=416.1.

Example 2

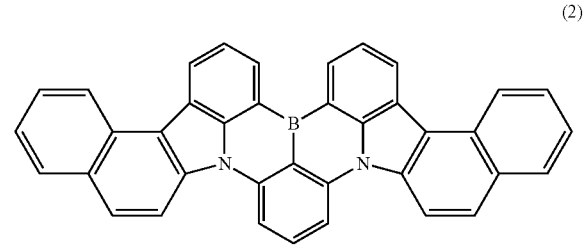 [SMILES: c1cc2c3c(c1)-n1c4ccc5ccccc5c4c4cccc(c41)B3c1cccc3c4c5ccccc5ccc4n-2c13]

(2)

In the present example, the synthesis step of the final product (2) was similar to that of the product (1) in Example 1. The difference was that the intermediate was changed from 9, 9'-(2-bromo-1, 3-phenyl)bis(9H-carbazole) to 7, 7'-(2-bromo-1, 3-phenyl)bis(7H-benzo[c]carbazole), the reaction temperature and reaction time used in the reaction process were the same. MS(ASAP)=516.5.

Example 3

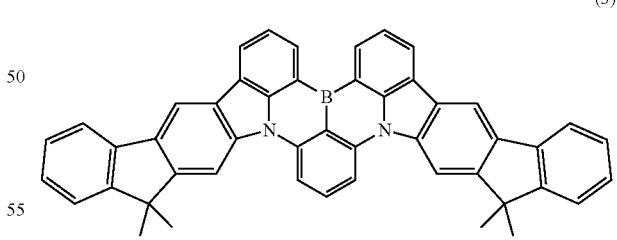

(3)

In the present example, the synthesis step of the final product (3) was similar to that of the product (1) in Example 1. The difference was that the intermediate was changed from 9, 9'-(2-bromo-1, 3-phenyl)bis(9H-carbazole) to 5, 5'-(2-bromo-1, 3-phenyl)bis(7, 7-dimethyl-5, 7-dihydroindeno[2, 1-b]carbazole), the reaction temperature and reaction time used in the reaction process were the same. MS (ASAP)=648.4.

Example 4

(4)

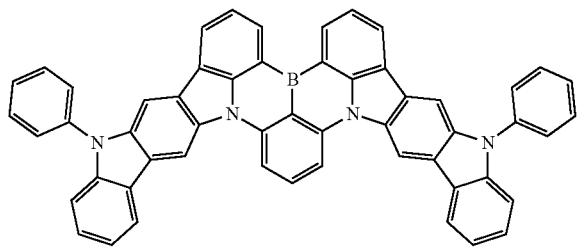

In the present example, the synthesis step of the final product (4) was similar to that of the product (1) in Example 1. The difference was that the intermediate was changed from 9, 9'-(2-bromo-1, 3-phenyl)bis(9H-carbazole) to 11, 11'-(2-bromo-1, 3-phenyl)bis(5-phenyl-5, 11-dihydroindole [3, 2-b]carbazole), the reaction temperature and reaction time used in the reaction process were the same. MS(ASAP)=746.6.

Example 5

(5)

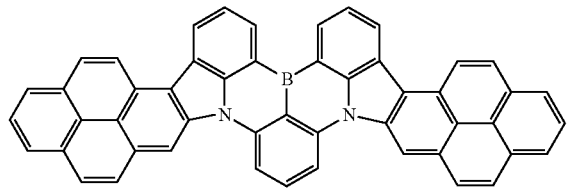

In the present example, the synthesis step of the final product (5) was similar to that of the product (1) in Example 1. The difference was that the intermediate was changed from 9, 9'-(2-bromo-1, 3-phenyl)bis(9H-carbazole) to 7, 7'-(2-bromo-1,3-phenyl)bis(7H-fluorantheno[1, 9-bc]carbazole), the reaction temperature and reaction time used in the reaction process were the same. MS (ASAP)=664.4.

The energy levels of the organic compound materials can be calculated by quantum, for example, using TD-DFT (time-dependent density functional theory) by Gaussian 09W (Gaussian Inc.), and specific simulation methods can be referred to WO2011141110. Firstly, the molecular geometry is optimized by semi-empirical method "Ground State/Semi-empirical/Default Spin/AM1" (Charge 0/Spin Singlet). Then, the energy structure of organic molecules is calculated by TD-DFT (time-dependent density functional theory) method for "TD-SCF/DFT/Default Spin/B3PW91" and the base group "6-31G (d)" (Charge 0/Spin Singlet). The HOMO and LUMO energy levels are calculated according to the following calibration equations: $S_1$, $T_1$, and the resonance factor $f(S_1)$ are used directly.

$$HOMO(eV) = ((HOMO(G) \times 27.212) - 0.9899)/1.1206$$

$$LUMO(eV) = ((LUMO(G) \times 27.212) - 2.0041)/1.385$$

HOMO (G) and LUMO (G) are the direct calculation results of Gaussian 09W, in units of Hartree. The results are shown in Table 1:

TABLE 1

| Materials | HOMO [eV] | LUMO [eV] | f($S_1$) | $T_1$ [eV] | $S_1$ [eV] | $\Delta_{ST}$ |
|---|---|---|---|---|---|---|
| (1) | −5.67 | −2.85 | 0.3457 | 2.51 | 2.58 | 0.07 |
| (2) | −5.69 | −2.96 | 0.4036 | 2.23 | 2.33 | 0.10 |
| (3) | −5.55 | −2.85 | 0.5076 | 2.41 | 2.50 | 0.09 |
| (4) | −5.34 | −2.78 | 0.1986 | 2.36 | 2.40 | 0.04 |
| (5) | −5.59 | −3.01 | 0.7225 | 1.92 | 2.00 | 0.08 |

The resonance factor $f(S_1)$ ranges between 0.1986 and 0.7225, which can well improve the fluorescence quantum luminous efficiency of the material, which is much larger than that of the TADF material with the general D-A structure. In addition, the value of ($S_1-T_1$) is less than or equal to 0.10 eV, and the delayed fluorescence luminescence condition of less than 0.30 eV is satisfied.

In comparison with the aforementioned delayed fluorescent light-emitting material, the delayed fluorescent light-emitting material of the D-A structure is marked with Ref 1:

Ref1

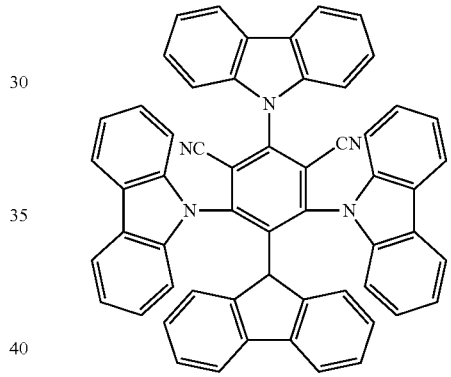

Fabrication of OLED Devices:

The fabrication steps for an OLED device having ITO/ NPD (35 nm)/5% (1) to (5): DPEPO (15 nm)/TPBi (65 nm)/LiF (1 nm)/Al (150 nm)/cathode are as follows:

a. cleaning of conductive glass substrate: when the conductive glass substrate is used for the first time, a variety of solvents, such as chloroform, ketone, or isopropanol can be used for cleaning, and then treating with UV and ozone;

b. HTL (35 nm), EML (15 nm), and ETL (65 nm): it is obtained by thermal evaporation in a high vacuum ($1 \times 10^{-6}$ mbar);

c. cathode: LiF/Al (1 nm/150 nm) is deposited by thermal evaporation in the high vacuum ($1 \times 10^{-6}$ mbar);

d. package: the device is packaged in the nitrogen glove box with UV curable resin.

The current-voltage (J-V) characteristics of each OLED device are characterized by characterization equipment while recording important parameters such as efficiency, lifetime, and external quantum efficiency. It has been tested that the luminous efficiency and lifetime of OLED1 (corresponding to Example (1)) are more than twice that of OLED Ref1 (corresponding to the raw material (Ref1)). The luminous efficiency of OLED 3 (corresponding to Example (3)) is three times that of the OLED Ref1, and the lifetime of the OLED 3 is more than four times that of the OLED Ref1. In particular, the maximum external quantum efficiency of the OLED 3 is more than 10%. OLED 5 (corresponding to Example (5)) is red light, and the rest are green light-emitting devices. It can be seen that the OLED device prepared by using the organic mixture of the present disclosure has greatly improved luminous efficiency and lifetime, and the external quantum efficiency is also significantly improved.

What is claimed is:

1. An organic electronic device, comprising a functional layer comprising a boron-containing organic compound having a general formula (1) as following:

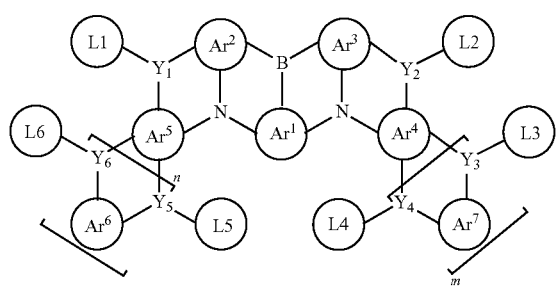

(1)

wherein,
- $Ar^1$ to $Ar^7$ are the same or different, and $Ar^1$ to $Ar^7$ are independently selected from the group consisting of aromatic ring system containing 2 to 20 carbon atoms, heteroaromatic ring system containing 2 to 20 carbon atoms, and non-aromatic ring system containing 2 to 20 carbon atoms; and $Ar^1$ to $Ar^7$ have a group $R^1$ on rings thereof, the group $R^1$ is the same or different at each occurrence;
- L1 to L6 are the same or different, and L1 to L6 are independently selected from the group consisting of a hydrogen, a linear alkane containing 1 to 15 carbon atoms, a branched alkane containing 1 to 15 carbon atoms, a cycloalkane containing 1 to 15 carbon atoms, an aromatic ring system containing 2 to 20 carbon atoms, a heteroaromatic ring system containing 2 to 20 carbon atoms, and a non-aromatic ring system containing 2 to 20 carbon atoms; and when one or more of $Y_1$ to $Y_6$ are a single bond or a doubly-bridging group, the corresponding L is not present;
- $Y_1$ to $Y_6$ are the same or different, $Y_1$ to $Y_6$ are independently selected from the group consisting of a single bond, a doubly-bridging group, and a triply-bridging group, and $Y_1$ to $Y_6$ are independently linked to three adjacent groups thereof by a single bond or a double bond;
- $R^1$ is selected from the group consisting of —H, —F, —Cl, Br, I, -D, —CN, —NO$_2$, —CF$_3$, B(OR$^2$)$_2$, Si(R$^2$)$_3$, a linear alkane group, an alkane ether group, an alkane thioether group containing 1 to 10 carbon atoms, a branched alkane group, and a cycloalkane group;
- $R^2$ is one or more selected from the group consisting of H, D, a linear alkyl group containing 1 to 20 carbon atoms, an alkoxy group containing 1 to 20 carbon atoms, a thioalkoxy group containing 1 to 20 carbon atoms, a branched alkyl group containing 3 to 20 carbon atoms, a cyclic alkyl group containing 3 to 20 carbon atoms, a silyl group containing 3 to 20 carbon atoms, a substituted keto group containing 1 to 20 carbon atoms, an alkoxy carbonyl group containing 2 to 20 carbon atoms, an aryloxy carbonyl group containing 7 to 20 carbon atoms, a cyano group, a carbamoyl group, a haloformyl group, a formyl group, an isocyano group, an isocyanate group, a thiocyanate group, an isothiocyanate group, a hydroxyl group, a nitro group, a CF$_3$ group, Cl, Br, F, a crosslinkable group, a substituted or unsubstituted aromatic ring system containing 5 to 40 ring atoms or a substituted or unsubstituted heteroaromatic ring system containing 5 to 40 ring atoms, and an aryloxy group containing 5 to 40 ring atoms or a heteroaryloxy group containing 5 to 40 ring atoms; wherein at least one of $R^2$ forms a monocyclic or polycyclic aliphatic or aromatic ring with a ring bonded to the group, or a plurality of $R^2$ form a monocyclic or polycyclic aliphatic or aromatic ring with each other;

n is selected from 0, 1, or 2; m is selected from 0, 1, or 2.

2. The organic electronic device of claim 1, wherein the $Ar^1$ to $Ar^7$ are independently selected from an aromatic ring system containing 2 to 20 carbon atoms or a heteroaromatic ring system containing 2 to 20 carbon atoms.

3. The organic electronic device of claim 1, wherein the Y1 to Y6 are independently selected from the group consisting of a single bond and any of the following doubly-bridging and triply-bridging groups:

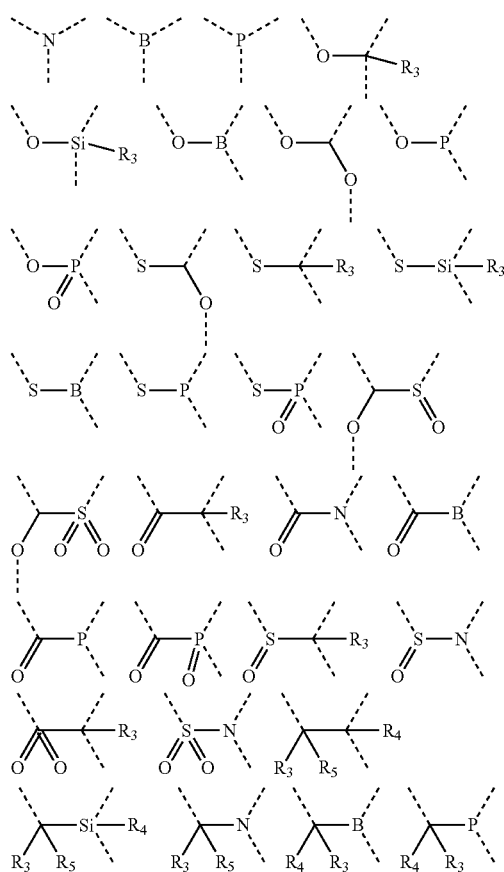

-continued

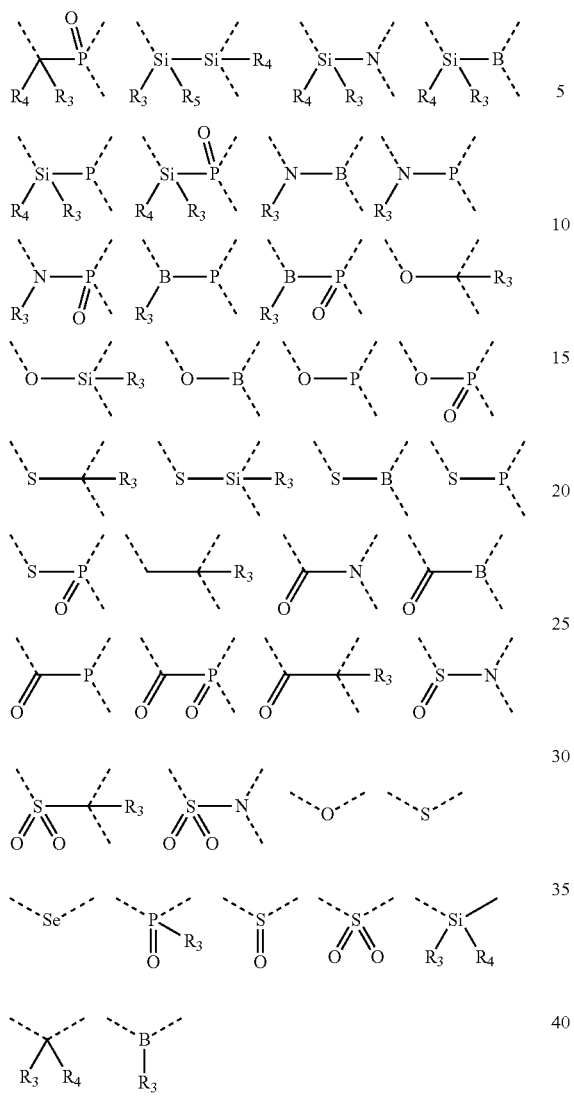

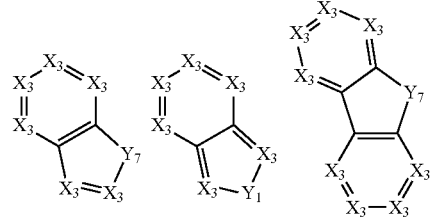

wherein $X_3$ is selected from $CR^6$ or N;

$Y_7$ is selected from $CR^7R^8$, $SiR^9R^{10}$, $NR^{11}$, $C(=O)$, S or O;

wherein $R^6$, $R^7$, $R^8$, $R^9$, $R^{10}$, and $R^{11}$ are one or more independently selected from the group consisting of H, D, a linear alkyl group containing 1 to 20 carbon atoms, an alkoxy group containing 1 to 20 carbon atoms, a thioalkoxy group containing 1 to 20 carbon atoms, a branched alkyl group containing 3 to 20 carbon atoms, a cyclic alkyl group containing 3 to 20 carbon atoms, a silyl group containing 3 to 20 carbon atoms, a substituted keto group containing 1 to 20 carbon atoms, an alkoxy carbonyl group containing 2 to 20 carbon atoms, an aryloxy carbonyl group containing 7 to 20 carbon atoms, a cyano group, a carbamoyl group, a haloformyl group, a formyl group, an isocyano group, an isocyanate group, a thiocyanate group, an isothiocyanate group, a hydroxyl group, a nitro group, a $CF_3$ group, Cl, Br, F, a crosslinkable group, a substituted or unsubstituted aromatic ring system containing 5 to 40 ring atoms or a substituted or unsubstituted heteroaromatic ring system containing 5 to 40 ring atoms, and an aryloxy group containing 5 to 40 ring atoms or a heteroaryloxy group containing 5 to 40 ring atoms; wherein, at least one of $R^6$, $R^7$, $R^8$, $R^9$, $R^{10}$, and $R^{11}$ forms a monocyclic or polycyclic aliphatic or aromatic ring with a ring bonded to the group, or at least two of $R^6$, $R^7$, $R^8$, $R^9$, $R^{10}$, and $R^{11}$ are bonded to each other to form a monocyclic or polycyclic aliphatic or aromatic ring.

5. The organic electronic device of claim 4, wherein the $Ar^1$ to $Ar^7$ are independently selected from a phenyl group.

6. The organic electronic device of claim 5, wherein the boron-containing organic compound is one selected from the group consisting of structures represented by the following general formulas (2) to (7):

(2)

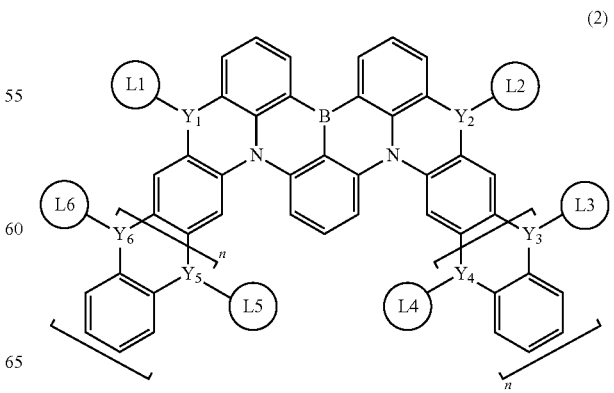

wherein, $R_3$, $R_4$, and $R_5$ are independently selected from the group consisting of —H, —F, —Cl, Br, I, -D, —CN, —NO₂, —CF₃, $B(OR^2)_2$, $Si(R^2)_3$, a linear alkane group, an alkane ether group, an alkane thioether group containing 1 to 10 carbon atoms, a branched alkane group, and a cycloalkane group;

dashed bonds represent bonds by which any of the doubly-bridging group or the triply-bridging group is bonded to adjacent structural unit thereof.

4. The organic electronic device of claim 1, wherein the $Ar^1$ to $Ar^7$ are independently selected from the group consisting of:

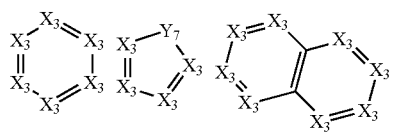

(3)
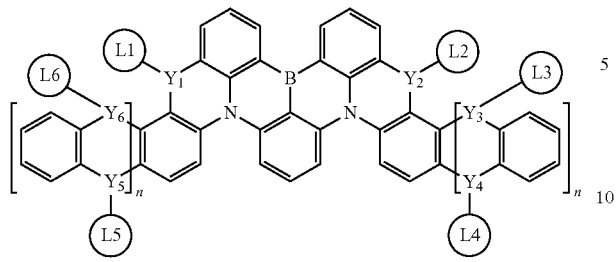
(4)
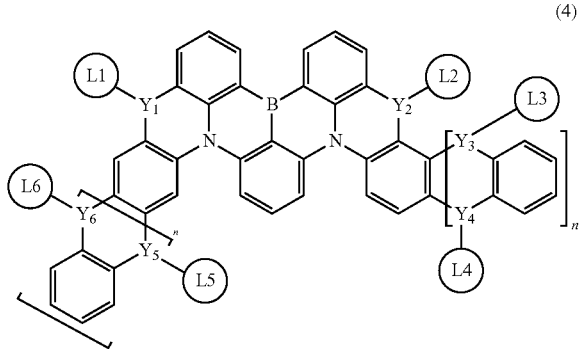
(5)
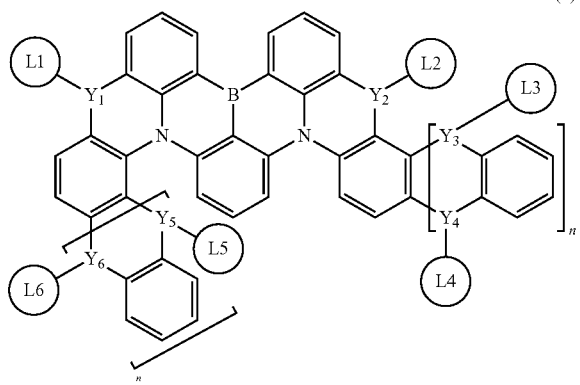
(6)
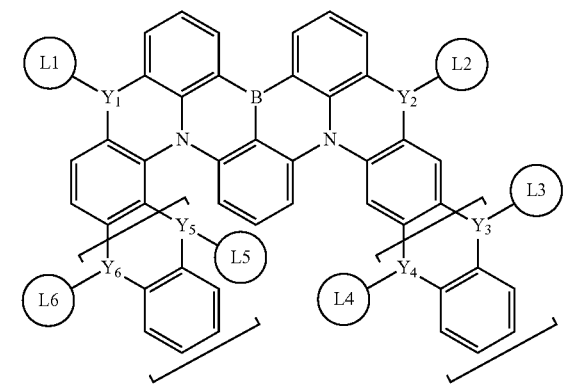
(7)
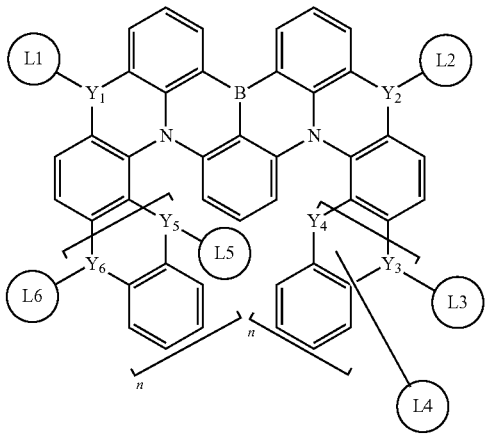
7. The organic electronic device of claim 1, wherein at least one L comprises an electron-donating group and/or at least one L comprises an electron-accepting group; wherein the L is L1, L2, L3, L4, L5 or L6.
8. The organic electronic device of claim 7, wherein the electron-donating group is selected from the group consisting of:
(D1)
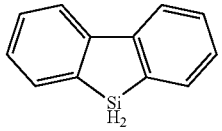
(D2)
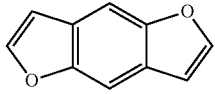
(D3)
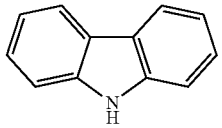
(D4)
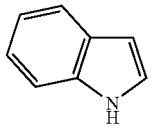
(D5)
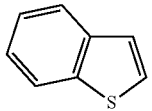
(D6)
(D7)
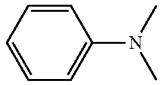

-continued (D8)
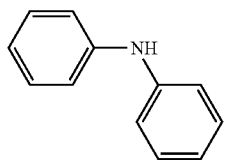

(D9)
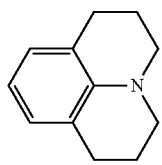

(D10)
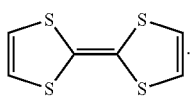

9. The organic electronic device of claim 7, wherein the electron-accepting group is selected from the group consisting of F, a cyano group, and any one of the following groups:

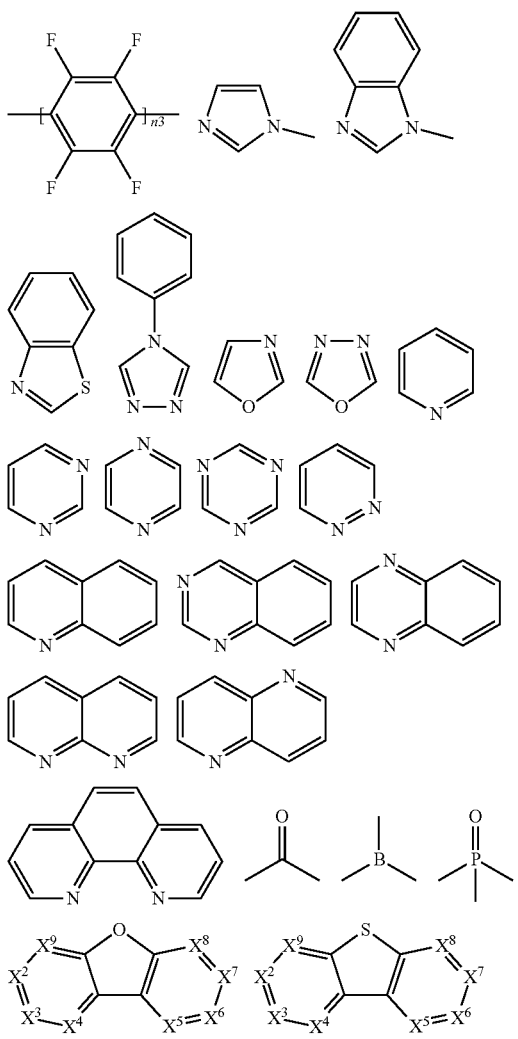

-continued

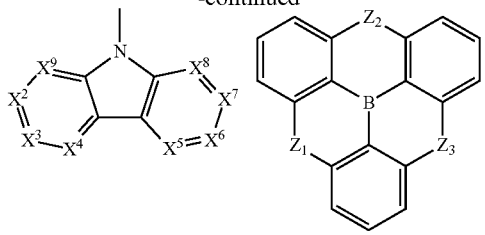

wherein n3 is 1, 2 or 3; $X^1$ to $X^8$ are independently selected from $CR^{12}$ Or N, and at least one of $X^1$ to $X^8$ is selected from N; $Z_1$ to $Z_3$ are independently selected from the group consisting of $C(R^{12})_2$, O, and S; wherein $R^{12}$ is selected from the group consisting of a hydrogen, an alkyl, an alkoxy, an amino, an alkene, an alkyne, an aralkyl, a heteroalkyl, an aryl, and a heteroaryl.

10. The organic electronic device of claim 1, at least one of hydrogens on the ring of the boron-containing compound is deuterated.

11. The organic electronic device of claim 1, wherein the boron-containing organic compound has a $T_1 \leq 2.2$ eV; wherein the $T_1$ represents a first triplet excited state of the boron-containing organic compound.

12. The organic electronic device of claim 1, wherein the boron-containing organic compound has a general formula (8) as following:

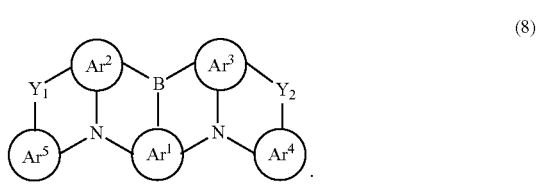

(8)

13. The organic electronic device of claim 1, wherein the device further comprises an organic solvent or at least one organic functional material; wherein the organic functional material is selected from the group consisting of a hole injection material, a hole transport material, a hole blocking material, an electron injection material, an electron transport material, an electron blocking material, an organic host material, and a light-emitting material.

14. The organic electronic device of claim 1, wherein the organic electronic device is selected from an electroluminescent device; the electroluminescent device comprises a substrate, an anode, a light-emitting layer, and a cathode which are sequentially laminated; the light-emitting layer comprises the boron-containing organic compound.

15. The organic electronic device of claim 1, wherein the boron-containing organic compound has a (S1−T1)≤0.30 eV; the (S1−T1) represents an energy level difference between a first triplet excited state T1 of the boron-containing organic compound and a first singlet excited state S1 of the boron-containing organic compound.

16. The organic electronic device of claim 15, wherein the boron-containing organic compound has a (S1−T1)≤0.10 eV.

17. The organic electronic device of claim 1, wherein n is selected from 1 or 2 and m is selected from 1 or 2.

18. The organic electronic device of claim 1, wherein L1 to L6 are the same or different, and L1 to L6 independently comprise one or more of the following structural units:

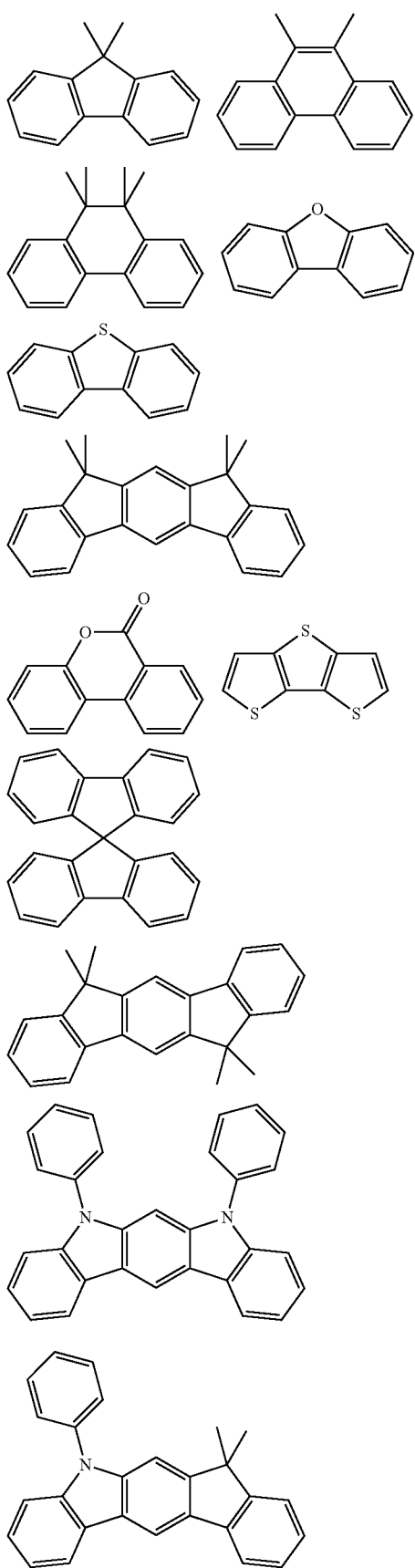
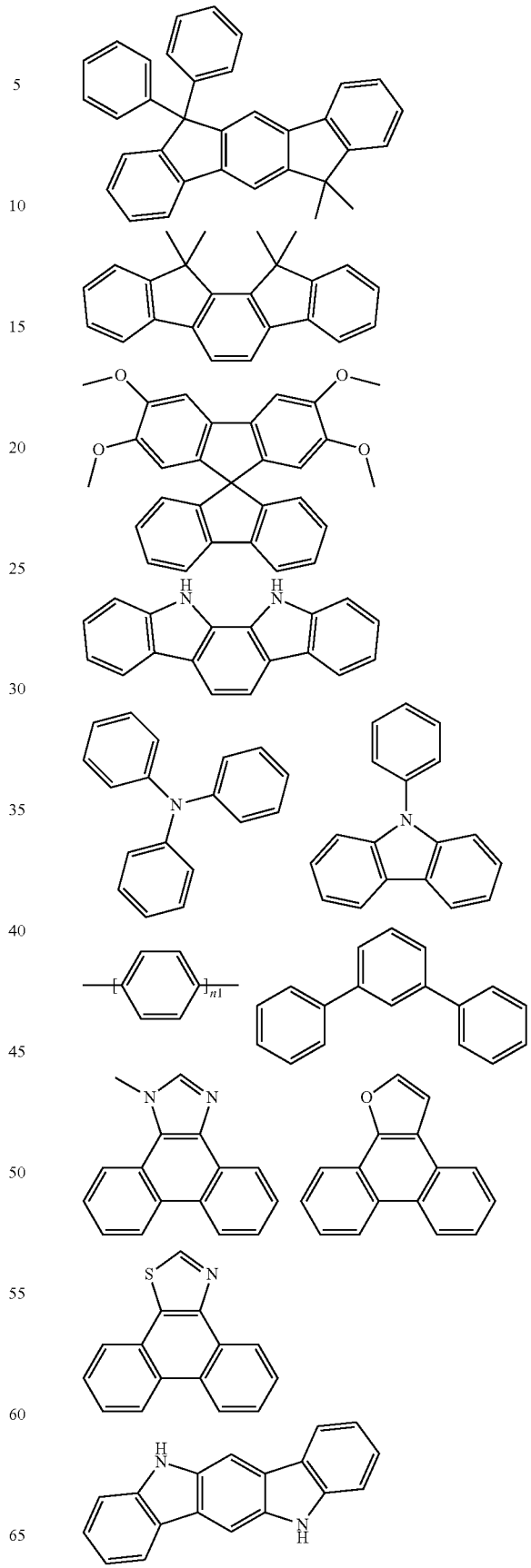

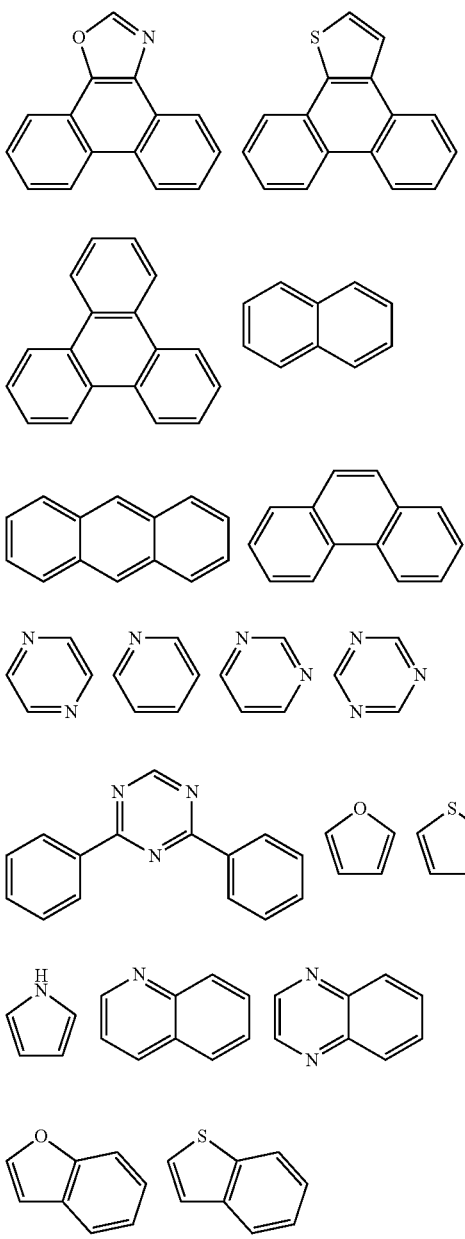

where n1 is selected from 1, 2, 3, or 4.

19. The organic electronic device of claim 12 wherein the Ar$^4$ to Ar$^5$ are independently selected from the group consisting of:

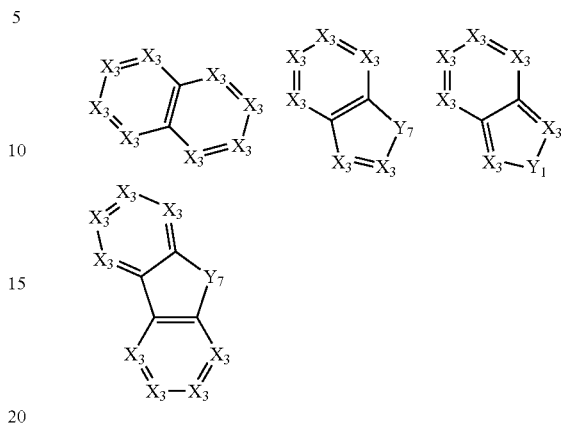

wherein X$_3$ is selected from CR$^6$ or N;
Y$_7$ is selected from CR$^7$R$^8$, SiR$^9$R$^{10}$, NR$^{11}$, C(=O), S or O;
wherein R$^6$, R$^7$, R$^8$, R$^9$, R$^{10}$, and R$^{11}$ are one or more independently selected from the group consisting of H, D, a linear alkyl group containing 1 to 20 carbon atoms, an alkoxy group containing 1 to 20 carbon atoms, a thioalkoxy group containing 1 to 20 carbon atoms, a branched alkyl group containing 3 to 20 carbon atoms, a cyclic alkyl group containing 3 to 20 carbon atoms, a silyl group containing 3 to 20 carbon atoms, a substituted keto group containing 1 to 20 carbon atoms, an alkoxy carbonyl group containing 2 to 20 carbon atoms, an aryloxy carbonyl group containing 7 to 20 carbon atoms, a cyano group, a carbamoyl group, a haloformyl group, a formyl group, an isocyano group, an isocyanate group, a thiocyanate group, an isothiocyanate group, a hydroxyl group, a nitro group, a CF$_3$ group, Cl, Br, F, a crosslinkable group, a substituted or unsubstituted aromatic ring system containing 5 to 40 ring atoms or a substituted or unsubstituted heteroaromatic ring system containing 5 to 40 ring atoms, and an aryloxy group containing 5 to 40 ring atoms or a heteroaryloxy group containing 5 to 40 ring atoms; wherein, at least one of R$^6$, R$^7$, R$^8$, R$^9$, R$^{10}$, and R$^{11}$ forms a monocyclic or polycyclic aliphatic or aromatic ring with a ring bonded to the group, or at least two of R$^6$, R$^7$, R$^8$, R$^9$, R$^{10}$, and R$^{11}$ are bonded to each other to form a monocyclic or polycyclic aliphatic or aromatic ring.

* * * * *